(12) United States Patent
Okumura et al.

(10) Patent No.: US 7,206,351 B2
(45) Date of Patent: Apr. 17, 2007

(54) SIGNAL EVALUATION DEVICES AND SIGNAL EVALUATION METHODS, SIGNAL QUALITY EVALUATION METHODS AND REPRODUCING DEVICES AND RECORDING DEVICES

(75) Inventors: Tetsuya Okumura, Neyagawa (JP); Jun Akiyama, Kashihara (JP); Tomiyuki Numata, Tenri (JP); Shigemi Maeda, Yamatokoriyama (JP); Masanori Ushioda, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 894 days.

(21) Appl. No.: 10/154,898

(22) Filed: May 24, 2002

(65) Prior Publication Data

US 2003/0043939 A1    Mar. 6, 2003

(30) Foreign Application Priority Data

| May 28, 2001 | (JP) | 2001-159454 |
| May 28, 2001 | (JP) | 2001-159580 |
| Dec. 12, 2001 | (JP) | 2001-378485 |
| Mar. 22, 2002 | (JP) | 2002-081845 |

(51) Int. Cl.
*H04L 5/12* (2006.01)
(52) U.S. Cl. ............ 375/262; 375/263; 375/265; 375/341; 714/794; 714/795; 714/796
(58) Field of Classification Search ............ 375/262, 375/263, 265, 341, 346, 229, 230, 232; 714/786, 714/792, 794, 795, 796
See application file for complete search history.

(56) References Cited

U.S. PATENT DOCUMENTS 5,648,921 A    7/1997  Araki et al.

(Continued)

FOREIGN PATENT DOCUMENTS

EP    0871170 A2    10/1998

(Continued)

OTHER PUBLICATIONS

K. Fujimoto, et al., "An Application of Viterbi Decoding to PR(1,2,1) Magneto-Optical Recording Channel," Proceedings of the 5th Sony Research Forum (1995), pp. 465-469.

(Continued)

*Primary Examiner*—Dac V. Ha
(74) *Attorney, Agent, or Firm*—David G. Conlin; John J. Penny, Jr.; Edwards Angell Palmer & Dodge LLP

(57) ABSTRACT

A signal evaluation device for evaluating a decoded signal of maximum likelihood decoding includes: a differential metric circuit for finding differential metrics; comparators for judging whether a difference of differential metrics exceeds a predetermined threshold; counters for counting respective output pulses of the comparators; and a controller for finding the probability of the differential metrics falling at or below the predetermined threshold, based on the number of measured samples and the number of samples counted by the counters, and processing the probability by arithmetic operations so as to obtain an index of signal evaluation. With this arrangement, signal evaluation devices for evaluating a recording medium or a recording medium driving device can have a simpler structure and can perform evaluations in a plurality of PR modes.

38 Claims, 28 Drawing Sheets

U.S. PATENT DOCUMENTS

| | | | |
|---|---|---|---|
| 5,696,756 A | 12/1997 | Fujimoto et al. | |
| 5,761,212 A * | 6/1998 | Foland et al. | 714/719 |
| 5,938,791 A | 8/1999 | Narahara | 714/795 |
| 6,735,724 B1 * | 5/2004 | McClellan | 714/704 |

FOREIGN PATENT DOCUMENTS

| | | |
|---|---|---|
| JP | 07-321654 | 12/1995 |
| JP | 09-115167 | 5/1997 |
| JP | 10-320931 | 12/1998 |
| JP | 11-025538 | 1/1999 |
| JP | 11007727 | 1/1999 |
| JP | 2000-040201 | 2/2000 |
| JP | 2001-319430 | 11/2001 |
| KR | 1996-0005276 | 2/1996 |
| KR | 1999-48996 | 7/1999 |
| WO | WO-98/33174 | 7/1998 |

OTHER PUBLICATIONS

T. Okumura, et al., "A Method for Evaluating PRML System Reliability Using Sequenced Amplitude Margin," ISOM '01 International Symposium on Optical Memory 2001, pp. 272-273.

T. Okumura, et al., "Method for Evaluating Partial Response Maximum Likelihood System Performance Using Sequenced Amplitude Margin," Japanese Journal of Applied Physics Part 1, Regular Papers, Short Notes & Review Papers, Mar. 2002, vol. 41, No. 3B, pp. 1783-1784.

A. Taratorin, PRML: A Practical Approach, Introduction to PRML Concepts and Measurements, Guzik Technical Enterprises, 1995, pp. 65-68.

T. Perkins, et al. "A Window-Margin-Like Procedure for Evaluating PRML Channel Performance," IEEE Transactions on Magnetics, vol. 31, No. 2, Mar. 1995, pp. 1109-1114.

Korean Office Action dated Mar. 29, 2005 (with English translation thereof).

Japanese Office Action mailed on Nov. 22, 2005 (with English translation thereof).

European Search Report dated Sep. 20, 2006 for corresponding European Application No. 02011480.7.

Japanese Office Action dated Jun. 13, 2006 for the corresponding Japanese Application JP 2002-081845.

* cited by examiner

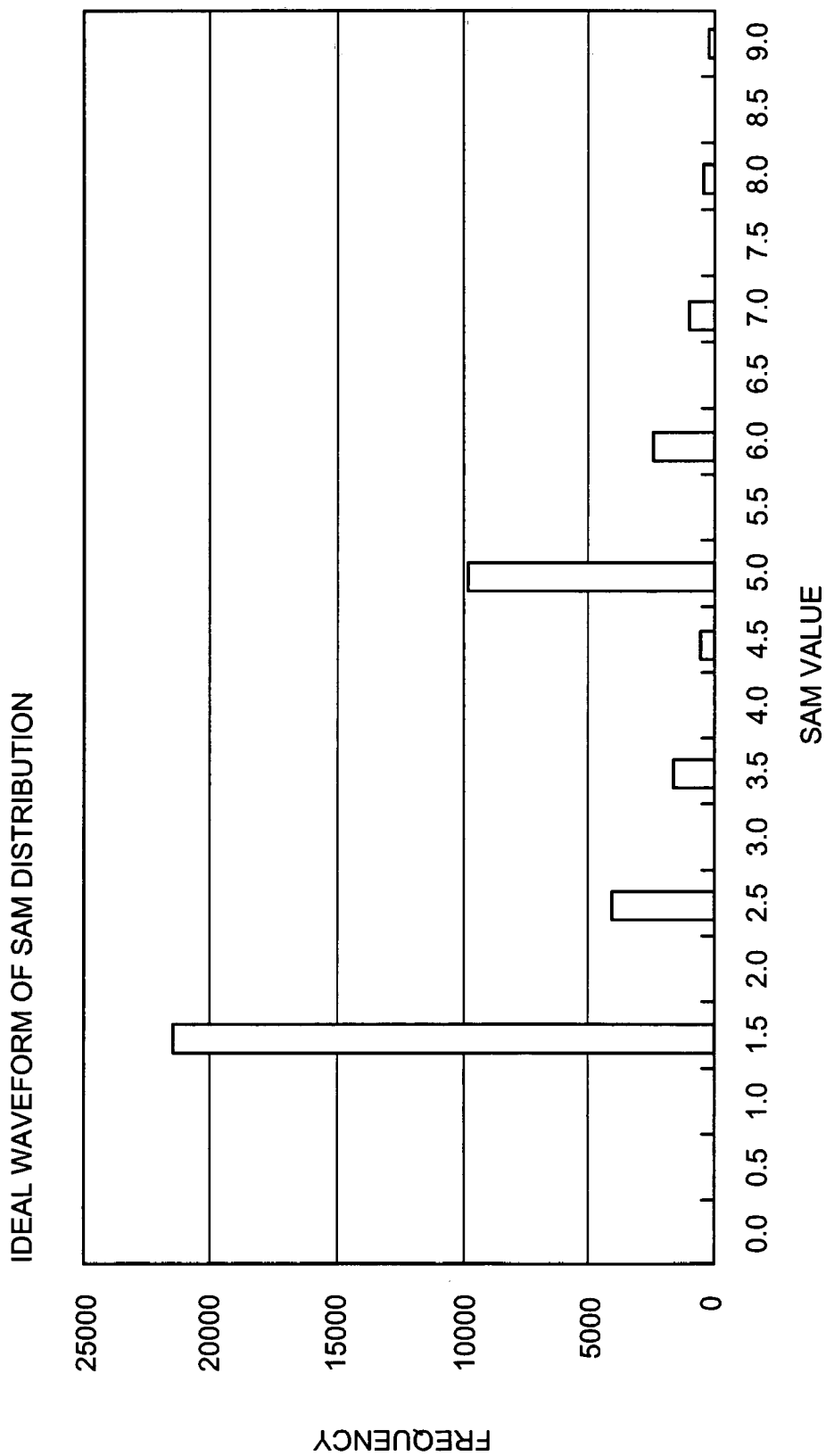

| R1R2 | 74 | 107 | 140 | 173 | 206 | 239 | 272 | 305 | 338 | 371 | 404 | 437 | 470 | 503 |
|---|---|---|---|---|---|---|---|---|---|---|---|---|---|---|
| 231 | 9.2E-5 | 3.6E-4 | 9.1E-4 | 1.8E-3 | 3.2E-3 | 1.3E-3 | 2.1E-3 | 3.3E-3 | | | | | | |
| 263 | 3.8E-5 | 1.6E-4 | 4.4E-4 | 9.2E-4 | 1.7E-3 | 2.7E-3 | 4.1E-3 | 5.8E-3 | 4.0E-3 | | | | | |
| 300 | 1.8E-5 | 8.2E-5 | 2.3E-4 | 5.2E-4 | 9.7E-4 | 1.6E-3 | 2.5E-3 | 3.6E-3 | 5.0E-3 | 6.7E-3 | | | | |
| 341 | 9.6E-6 | 4.6E-5 | 1.4E-4 | 3.1E-4 | 5.9E-4 | 1.0E-3 | 1.6E-3 | 2.4E-3 | 3.4E-3 | 4.5E-3 | 6.0E-3 | 7.6E-3 | | |
| 389 | 5.4E-6 | 2.7E-5 | 8.2E-5 | 1.9E-4 | 3.8E-4 | 6.7E-4 | 1.1E-3 | 1.6E-3 | 2.3E-3 | 3.2E-3 | 4.2E-3 | 5.5E-3 | 6.9E-3 | 8.5E-3 |
| 442 | 3.2E-6 | 1.7E-5 | 5.2E-5 | 1.3E-4 | 2.5E-4 | 4.5E-4 | 7.4E-4 | 1.1E-3 | 1.6E-3 | 2.3E-3 | 3.1E-3 | 4.0E-3 | 5.1E-3 | 6.4E-3 |
| 504 | 1.9E-6 | 1.1E-5 | 3.4E-5 | 8.5E-5 | 1.7E-4 | 3.2E-4 | 5.3E-4 | 8.2E-4 | 1.2E-3 | 1.7E-3 | 2.3E-3 | 3.0E-3 | 3.9E-3 | 4.9E-3 |
| 574 | 1.2E-6 | 6.9E-6 | 2.3E-5 | 5.8E-5 | 1.2E-4 | 2.3E-4 | 3.8E-4 | 6.0E-4 | 8.9E-4 | 1.3E-3 | 1.7E-3 | 2.3E-3 | 3.0E-3 | 3.8E-3 |
| 653 | 8.0E-7 | 4.7E-6 | 1.6E-5 | 4.1E-5 | 8.8E-5 | 1.6E-4 | 2.8E-4 | 4.4E-4 | 6.7E-4 | 9.6E-4 | 1.3E-3 | 1.8E-3 | 2.3E-3 | 3.0E-3 |
| 744 | 5.4E-7 | 3.2E-6 | 1.1E-5 | 2.9E-5 | 6.4E-5 | 1.2E-4 | 2.1E-4 | 3.4E-4 | 5.1E-4 | 7.4E-4 | 1.0E-3 | 1.4E-3 | 1.8E-3 | 2.3E-3 |
| 847 | 3.6E-7 | 2.2E-6 | 8.1E-6 | 2.1E-5 | 4.7E-5 | 9.1E-5 | 1.6E-4 | 2.6E-4 | 3.9E-4 | 5.7E-4 | 8.0E-4 | 1.1E-3 | 1.4E-3 | 1.9E-3 |
| 965 | 2.5E-7 | 1.6E-6 | 5.9E-6 | 1.6E-5 | 3.5E-5 | 6.9E-5 | 1.2E-4 | 2.0E-4 | 3.1E-4 | 4.5E-4 | 6.4E-4 | 8.7E-4 | 1.2E-3 | 1.5E-3 |
| 1098 | 1.8E-7 | 1.2E-6 | 4.3E-6 | 1.2E-5 | 2.7E-5 | 5.3E-5 | 9.4E-5 | 1.5E-4 | 2.4E-4 | 3.6E-4 | 5.1E-4 | 7.0E-4 | 9.4E-4 | 1.2E-3 |
| 1251 | 1.3E-7 | 8.4E-7 | 3.2E-6 | 8.9E-6 | 2.0E-5 | 4.1E-5 | 7.3E-5 | 1.2E-4 | 1.9E-4 | 2.8E-4 | 4.1E-4 | 5.6E-4 | 7.6E-4 | 1.0E-3 |

FIG. 22

| R1\R2 | 74 | 107 | 140 | 173 | 206 | 239 | 272 | 305 | 338 | 371 | 404 | 437 | 470 | 503 |
|---|---|---|---|---|---|---|---|---|---|---|---|---|---|---|
| 231 | 3.6E-4 | 9.1E-4 | | | | | | | | | | | | |
| 263 | 1.6E-4 | 4.4E-4 | 9.2E-4 | | | | | | | | | | | |
| 300 | | | 2.3E-4 | 5.2E-4 | 9.7E-4 | | | | | | | | | |
| 341 | | | 1.4E-4 | 3.1E-4 | 5.9E-4 | 1.0E-3 | | | | | | | | |
| 389 | | | | 1.9E-4 | 3.8E-4 | 6.7E-4 | | | | | | | | |
| 442 | | | | 1.3E-4 | 2.5E-4 | 4.5E-4 | 7.4E-4 | | | | | | | |
| 504 | | | | | 1.7E-4 | 3.2E-4 | 5.3E-4 | 8.2E-4 | | | | | | |
| 574 | | | | | 1.2E-4 | 2.3E-4 | 3.8E-4 | 6.0E-4 | 8.9E-3 | | | | | |
| 653 | | | | | | 1.6E-4 | 2.8E-4 | 4.4E-4 | 6.7E-4 | 9.6E-4 | | | | |
| 744 | | | | | | 1.2E-4 | 2.1E-4 | 3.4E-4 | 5.1E-4 | 7.4E-4 | 1.0E-3 | | | |
| 847 | | | | | | | 1.6E-4 | 2.6E-4 | 3.9E-4 | 5.7E-4 | 8.0E-4 | | | |
| 965 | | | | | | | 1.2E-4 | 2.0E-4 | 3.1E-4 | 4.5E-4 | 6.4E-4 | 8.7E-4 | | |
| 1098 | | | | | | | | 1.5E-4 | 2.4E-4 | 3.6E-4 | 5.1E-4 | 7.0E-4 | 9.4E-4 | |
| 1251 | | | | | | | | 1.2E-4 | 1.9E-4 | 2.8E-4 | 4.1E-4 | 5.6E-4 | 7.6E-4 | 1.0E-3 |

FIG. 23

| R1R2 | 74 | 86 | 99 | 115 | 134 | 155 | 179 | 208 | 240 | 279 | 323 | 374 | 433 | 502 |
|---|---|---|---|---|---|---|---|---|---|---|---|---|---|---|
| 231 | | 1.7E-4 | 2.8E-4 | 4.8E-4 | 7.9E-4 | | | | | | | | |
| 263 | | 1.1E-4 | 2.0E-4 | 3.4E-4 | 5.7E-4 | 9.6E-4 | | | | | | | |
| 300 | | | 1.4E-4 | 2.4E-4 | 4.1E-4 | 6.9E-4 | | | | | | | |
| 341 | | | | 1.6E-4 | 2.9E-4 | 4.9E-4 | 8.3E-4 | | | | | | |
| 389 | | | | 1.1E-4 | 2.0E-4 | 3.4E-4 | 5.9E-4 | 1.0E-3 | | | | | |
| 442 | | | | | 1.3E-4 | 2.4E-4 | 4.1E-4 | 7.1E-4 | | | | | |
| 504 | | | | | | 1.6E-4 | 2.8E-4 | 5.0E-4 | 8.5E-4 | | | | |
| 574 | | | | | | 1.1E-4 | 1.9E-4 | 3.4E-4 | 5.9E-4 | 1.0E-3 | | | |
| 653 | | | | | | | 1.2E-4 | 2.3E-4 | 4.1E-4 | 7.1E-4 | | | |
| 744 | | | | | | | | 1.5E-4 | 2.7E-4 | 4.8E-4 | 8.5E-4 | | |
| 847 | | | | | | | | | 1.8E-4 | 3.2E-4 | 5.8E-4 | 1.0E-3 | |
| 965 | | | | | | | | | 1.1E-4 | 2.1E-4 | 3.8E-4 | 6.9E-4 | |
| 1098 | | | | | | | | | | 1.3E-4 | 2.5E-4 | 4.5E-4 | 8.2E-4 |
| 1251 | | | | | | | | | | | 1.5E-4 | 2.9E-4 | 5.4E-4 | 9.8E-4 |

FIG. 24

| R1\R2 | 74 | 86 | 99 | 115 | 134 | 155 | 179 | 208 | 240 | 279 | 323 | 374 | 433 | 502 |
|---|---|---|---|---|---|---|---|---|---|---|---|---|---|---|
| 231 |  | 41 | 71 | 119 | 199 |  |  |  |  |  |  |  |  |  |
| 263 |  | 29 | 50 | 85 | 144 | 239 |  |  |  |  |  |  |  |  |
| 300 |  |  | 34 | 60 | 102 | 173 |  |  |  |  |  |  |  |  |
| 341 |  |  |  | 41 | 72 | 123 | 208 |  |  |  |  |  |  |  |
| 389 |  |  |  | 28 | 49 | 86 | 148 | 250 |  |  |  |  |  |  |
| 442 |  |  |  |  | 33 | 59 | 103 | 178 |  |  |  |  |  |  |
| 504 |  |  |  |  |  | 40 | 71 | 124 | 213 |  |  |  |  |  |
| 574 |  |  |  |  |  | 26 | 48 | 85 | 149 |  |  |  |  |  |
| 653 |  |  |  |  |  |  | 31 | 57 | 101 | 178 |  |  |  |  |
| 744 |  |  |  |  |  |  |  | 37 | 68 | 121 | 213 |  |  |  |
| 847 |  |  |  |  |  |  |  |  | 44 | 80 | 145 |  |  |  |
| 965 |  |  |  |  |  |  |  |  | 28 | 52 | 96 | 173 |  |  |
| 1098 |  |  |  |  |  |  |  |  |  | 33 | 62 | 114 | 206 |  |
| 1251 |  |  |  |  |  |  |  |  |  |  | 39 | 73 | 135 | 246 |

FIG. 25

TABLE B

| R1\i | 1 | 2 | 3 | 4 | 5 |
|---|---|---|---|---|---|
| 231 | 1.7E-4 | 2.8E-4 | 4.8E-4 | 7.9E-4 | |
| 263 | 1.1E-4 | 2.1E-4 | 3.4E-4 | 5.7E-4 | 9.6E-4 |
| 300 | 1.4E-4 | 2.4E-4 | 4.1E-4 | 6.9E-4 | |
| 341 | 1.6E-4 | 2.9E-4 | 4.9E-4 | 8.3E-4 | |
| 389 | 1.1E-4 | 2.0E-4 | 3.4E-4 | 5.9E-4 | 1.0E-3 |
| 442 | 1.3E-4 | 2.4E-4 | 4.1E-4 | 7.1E-4 | |
| 504 | 1.6E-4 | 2.8E-4 | 5.0E-4 | 8.5E-4 | |
| 574 | 1.1E-4 | 1.9E-4 | 3.4E-4 | 5.8E-4 | 1.0E-3 |
| 653 | 1.2E-4 | 2.3E-4 | 4.1E-4 | 7.1E-4 | |
| 744 | 1.5E-4 | 2.7E-4 | 4.8E-4 | 8.5E-4 | |
| 847 | 1.8E-4 | 3.2E-4 | 5.8E-4 | 1.0E-4 | |
| 965 | 1.1E-4 | 2.1E-4 | 3.8E-4 | 6.9E-4 | |
| 1098 | 1.3E-4 | 2.5E-4 | 4.5E-4 | 8.2E-4 | |
| 1251 | 1.5E-4 | 2.9E-4 | 5.4E-4 | 9.8E-4 | |

FIG. 26B

TABLE A

| R1\i | 1 | 2 | 3 | 4 | 5 |
|---|---|---|---|---|---|
| 231 | 86 | 99 | 115 | 134 | |
| 263 | 86 | 99 | 115 | 134 | 155 |
| 300 | 99 | 115 | 134 | 155 | |
| 341 | 115 | 134 | 155 | 179 | |
| 389 | 115 | 134 | 155 | 179 | 208 |
| 442 | 134 | 155 | 179 | 208 | |
| 504 | 155 | 179 | 208 | 240 | |
| 574 | 155 | 179 | 208 | 240 | 279 |
| 653 | 179 | 208 | 240 | 279 | |
| 744 | 208 | 240 | 279 | 323 | |
| 847 | 240 | 279 | 323 | 374 | |
| 965 | 240 | 279 | 323 | 374 | |
| 1098 | 279 | 323 | 374 | 433 | |
| 1251 | 323 | 374 | 433 | 502 | |

FIG. 26A

SIGNAL EVALUATION DEVICES AND SIGNAL EVALUATION METHODS, SIGNAL QUALITY EVALUATION METHODS AND REPRODUCING DEVICES AND RECORDING DEVICES

FIELD OF THE INVENTION

The present invention relates to signal evaluation devices and signal evaluation methods of a simple structure and of a capability to perform evaluations in different PR modes for the evaluation of a recording medium or a recording medium driving device by evaluating a decoded signal of maximum likelihood decoding. The invention also relates to signal evaluation devices and signal evaluation methods for use in optical reproducing devices of a PRML (Partial Response Maximum Likelihood) system, capable of reliably evaluating a reproduced signal quality with a simple circuit structure. The invention also relates to signal quality evaluation methods, reproducing devices and recording devices.

BACKGROUND OF THE INVENTION

Over the last years, digitization of various information such as video information and audio information has drastically increased a volume of digital information. To accommodate the increased digital data volume, larger-capacity and higher-density optical disks and optical disk devices have been developed. Further, the advancement of high-density digital information has been associated with a poor quality of reproduced signals from the optical disk. Thus, there is a present need in particular to evaluate a reproduced signal.

A reproduced signal from the optical disk is evaluated, for example, to ensure product quality before the optical disk is shipped, or to adjust various components of the optical disk device to optimize the quality of the reproduced signal.

Conventionally, evaluations of optical disks and optical disk devices have been carried out by measuring jitter or bit error rate (BER). In recent years, this evaluation method has been replaced by the PRML (Partial Response Maximum Likelihood) method, which is a data detection method for realizing high-density recording. An evaluation device suitable for the PRML method is disclosed in Japanese Unexamined Patent Publication No. 21651/1998 (Tokukaihei 10-21651) (published on Jan. 23, 1998).

Referring to FIG. 4 and FIG. 5, the following explains this conventional signal evaluation device which evaluates a recording medium, such as optical disks, or a recording medium driving device, by evaluating a reproduced signal. The signal evaluation device of this conventional example decodes a reproduced signal by Viterbi decoding. Here, the code is (1, 7) RLL with a minimum run length of 1, and PR (1, 2, 1) is used for the PRML method. As indicated by Table 1 below, the state $S_k$ of recorded bit sequence $b_k$ at sample point k is S0, S1, S2, or S3.

TABLE 1

| STATE | RECORDED BIT | |
|---|---|---|
| Sk | bk-1 | bk |
| S0 | 0 | 0 |
| S1 | 0 | 1 |
| S2 | 1 | 1 |
| S3 | 1 | 0 |

The state changes from one state to another according to the next recording bit. This transition of a state is called branching. Table 2 shows how the state changes according to the recording bit. As noted above, the code used here is (1, 7) RLL with a minimum run length of 1. That is, the minimum run length is restricted to 1, which accounts for the six branches a, b, c, d, e, f.

TABLE 2

| | RECORDED BIT | | | STATE | | EXPECTED VALUE |
|---|---|---|---|---|---|---|
| No. | bk - 2 | bk - 1 | bk | Sk - 1 | Sk | Yk |
| a | 0 | 0 | 0 | S0 | S0 | −1.0 |
| b | 1 | 0 | 0 | S3 | S0 | −0.5 |
| c | 0 | 0 | 1 | S0 | S1 | −0.5 |
| d | 0 | 1 | 1 | S1 | S2 | 0.5 |
| e | 1 | 1 | 1 | S2 | S2 | 1.0 |
| f | 1 | 1 | 0 | S2 | S3 | 0.5 |

Table 2 contains expected value $Y_k$, which indicates a reproduced signal level of an ideal waveform which contains no noise, because, in PR (1, 2, 1), the reproduced signal level is determined by the 3-bit recording bit sequence. Here, the reproduced signal level of the ideal waveform has been normalized to have a minimum value of −1 and a maximum value of 1.

Here, the branch metric $(Z_k-Y_k)^2$ of each branch at sample point k is calculated, where $Z_k$ is the reproduced signal level at sample point k, and $Y_k$ is the expected value of the reproduced signal level. That is, the branch metric is the square of a difference between a reproduced signal level and its expected value, and therefore indicates a square error of the reproduced signal level with respect to the expected value.

The branch metric is used to select a branch when two branches merge into one state. Branches that are continuous are called a path, and a sequence of selected branches is called a surviving path.

In this instance, when the accumulative value of branch metrics with respect to the surviving path in each state at sample point k-1 is $m_{k-1}$, the accumulative value of branch metrics at sample point k is given by the sum of $m_{k-1}$ and the branch metric $bm_k$ at sample point k. As described, since the branch metric is indicative of a square error, the accumulative value is the sum of errors. Therefore, the branches that are selected out are those which would give a smaller value of $m_{k-1}+bm_k$.

For example, the branches that enter the state S0 at sample point k are branch a, which changes from S0 to S0, and branch b, which changes from S3 to S0, as Table 2 indicates. When the accumulative values of the branch metrics of branch a and branch b are $m0_{k-1}$ and $m3_{k-1}$, respectively, and when their respective branch metrics are $bma_k$ and $bmb_k$, then the accumulative values $m0_k(a)$ and $m0_k(b)$ of branch metric a and branch metric b at sample point k are given by the following equations (1) and (2), respectively.

$$m0k(a) = m0k\text{-}1 + bmak \qquad (1)$$

$$m0k(b) = m3k\text{-}1 + bmak \qquad (2)$$

The values of $m0k(a)$ and $m0k(b)$ are compared, and the branch which gives the smaller value is selected.

Here, when the correct state at sample point k is S0, and when the correct transition is a, the equation $$\Delta mk = m0K(b) - m0k(a) \qquad (3)$$

is calculated, where $\Delta mk$ is called a differential metric.

When the correct state at sample point k is S0, and when the correct transition is b, the differential metric Δmk becomes $$\Delta mk = m0k(a) - m0k(b) \quad (4).$$

That is, the accumulative value of the branch metric of the correct transition is subtracted from the accumulative value of the branch metric of the incorrect transition. For the determination of a correct state and a correct transition, a method described in the foregoing publication can be used, which uses a recorded data sequence, or delays a reproduced data sequence when the error rate of the reproduced data sequence is low.

The result of decoding, i.e., the differential metric Δmk, is positive when the selected branch is correct, and is negative when the selected branch is incorrect.

FIG. 4 shows a distribution of differential metrics calculated at each sample point. Assuming that the differential metric distribution can be approximated to a normal distribution, the means is given by μ, and the standard deviation by σ. The probability that the differential metric has a negative value is equal to the bit error rate (BER), because the differential metric becomes negative when there is an error, i.e., when the incorrect branch is selected, as explained above. That is, the BER can be estimated by calculating the following equation (5)

$$BER = \frac{1}{\sqrt{2\pi} \cdot \sigma} \int_{-\infty}^{0} e^{-\frac{(t-\mu)^2}{2\sigma^2}} dt \quad (5)$$

In the event where a relative quality of the reproduced signal, not the absolute value of the BER of the optical disk or optical disk device is sought, σ/μ may be used as an index of the reproduced signal quality.

Incidentally, the distribution of differential metrics shown in FIG. 4 has a single peak. However, where the minimum run length is restricted, the distribution of differential metrics would contain a plurality of peaks, as shown in FIG. 5. It is possible in this case to calculate the BER as if the distribution has a single peak, by regarding the peak closest to 0 as the only peak in the distribution and assuming that the distribution of differential metrics is a normal distribution in a domain of differential metrics to the left of μ in FIG. 5. However, unlike the distribution having the real single peak, μ cannot be determined from the calculated mean, and accordingly standard deviation σ cannot be obtained.

In order to solve this problem, the foregoing publication extracts only the sequence which would give the highest probability of producing negative differential metrics, i.e., the sequence which traces a path that forms a distribution with a closest-to-zero peak. With this processing, a distribution with a single peak, as shown in FIG. 4, can be obtained, thereby enabling the mean μ and standard deviation σ to be calculated relatively easily.

However, while a distribution with a single peak can be obtained by extracting only the data sequence which traces a predetermined path, this processing requires a complex device structure. For example, in PR (1, 2, 1), it is required to find four paths of continuous four different states making specific transitions and to extract only the paths which coincide with these paths. This requires four 5-bit comparators.

Further, the number of paths which need to be found becomes different depending on the PR mode. In PR (1, 2, 2), it is required to find sixteen paths of continuous five different states which make specific transitions. This requires sixteen 6-bit comparators.

Thus, the signal quality evaluation device of the foregoing publication requires a large number of comparators to find and extract particular paths, with a result that the device structure becomes complex.

Further, because the extracted paths are different for each PR mode, the comparators cannot be shared in the evaluations in different PR modes. That is, the signal evaluation device is only applicable to the evaluation in a particular PR mode, and it cannot be used for the evaluations in more than one PR mode.

Meanwhile, a jitter, which has been conventionally used as a criterion for evaluating a reproduced signal quality in optical disks has been replaced by the PRML method, which is a data detection method for realizing high-density recording. Under these circumstances, a jitter, which indicates variations on a time axis, is not suitable as a criterion for the evaluation. Further, it is also common to use a bit error rate, which is a result of data detection by the PRML method, to evaluate a reproduced signal quality. However, this method is associated with many drawbacks, such as a large number of sample bits required for the measurement, and susceptibility to defects due to a scratch on the disk, for example.

In light of these backgrounds, there has been proposed an evaluation method of a reproduced signal quality, known as SAM (Sequenced Amplitude Margin) (T. Perkins, A Window-Margin-Like Procedure for Evaluating PRML Channel Performance; IEEE Transactions on Magnetics, Vol. 31, No. 2, 1995, pp. 1109–1114).

The concept of SAM is described below with reference to FIG. 18 through FIG. 20(a) and FIG. 20(b). The following description is based on the case of PRML detection in which a reproduced signal of a bit string which was recorded with the (1, 7) RLL (Run Length Limited) code is detected according to the PR (1, 2, 1) characteristics.

According to the PR (1, 2, 1) characteristics, the reproduced signal waveform of an ideal 1T mark having no distortion or noise has a channel-clock-based sample level ratio of 1:2:1, as shown in FIG. 18. The reproduced signal waveforms of 2T or greater marks are determined by superimposing the reproduced signal waveform of the 1T mark, so that the sample level ratios of the 2T mark, 3T mark, and 4T mark become 1:3:3:1, 1:3:4:3:1, and 1:3:4:4:3:1, respectively.

In this manner, an ideal reproduced signal waveform is assumed for an arbitrary bit string, and five ideal sample levels 0, 1, 2, 3, 4 are set. Here, for simplicity, the sample levels are normalized to have peak amplitude values of +1 and −1, and accordingly the ideal sample levels are −1, −0.5, 0, +0.5, +1.

The PRML decoding is implemented by the Viterbi decoding. Here, the trellis diagram as shown in FIG. 19 is considered to explain the Viterbi decoding. In FIG. 19, S(00), S(01), S(10), S(11) indicate states, and, for example, S(00) means that the preceding bit and the current bit are both 0. The line which connects one state to another is called a branch, and it indicates a state transition. For example, the branch which indicates a transition from S(00) to S(01) can represent a bit string 001.

In FIG. 19, each branch has an identifier a through f, each with an ideal waveform level expected in its state transition. For example, the branch a represents a bit string 000 and has an ideal level −1, and the branch b has a bit string 100 and has an ideal level −0.5. There is no branch from S(01) to S(10) and from S(10) to S(01), reflecting the impossible bit strings 010 and 101 in the (1, 7) RLL code whose run length is limited by d=1.

In the trellis diagram, to consider all combinations of branches which connect one state to another (called "paths") is to consider all possible bit strings. Thus, the actual reproduced waveform from the magneto-optical recording medium can be compared with the expected ideal waveform of each path to find a path with the closest waveform, i.e., a path with an ideal waveform having the shortest Euclid distance. In this way, the most likely path can be regarded as the correct path.

The following explains the processes of the Viterbi decoding in more detail, with reference to the trellis diagram of FIG. 19. At an arbitrary time, two paths merge into state S(00) and into state S(11), while a single path extends to state S(01) and to S(10). With respect to each set of the two paths which merge into state S(01) and state S(11), the path with an ideal waveform that gives a shorter Euclid distance from the reproduced signal waveform is selected as a surviving path. As a result, four paths remain at an arbitrary time, respectively extending to the four states.

The square of the Euclid distance between the ideal waveform of a path and the reproduced signal waveform is called a path metric. The path metric is determined by calculating the accumulative value of branch metric, which is the square of a difference between the ideal sample level of a branch and the sample level of the reproduced waveform, with respect to all the branches making up the path.

The branch metrics are calculated from the following equations (13) through (16), and the path metrics are calculated from the following equations (17) through (20), $$Ba[t] = (X[t]+1)^2 \quad (13)$$

$$Bb[t] = Bc[t] = (X[t]+0.5)^2 \quad (14)$$

$$Bd[t] = Be[t] = (X[t]-0.5)^2 \quad (15)$$

$$Bf[t] = (X[t]-1)^2 \quad (16)$$

$$M(00)[t] = \text{Min}\{M(00)[t-1]+Ba[t], M(10)[t-1]+Bb[t]\}$$
$$(\text{Min}\{m,n\}=m(\text{if } m \leq n); n(\text{if } m>n)) \quad (17)$$

$$M(01)[t] = M(00)[t-1]+Bc[t] \quad (18)$$

$$M(10)[t] = M(11)[t-1]+Bd[t] \quad (19)$$

$$M(11)[t] = \text{Min}\{M(01)[t-1]+Be[t], M(11)[t-1]+Bf[t]\}$$
$$(\text{Min}\{m,n\}=m(\text{if } m \leq n); n(\text{if } m>n)) \quad (20)$$

where X[t] is the sample level of the reproduced signal waveform at time t, Ba[t], Bb[t], Bc[t], Bd[t], Be[t], Bf[t] are the branch metrics of the branches a, b, c, d, e, f, respectively, at time t, and M(00)[t], M(01)[t], M(10)[t], M(11)[t] are the path metrics of the surviving paths of the states S(00), S(01), S(10), and S(11), respectively, at time t. The process of selecting a smaller path metric of M(00)[t] and M(11)[t] is the selection of a surviving path.

By repeating the process of selecting a surviving path in response to input of a sample value of the reproduced signal waveform, the paths with larger path metrics are successively eliminated before the paths eventually converge into a single path. This path is regarded and used as the correct path to correctly reproduce the original data bit string.

Given this condition of Viterbi decoding, in order for the paths to converge into a single correct path, it is required that the path metric of the correct path be smaller than the path metric of the incorrect path every time a surviving path is selected. This condition is given by the following expressions (21) through (24), according to different correct bit strings.

When the correct bit string is . . . 000, $$\Delta M = (M(01)[t-1]+Bb[t]) - (M(00)[t-1]+Ba[t]) > 0 \quad (21).$$

When the correct bit string is . . . 100, $$\Delta M = (M(00)[t-1]+Ba[t]) - (M(01)[t-1]+Bb[t]) > 0 \quad (22).$$

When the correct bit string is . . . 011, $$\Delta M = (M(11)[t-1]+Bf[t]) - (M(01)[t-1]+Be[t]) > 0 \quad (23).$$

When the correct bit string is . . . 111, $$\Delta M = (M(01)[t-1]+Be[t]) - (M(11)[t-1]+Bf[t]) > 0 \quad (24).$$

Also, when the correct bit string is . . . 001 or . . . 110, $\Delta M$ is always greater than 0 because the selection of a surviving path never fails in this case.

In the foregoing expressions (21) through (24), $\Delta M$ is a difference of path metrics of two paths being chosen, and it is called a SAM. To avoid error, it is required that SAM>0. Further, the larger the SAM value, the smaller the probability of an error.

In order to evaluate reliability of the system using the SAM value, a distribution of SAM values calculated at each time must be evaluated in its entirety. The foregoing publication Tokukaihei 10-21651 proposes a method of testing reliability of a reproducing device, using the standard deviation of a frequency distribution of SAM values for the evaluation.

FIG. 20(a) is a graph of a frequency distribution of actual SAM values which were determined from a reproduced signal of a (1, 7) RLL code pattern recorded in a magneto-optical disk. As can be seen from the graph, the SAM distribution has two peaks. This is due to the fact that the Euclid distance between a correct path and an incorrect path becomes different depending on the bit pattern when obtaining SAM values for the entire reproduced signal.

Therefore, as shown in FIG. 20(b), the SAM distribution of a noise-free ideal reproduced signal which was obtained from the (1, 7) RLL code string has a plurality of discrete ideal values 1.5, 2.5, 3.5, 4.5, 5, 6, 7, 8, 9. The ideal values have different frequencies because, in addition to the different numbers of bit patterns for each ideal value, the occurrence of each bit pattern is different in the (1, 7) RLL code string. The actual reproduced signal has various kinds of noise and the ideal values are varied. The result is the distribution pattern with a combination of different distributions, as FIG. 20(a) illustrates.

The SAM distribution, with these characteristics, is very different from normal distributions. Therefore, simply finding a standard deviation from the SAM distribution only gives a little correlation with the bit error rate.

For this reason, the foregoing Tokukaihei 10-21651 creates a SAM distribution by selecting only the bit patterns with the SAM ideal value of 1.5, which have a high probability producing SAM values less than 0 by the influence of a noise, so as to determine a standard deviation with respect to this SAM distribution. This essentially requires a sequence of monitoring patterns of a plurality of data bits resulting from the PRML decoding, and determining SAM values only when the patterns are specific patterns. The drawback of such a sequence is a complex circuit structure. Further, the load on the circuit is large because in order to determine the standard deviation the circuit must calculate the square error of each SAM value and the SAM mean value.

The inventors of the present invention have proposed a method of testing reliability of a reproducing device by first determining relative frequencies according to two different thresholds in a frequency distribution of SAM values and then calculating the bit error rate. Note that, this testing method for a reproducing device is referred to herein only for the purpose of explanation, and it does not constitute known art or prior art of the present invention.

The method of testing reliability of a reproducing device is described below. As described above with reference to FIG. 20(a) and FIG. 20(b), the frequency distribution of SAM values has a distribution pattern with a combination of different distributions because a plurality of SAM ideal values are found with variations by the influence of a noise. Each distribution can be approximated to a normal distribution if the noise is a white noise or close to a white noise. Therefore, a portion of the SAM distribution smaller than the minimum SAM ideal value 1.5 can be nearly approximated to a normal distribution with the mode $\mu$ close to 1.5. Here, the standard deviation $\sigma$, which indicates a variance of the approximated normal distribution, corresponds one to one to the bit error rate, which relationship is represented by the following equation (34)

$$BER = K \times \frac{1}{\sqrt{2\pi}\,\sigma} \int_{-\infty}^{0} \exp\{-(x-\mu)^2/2\sigma^2\}dx \qquad (34)$$

FIG. 28 shows a graph of a frequency distribution of actual SAM values measured from an actual optical disk reproducing device (shown in solid line), superimposed on a normal distribution with the standard deviation $\sigma$ corresponding to the bit error rate (shown in dotted line).

The last part on the right-hand-side of equation (34) is known in statistics as a distribution function which is determined by integrating a probability density function of a normal distribution, and it indicates a relative frequency in a domain not more than 0 in a normal distribution with mode $\mu$ and standard deviation $\sigma$. Further, since the error bit in principle occurs when SAM<0, it can be said that the bit error rate BER is equal to a proportion of the domain not more than 0 with respect to all frequencies of the frequency distribution of SAM values. Therefore, the relative frequency in the domain not more than 0 in the normal distribution, multiplied by constant K of modulus transformation, coincides with the bit error rate. More specifically, constant K is obtained from $$K=n/N$$

where N is the total frequencies of the frequency distribution of SAM values, and n is the number of patterns which give the smallest SAM ideal value, i.e., the SAM ideal value of 1.5 (a distribution which is created only with the SAM values of such patterns is approximated to a normal distribution with the mode of about 1.5).

With respect to the frequency distribution of SAM values, relative frequencies R1' and R2' of domains at or below predetermined threshold values SL1 and SL2, respectively, are measured to give equations (35) and (36) below. These simultaneous equations can be solved for standard deviation $\sigma$ and mode $\mu$.

$$R1' = K \times \int_{-\infty}^{SL1} \frac{\exp\{-(x-\mu)^2/2\sigma^2\}}{\sqrt{2\pi}\,\sigma} dx \qquad (35)$$

$$R2' = K \times \int_{-\infty}^{SL2} \frac{\exp\{-(x-\mu)^2/2\sigma^2\}}{\sqrt{2\pi}\,\sigma} dx \qquad (36)$$

The bit error rate BER can be calculated from equation (34) with the substituted values of standard deviation $\sigma$ and mode $\mu$ obtained from equations (35) and (36).

The calculations of error rate from the relative frequencies of the frequency distribution of SAM values based on two different thresholds thus require solving very complex equations (35) and (36), whose results must then be used to solve equation (34). This is one problem of the foregoing signal evaluation device, because the operation of such calculations takes a notoriously long time when it is run on a microcomputer with software.

SUMMARY OF THE INVENTION

The present invention finds solutions to the foregoing problems, and an object of the present invention is to provide signal evaluation devices and signal evaluation methods of a capability to perform evaluation in a plurality of PR modes with a simple structure, in addition to reliably evaluating a quality of a reproduced signal in a short period of time and with a simple circuit structure.

In order to achieve this object, a signal evaluation device of the present invention for evaluating a decoded signal of maximum likelihood decoding includes: subtracting means for finding a difference of likelihoods of measured samples; counting means for counting a number of samples which has given a difference of likelihoods at or below a predetermined threshold as a result of subtraction by the subtracting means; and arithmetic operation means for finding a probability, based on a number of measured samples and the number of samples counted by the counting means, that the difference of likelihoods is at or below the predetermined threshold, and processing the probability by arithmetic operations so as to obtain an index of signal evaluation.

According to this invention, a signal evaluation device which evaluates a signal to evaluate a recording medium or a recording medium driving device can be realized with a simple structure.

Conventionally, a single-peak-distribution which can be approximated to a normal distribution was obtained and mean $\mu$ and standard deviation $\sigma$ of such a distribution were found by extracting those measured samples which would give the highest probability of producing negative differences of likelihoods, i.e., only the sequence that traces paths which form a distribution with the peak closest to 0. However, extracting only the sequence that traces specific paths requires a large number of comparators and it necessitates the signal evaluation device to have a complex structure. Further, since the extracted path is different for each PR mode, the same comparator cannot be used for the evaluations of different PR modes.

In contrast, the signal evaluation device of the present invention is adapted so that the counting means counts the number of samples which has given a difference of likelihoods at or below a predetermined threshold as a result of operations on measured samples by the subtracting means, and the arithmetic operation means finds the probability, based on the number of measured samples and the number of counted samples, that the difference of likelihoods is at or below the predetermined threshold, and processes this probability by arithmetic operations to obtain an index of signal evaluation.

That is, the signal evaluation device of the present invention finds the probability of the difference of likelihoods falling at or below a predetermined threshold and processes the probability by arithmetic operations so as to obtain an index of signal evaluation. This makes it possible to obtain mean μ and standard deviation σ of a normal distribution which is approximated from the distribution with the closest-to-zero peak, without extracting only the sequence which traces paths that form such a distribution.

For example, the counting means can be used to count the number of samples which has given a difference of likelihoods at or below a first threshold and count the number of samples which has given a difference of likelihoods at or below a second threshold. The probability of at or below the first threshold and the probability of at or below the second threshold can be found by respectively dividing these two sample numbers by the number of measured samples. The two probabilities so obtained can be used to obtain mean μ and standard deviation σ of an area approximated to a normal distribution, allowing an estimated value of BER to be calculated as an index of signal evaluation.

An index of signal evaluation is obtained in this manner without the process of extracting a specific path, and therefore a signal evaluation device of a simple structure can be realized without a large number of comparators. Further, since the signal evaluation device does not extract a specific path, it can be commonly used for the evaluations of different PR modes. That is, there is provided a signal evaluation device, for use in a recording medium or a recording medium driving device, capable of performing evaluations in different PR modes with a simple structure.

Further, in order to achieve the foregoing object, a signal quality evaluation method of the present invention includes the steps of: reproducing a recording medium; finding a path metric difference of two paths which enter a correct state of a trellis during PRML decoding of a reproduced signal from the recording medium; finding a relative frequency of a domain defined by a predetermined threshold in a frequency distribution of path metric differences; and evaluating a quality of the reproduced signal based on the relative frequency.

According to this invention, a signal quality evaluation method capable of easily and accurately detecting and evaluating a quality of a reproduced signal can be provided.

That is, the signal quality evaluation method of the present invention finds a path metric difference of two paths which enter a correct state of a trellis during PRML decoding of a reproduced signal from the recording medium, and evaluates a quality of the reproduced signal based on the relative frequency of a portion of a frequency distribution of path metric differences defined by a predetermined threshold.

Thus, it is not required, as conventionally done, to calculate SAM values by selecting only those bit patterns with a predetermined ideal value. That is, the signal quality evaluation method of the present invention can be implemented on devices with a simple circuit structure, because the method does not require the step of monitoring patterns of plural data bits and judging whether the patterns are specific patterns.

Further, the frequency distribution of path metric differences has a narrower spread under good signal quality conditions (small noise) and has a wider spread under bad signal quality conditions (large noise). That is, the relative frequency of an area defined by a predetermined threshold in the frequency distribution of path metric differences, i.e., the relative frequency of an area at or below the predetermined threshold corresponds to the spread of the frequency distribution. Thus, the relative frequency reflects the size of a noise, and corresponds to a signal quality. Therefore, by evaluating a quality of the reproduced signal based on the relative frequency, a quality of the reproduced signal can be accurately detected.

In order to achieve the foregoing object, a reproducing device of the present invention includes: reproducing means for reproducing a recording medium; path metric difference detecting means for finding a path metric difference of two paths which enter a correct state of a trellis during PRML decoding of a reproduced signal reproduced by the reproducing means; relative frequency detecting means for finding a relative frequency of a domain defined by a predetermined threshold in a frequency distribution of path metric differences; and signal quality evaluation means for evaluating a quality of the reproduced signal based on the relative frequency.

According to this invention, a signal reproducing device of a simple circuit structure, capable of accurately detecting a quality of a reproduced signal can be provided.

That is, the path metric difference detecting means finds a path metric difference of two paths which enter a correct state of a trellis during PRML decoding of a reproduced signal reproduced from the recording medium by the reproducing means, and it does not, as conventionally done, to select only those bit patterns with a predetermined ideal value. That is, the path metric difference detecting means can be realized by a simple circuit structure because it only finds a path metric difference of the two paths, rather than monitoring patterns of plural data bits and judging whether the patterns are specific patterns.

Further, the relative frequency detecting means finds the relative frequency of an area defined by a predetermined threshold in a frequency distribution of path metric differences. The signal quality evaluation means evaluates a quality of the reproduced signal based on the relative frequency found by the relative frequency detecting means.

As noted above, the frequency distribution of path metric differences varies depending on the signal quality. Therefore, the relative frequency of the area defined by the predetermined threshold in the frequency distribution of path metric differences reflects the size of a noise and corresponds to a signal quality. Thus, by evaluating a quality of the reproduced signal based on the relative frequency, a quality of the reproduced signal can be accurately detected.

Further, in order to achieve the foregoing object, a signal evaluation device of the present invention includes: reproducing means for reproducing a recording medium; path metric difference detecting means for finding a path metric difference of two paths which enter a correct state of a trellis during PRML decoding of a reproduced signal reproduced from the recording medium by the reproducing means; first relative frequency detecting means for finding a first relative frequency, which is a relative frequency of a domain defined by a first threshold in a frequency distribution of path metric differences; second relative frequency detecting means for detecting a second relative frequency, which is a relative frequency of a domain defined by a second threshold in the frequency distribution of path metric differences; and signal evaluation means for evaluating, referring to a pre-set lookup table, a quality of the reproduced signal based on the first and second relative frequencies found by the first and second relative frequency detecting means, respectively.

With the signal evaluation device having the foregoing structure, the standard deviation and the mode of a frequency distribution of path metric differences can be found based on, for example, the first relative frequency and the second relative frequency of areas at or below the first and second thresholds, respectively, with respect to the frequency distribution of path metric differences of two paths which enter a correct state of a trellis during PRML decoding of the reproduced signal from the recording medium.

The standard deviation and the mode of the frequency distribution of path metric differences thus found can be used to obtain a signal quality evaluation value (bit error rate), which is indicative of a reproduced signal quality, for each combination of the first and second relative frequencies. The signal quality evaluation value, for each combination of the first and second relative frequencies, is registered in a look-up table. In actual evaluation of a reproduced signal quality, the first relative frequency detecting means finds the first relative frequency, which is the relative frequency of an area defined by the first threshold in the frequency distribution of path metric differences obtained by the path metric difference detecting means. Also, the second relative frequency detecting means finds the second relative frequency, which is the relative frequency of an area defined by the second threshold in the frequency distribution of path metric differences. Based on the first and second relative frequencies found by the first and second relative frequency detecting means, respectively, the signal evaluation means evaluates a quality of the reproduced signal, referring to the look-up table.

That is, with use of the look-up table which is created by calculating corresponding reproduced signal qualities of the two relative frequencies of the frequency distribution of path metric differences, no complex statistical operations need to be carried out by a microcomputer of the device. As a result, a signal quality can easily be evaluated in a significantly shorter period of time.

For a fuller understanding of the nature and advantages of the invention, reference should be made to the ensuing detailed description taken in conjunction with the accompanying drawings.

BRIEF DESCRIPTION OF THE DRAWINGS

FIG. 22 is a diagram showing contents of a look-up table of the reproducing device.

FIG. 23 is a diagram showing contents of a look-up table in which only effective data are registered.

FIG. 24 is a diagram showing contents of a look-up table in which labels of the table are varied exponentially.

FIG. 25 is a diagram showing contents of a look-up table in which the registered values are 1-bit integers.

FIG. 26($a$) and FIG. 26($b$) are diagrams showing contents of a look-up table of a magneto-optical disk reproducing device using a signal evaluation device and a signal evaluation method according to the Second Embodiment of the present invention.

DESCRIPTION OF THE EMBODIMENTS

Figure 1:
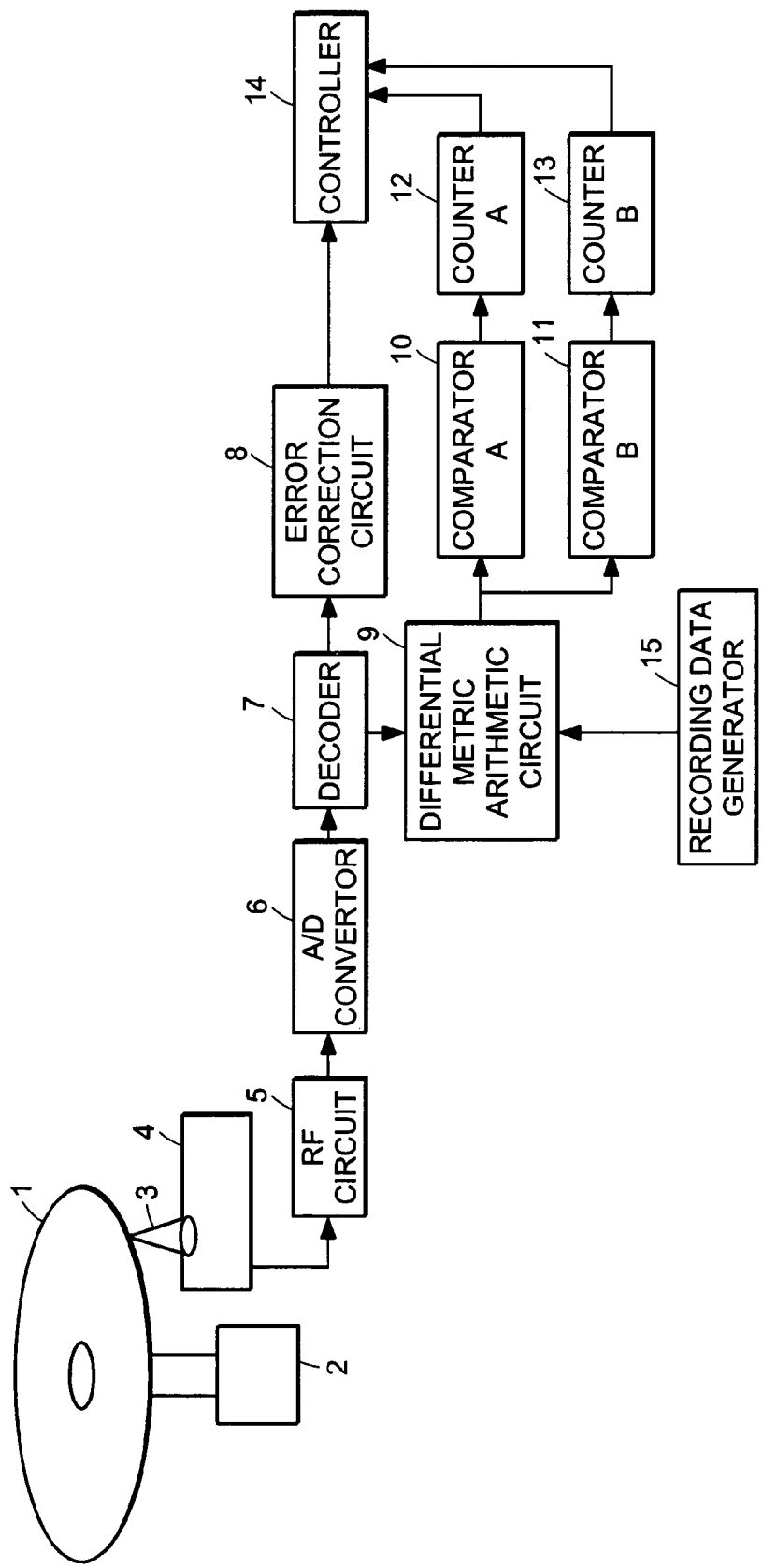
FIG. 1 is an explanatory drawing schematically showing a structure of a signal evaluation device according to one embodiment of the present invention.
Figure 2:
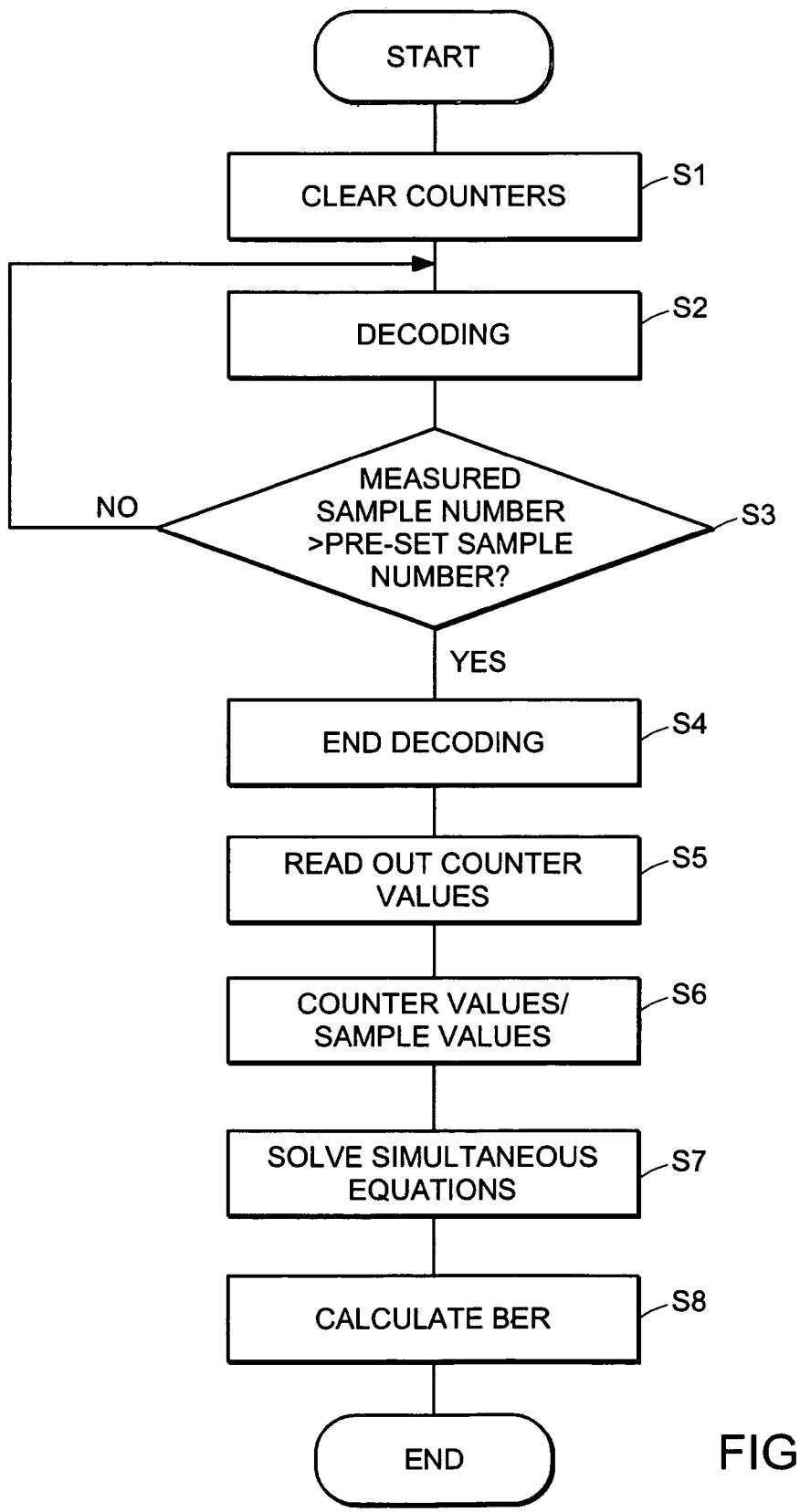
FIG. 2 is a flow chart explaining a signal evaluation method using the signal evaluation device according to one embodiment of the present invention.
Figure 3:
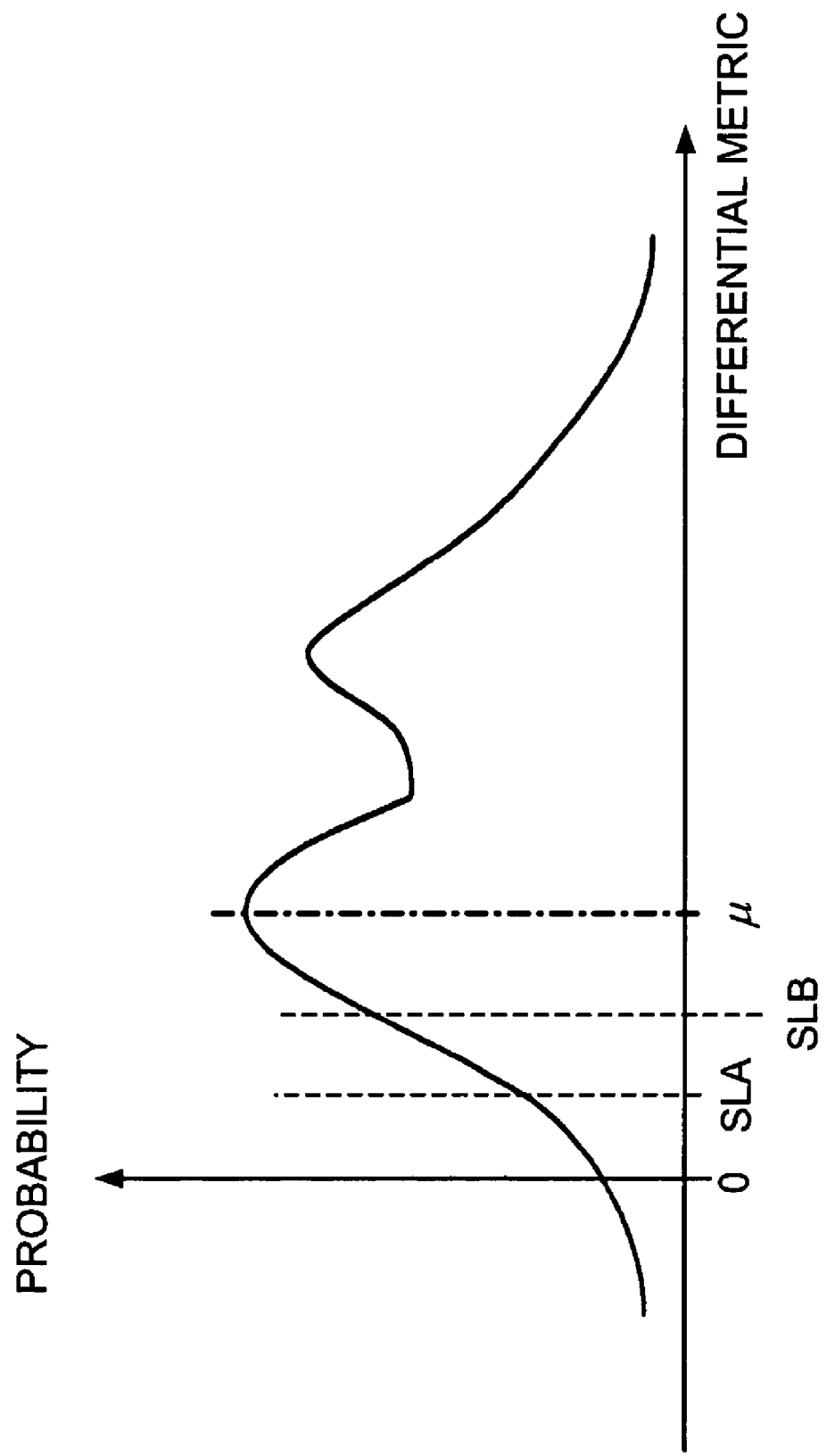
FIG. 3 is an explanatory drawing showing a differential metric distribution according to one embodiment of the present invention.
Figure 4:
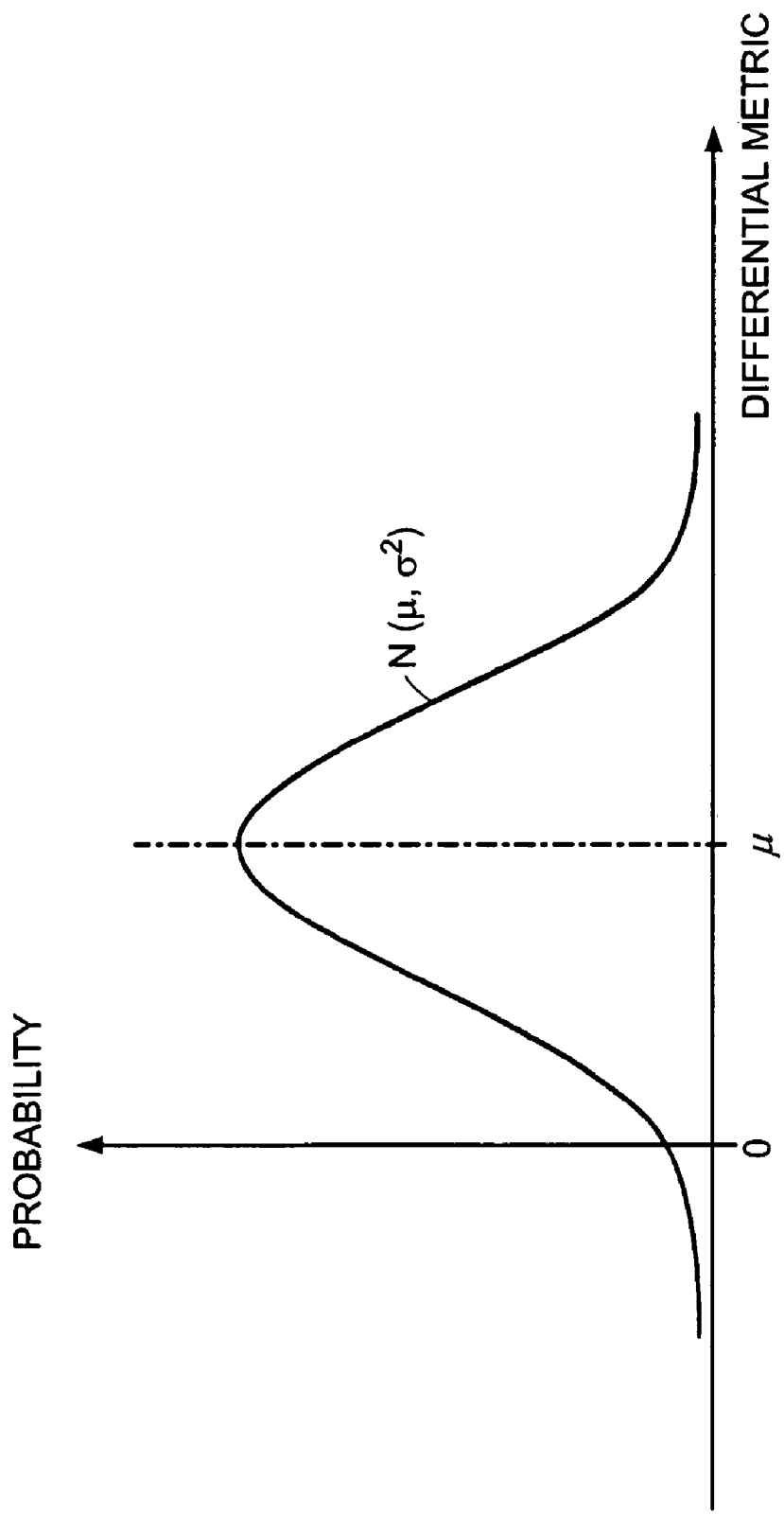
FIG. 4 is an explanatory drawing showing a differential metric distribution.
Figure 5:
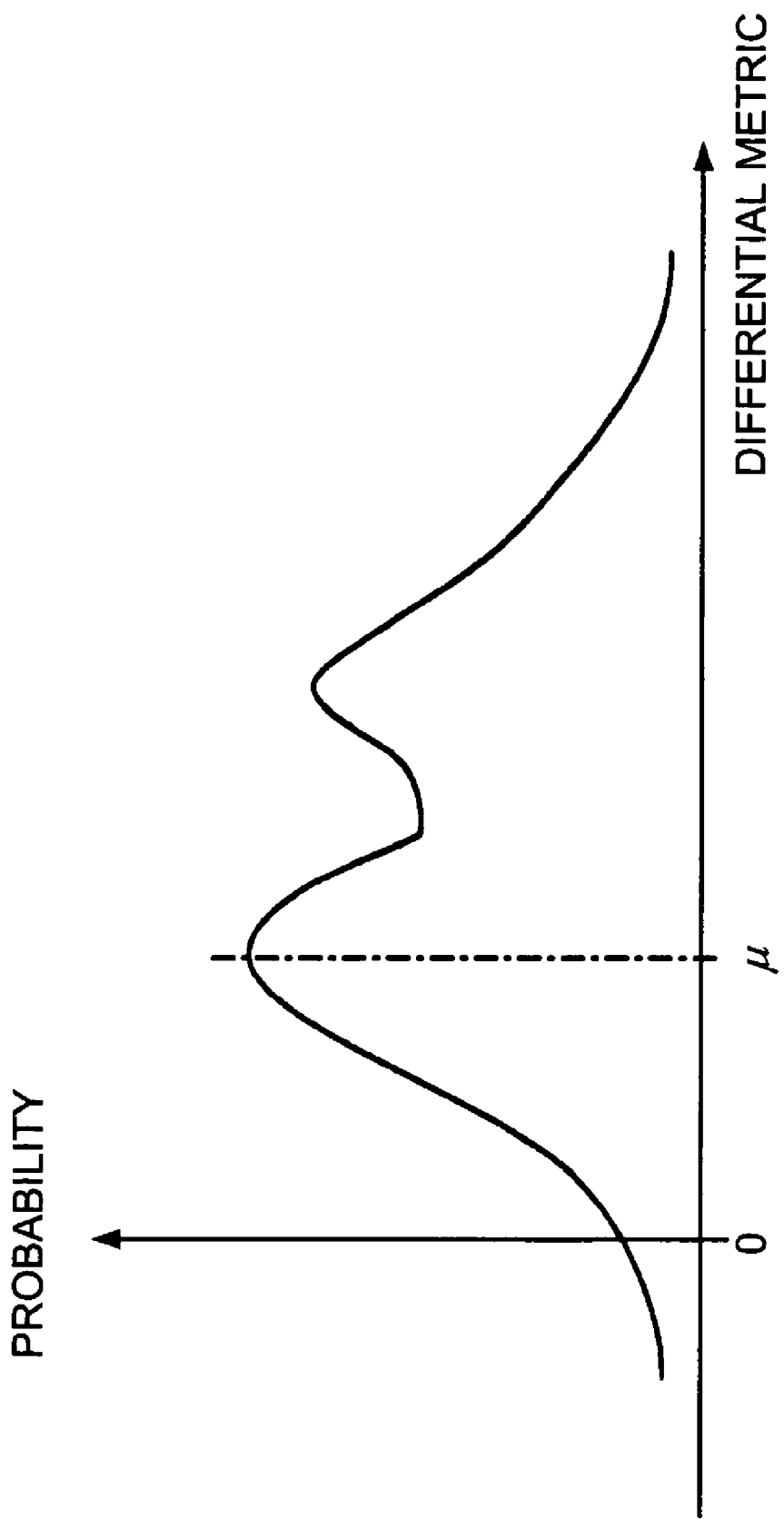
FIG. 5 is an explanatory drawing showing a differential metric distribution.

[First Embodiment]
Referring to FIG. 1 through FIG. 3, the following will describe one embodiment of the present invention.

The present embodiment describes an evaluation device which evaluates a signal quality for the evaluation of a recording medium or a recording medium driving device.

FIG. 1 schematically shows a configuration of a signal evaluation device of the present embodiment, in which an optical disk is used as the recording medium. Specifically, FIG. 1 illustrates a relevant part of the signal evaluation device where a reproduced signal of the optical disk is processed.

As shown in FIG. 1, the signal evaluation device of the present embodiment includes the optical disk (recording medium) 1, a spindle motor 2, an objective lens 3, a pick-up 4, an RF circuit 5, an A/D convertor 6, a decoder 7, an error correction circuit 8, a differential metric arithmetic circuit (subtractor) 9, a comparator A (counting means, first counting means) 10, a comparator B (counting means, second counting means) 11, a counter A (counting means, first counting means) 12, a counter B (counting means, second counting means) 13, a controller (arithmetic operation means, correction arithmetic means) 14, and a recording data generator 15.

The following describes operations of the signal evaluation device having the foregoing structure. Among various types of optical disks 1 available, the descriptions of the present embodiment will be given through the case of a magneto-optical disk (MO disk). The optical disk 1 is driven to rotate by the spindle motor 2, and a light beam is projected through the objective lens 3 of the pick-up 4 which is provided below the optical disk 1. It should be noted here that the position of the pick-up 4, which is below the optical disk 1 in the present embodiment, is not particularly limited.

The reflected light of the light beam off the optical disk 1 is detected by a photo detector (not shown) which is provided in the pick-up 4. The pick-up 4 separates the light into a magneto-optical signal (MO signal) and other signals.

The RF circuit 5 adjusts the amplitude or offset of the magneto-optical signal, and the A/D convertor 6 converts the magneto-optical signal into digital data. The output of the A/D convertor 6 is fed to the decoder 7. The decoded data in the decoder 7 is sent to the error correction circuit 8. The error correction circuit 8 operates to correct any error in the data decoded by the decoder 7, and the output of the error correction circuit 8 is fed to the controller 14. Note that, the error correction circuit 8 detects and corrects an error, using an error detection/correction code, which is incorporated in the data decoded in the decoder 7.

The decoder 7 decodes data according to a PRML (Partial Response maximum Likelihood) method. The resulting information of this decoding is fed to the differential metric arithmetic circuit 9. The differential metric arithmetic circuit 9 operates in the same manner as the conventional example as already explained in connection with the prior art techniques.

That is, the decoder 7 decodes the reproduced signal of the optical disk 1 by the Viterbi decoding. Here, the code is (1, 7) RLL with a minimum run length of 1, and PR (1, 2, 1) is used for the PRML method. As indicated in Table 3 below, the state Sk of recording bit sequence bk at sample point k is S0, S1, S2, or S3.

TABLE 3

| STATE | RECORDED BIT | |
|---|---|---|
| Sk | bk-1 | bk |
| S0 | 0 | 0 |
| S1 | 0 | 1 |
| S2 | 1 | 1 |
| S3 | 1 | 0 |

The state changes from one state to another according to the next recording bit. This transition of a state is called branching. Table 4 shows how the state changes according to the recording bit. As noted above, the code used here is (1, 7) RLL with a minimum run length of 1. That is, the minimum run length is restricted to 1, which accounts for the six branches a, b, c, d, e, f.

TABLE 4

| | RECORDED BIT | | | STATE | | EXPECTED VALUE |
|---|---|---|---|---|---|---|
| No. | bk - 2 | bk - 1 | bk | Sk - 1 | Sk | Yk |
| a | 0 | 0 | 0 | S0 | S0 | −1.0 |
| b | 1 | 0 | 0 | S3 | S0 | −0.5 |
| c | 0 | 0 | 1 | S0 | S1 | −0.5 |
| d | 0 | 1 | 1 | S1 | S2 | 0.5 |
| e | 1 | 1 | 1 | S2 | S2 | 1.0 |
| f | 1 | 1 | 0 | S2 | S3 | 0.5 |

Table 4 contains expected value Yk, which indicates a reproduced signal level in an ideal waveform which contains no noise, because, in PR (1, 2, 1), the reproduced signal level is determined by the 3-bit recording bit sequence. Here, the reproduced signal level of the ideal waveform has been normalized to have a minimum value of −1 and a maximum value of 1.

Here, the decoder 7 in the PRML decoding process calculates the branch metric $(Z_k - Y_k)^2$ of each branch at sample point k, where Zk is the reproduced signal level at sample point k, and Yk is the expected value of the reproduced signal level. That is, the branch metric is the square of a difference between a reproduced signal level and its expected value, and therefore indicates a square error of the reproduced signal level with respect to the expected value.

Further, the branch metric is used to select a branch when two branches merge into one state. Branches that are continuous are called a path, and a sequence of selected branches is called a surviving path.

Here, when the accumulative value of branch metrics with respect to the surviving path in each state at sample point k-1 is mk-1, the accumulative value of branch metrics at sample point k is given by the sum of mk-1 and the branch metric bmk at sample point k. The operations for obtaining the branch metric are carried out by the decoder 7.

As described, since the branch metric indicates a square error, the accumulative value is the sum of errors. Therefore, the branches which are selected are those which would give a smaller value of mk-1+bmk.

For example, the branches which enter the state S0 at sample point k are branch a, which changes from S0 to S0, and branch b, which changes from S3 to S0, as Table 4 indicates. When the accumulative values of the branch metrics of branch a and branch b are m0k-1 and m3k-1, respectively, and when their respective branch metrics are bmak and bmbk, then the accumulative values m0k(a) and m0k(b) of branch metric a and branch metric b at sample point k are given by the following equations (1) and (2), respectively.

$$m0k(a) = m0k\text{-}1 + bmak \quad (1)$$

$$m0k(b) = m3k\text{-}1 + bmak \quad (2)$$

The values of m0k(a) and m0k(b) are compared, and the branch which gives the smaller value is selected.

Here, when the correct state at sample point k is S0, and when the correct transition is a, the equation $$\Delta mk = m0K(b) - m0k(a) \quad (3)$$

is calculated, where Δmk is called a differential metric.

When the correct state at sample point k is S0, and when the correct transition is b, the differential metric Δmk becomes $$\Delta mk = m0k(a) - m0k(b) \quad (4).$$

That is, the differential metric arithmetic circuit 9 subtracts the accumulative value of the branch metric of the correct transition from the accumulative value of the branch metric of the incorrect transition, so as to determine a differential metric, which is a difference of likelihoods.

In the present embodiment, the information of recording data sequence, which is required for the operations in the differential metric arithmetic circuit 9, is supplied to the differential metric arithmetic circuit 9 from the recording data generator 15. The differential metric obtained in the differential metric arithmetic circuit 9 is fed to the comparator A10 and to the comparator B11.

The comparator A10 and the comparator B11 independently compare the differential metric with a predetermined threshold, and when the differential metric is at or below the threshold, outputs a single pulse. That is, the comparator A10 decides whether the differential metric is at or below a threshold SLA at each sample point, i.e., in response to the differential metric, and outputs a single pulse when the differential metric is at or below this threshold SLA. In the same manner, the comparator B11 outputs a single pulse when the differential metric is at or below a threshold SLB.

The comparator A10 and the comparator B11 are respectively connected to a counter A12 and a counter B13, which receive the respective output pulses of the comparator A10 and the comparator B11. That is, the counter A12 counts the output of the comparator A10, and increases its counter value by the increment of 1 in response to every single output pulse of the comparator A10. Similarly, the counter B13 increases its counter value by the increment of 1 in response to every single output pulse of the comparator B11.

In this manner, the samples of differential metrics obtained in the differential metric arithmetic circuit 9, which are at or below the threshold SLA and SLB are accumulated in the counters A12 and A13, respectively. The number of samples accumulated in the counter A12 and the counter B13 are fed to the controller 14.

The signal evaluation device of the present embodiment is adapted so that the number of samples accumulated in the counter A12 or counter B13 is processed by the controller 14 with software. A measurement sequence of the signal evaluation device is described below, referring to the flowchart of FIG. 2.

First, the counter values of the counters A12 and B13 are cleared to 0 prior to the measurement, i.e., before reading out information from a predetermined area of the optical disk 1 and decoding it in the RF circuit 5, the A/D convertor 6, and the decoder 7 (S1). The counter values are cleared to 0 prior to the measurement to ensure that the sample numbers from the comparators A10 and B11 match the counter values of the counters A12 and B13.

Note that, provided that sample numbers are obtained by the measurement, it is not necessarily required to reset the counter values to 0 prior to the measurement as in S1 of the present embodiment. For example, the counter values at the start of the measurement may instead be stored in memory means (not shown) in S1 and compared with the measured counter values after the measurement, so as to obtain sample numbers.

Next, information in a predetermined area of the optical disk 1 is read out by the pick-up 4 to start decoding in the RF circuit 5, the A/D convertor 6, and the decoder 7 (S2). In decoding, as noted above, the reflected light of the optical disk 1 is detected by the detector 4 and fed to the decoder 7 via the A/D convertor 6. The data decoded in the decoder 7 is sent to the error correction circuit 8, and the output of the error correction circuit 8 is fed to the controller 14. The resulting information of the decoding in the decoder 7 is also fed to the differential metric arithmetic circuit 9.

Subsequent to S2, the measured sample number T is compared with a pre-set sample number M, which is a predetermined sample number of the measurement (S3). That is, it is decided whether the measured sample number T obtained by the decoding in S2 has reached the pre-set sample number M, i.e., whether T≧M. If T<M (No in S3), the sequence returns to S2 to repeat decoding. If T≧M (Yes in S3), the decoding is finished (S4).

In this manner, the controller 14 in S3 decides whether the resulting sample number T of the decoding has reached the pre-set sample number M, and the decoding of S2 is repeated until the sample number T reaches the pre-set sample number M.

Thereafter, the controller 14 reads out respective count results NA and NB of the counters A12 and B13 (S5), and divides these count results NA and NB by the product of the measured sample number T and a correction coefficient ko, so as to obtain probability RA of the differential metrics falling at or below the threshold SLA and probability RB of the differential metrics falling at or below the threshold SLB (S6).

The reason the measured sample number T is corrected in S6 by multiplying it with the correction coefficient ko of a suitable value is to calculate the number of samples contained in a distribution with the peak closest to 0, among a plurality of peaks of the differential metric distribution. Without this correction, the count results NA and NB would be divided by the total number of samples which make up the plurality of peaks, and the probability without the correction would become smaller than the actual value to cause an error. However, in the present embodiment, by the correction, it is possible to obtain more accurate values of probability RA, which is the probability of differential metrics not more than the threshold SLA, and of probability RB, which is the probability of differential metrics not more than SLB, compared with the case without the correction.

The correction coefficient ko of a suitable value used in the correction indicates a proportion of sample numbers which are contained in a distribution with the peak closest to 0, with respect to the total number of measured samples. Further, the correction coefficient ko is adjusted to have a suitable value according to the mode of modulation used, since the correction coefficient ko takes different values depending on different modes of modulation.

The following describes probabilities RA and RB. As described above, with a limited run length, the differential metrics show a distribution with a plurality of peaks, as shown in FIG. 3. Here, assuming that the distribution of differential metrics in a domain smaller than μ can be approximated to a normal distribution N (μ, σ²), then RA and RB can be expressed by the following equations (6) and (7)

$$RA = \frac{1}{\sqrt{2\pi} \cdot \sigma} \int_{-\infty}^{SLA} e^{-\frac{(t-\mu)^2}{2\sigma^2}} dt \quad (6)$$

$$RB = \frac{1}{\sqrt{2\pi} \cdot \sigma} \int_{-\infty}^{SLB} e^{-\frac{(t-\mu)^2}{2\sigma^2}} dt \quad (7)$$

The equations have two unknowns $\mu$ and $\sigma$. Thus, these simultaneous equations can be solved for $\mu$ and $\sigma$ to obtain their values (S7).

The estimated value of BER can be determined by calculating the following equation (5) with the substituted values of $\mu$ and $\sigma$ obtained in S7 (S8).

$$BER = \frac{1}{\sqrt{2\pi} \cdot \sigma} \int_{-\infty}^{0} e^{-\frac{(t-\mu)^2}{2\sigma^2}} dt \quad (5)$$

The calculations of S7 and S8 are carried out by the controller 14.

As described above in detail, based on the calculated probabilities of differential metrics at or below the two thresholds, a distribution of differential metrics in a domain smaller than $\mu$ is approximated to a normal distribution N ($\mu$, $\sigma^2$) and mean $\mu$ and standard deviation $\sigma$ of this distribution are determined to calculate BER. Using the BER as an index of signal evaluation, a signal can be evaluated to evaluate a recording medium such as an optical disk, or a recording medium driving device.

The present embodiment described the signal evaluation device which is provided with two comparators and two counters to obtain probabilities of differential metrics at or below two different thresholds. Alternatively, a single comparator of a variable threshold and a single counter may be used to measure the same measurement area twice with different thresholds.

With the use of a single comparator of a variable threshold and a single counter, the device structure can be further simplified because only one comparator and only one counter are required. The tradeoff of this advantage is a longer measurement time, which is incurred by the measurement of the same measurement area twice with different thresholds. Thus, the number of comparators and the number of counters should be suitably chosen, taking into consideration device structure and measurement time.

As described above, a signal evaluation device of the present invention finds probabilities of differential metrics, which are differences of likelihoods, at or below two different thresholds, so as to determine an estimated value of BER based on these probabilities. Thus, counting means of a simple structure, including a comparator or comparators and a counter, together with arithmetic operation means, can be used to realize an evaluation device for evaluating a recording medium or a recording medium driving device.

That is, a signal evaluation device for evaluating a recording medium or a recording medium evaluation device, which is capable of evaluating a plurality of PR modes can be realized with a simple structure, because the device does not need to extract only the sequence that traces paths which form a distribution with the peak closest to 0.

Further, the signal evaluation device of the present invention, which determines probabilities of differential metrics at or below two different thresholds so as to obtain an estimated value of BER, calculates the estimated value of BER by a method which is not dependant on the PR modes. This enables the signal evaluation device of the present invention to evaluate a recording medium or a recording medium driving device in any PR mode. That is, the single signal evaluation device can accommodate a plurality of PR modes for the evaluation.

Note that, a first signal evaluation device, which is a signal evaluation device for a recording medium or a recording medium driving device of maximum likelihood decoding, may be adapted to have an arrangement including: subtracting means for finding a difference of likelihoods; first detecting means for detecting a probability that the difference of likelihoods is at or below a first threshold value; second detecting means for detecting a probability that the difference of likelihoods is at or below a second threshold value; and arithmetic means for performing calculations on the results of detection by the first detecting means and the second detecting means so as to obtain an index of evaluation.

Further, a second signal evaluation device, which is a signal evaluation device for a recording medium or a recording medium driving device of maximum likelihood decoding, may be adapted to have an arrangement including: subtracting means for finding a difference of likelihoods; detecting means for detecting a probability that the difference of likelihoods is at or below a threshold value; and arithmetic means for performing calculations on a first result of detection using a first threshold value and on a second result of detection using a second threshold value so as to obtain an index of evaluation.

Further, the first and second signal evaluation devices may include correction arithmetic means, as the detecting means, for multiplying the measured sample numbers by a correction coefficient, so as to find probabilities based on the corrected values.

[Second Embodiment]

Figure 6:
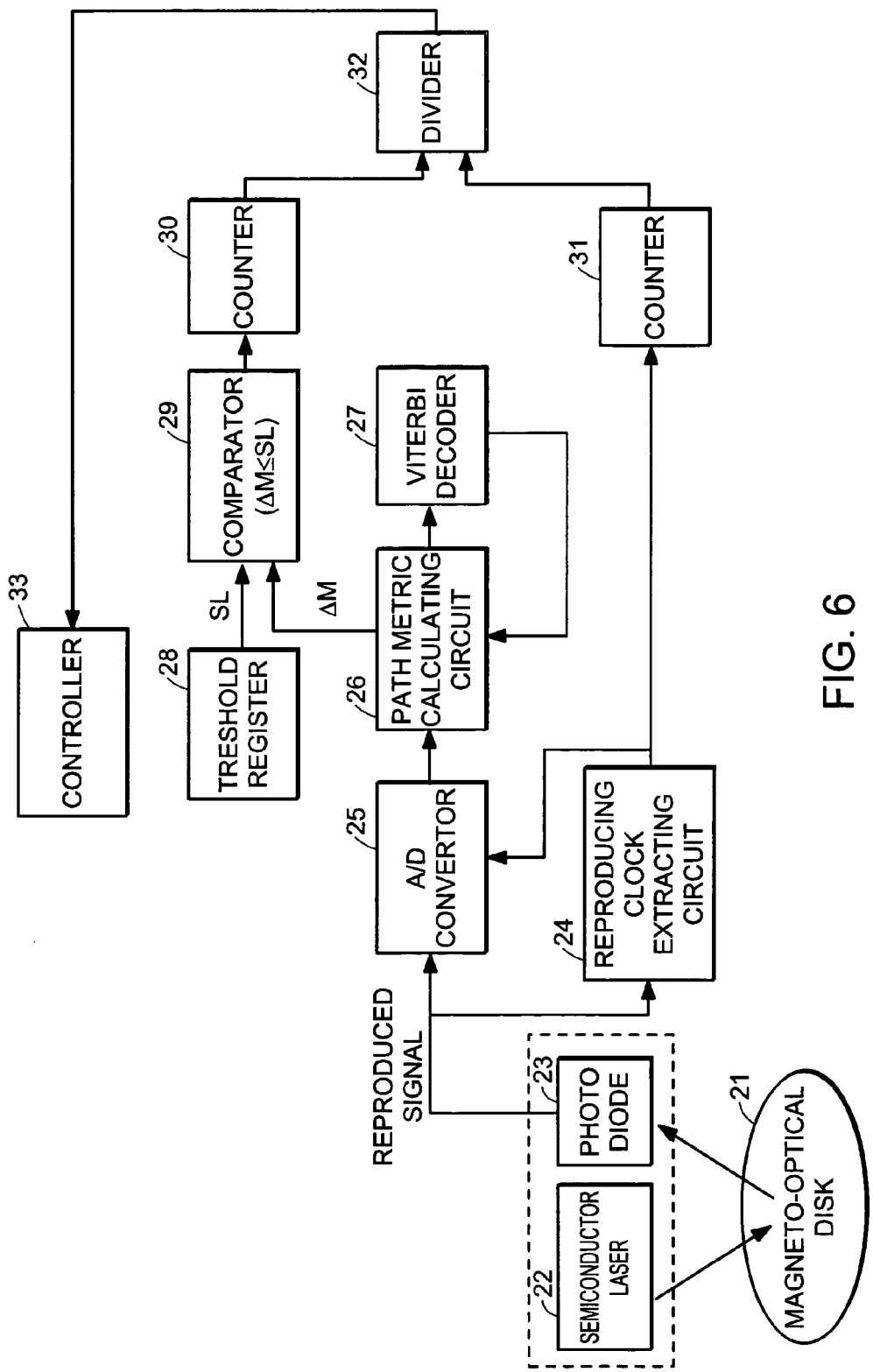
FIG. 6 is a drawing schematically showing a structure of a magneto-optical disk reproducing device according to another embodiment of the present invention.
Figure 7A:
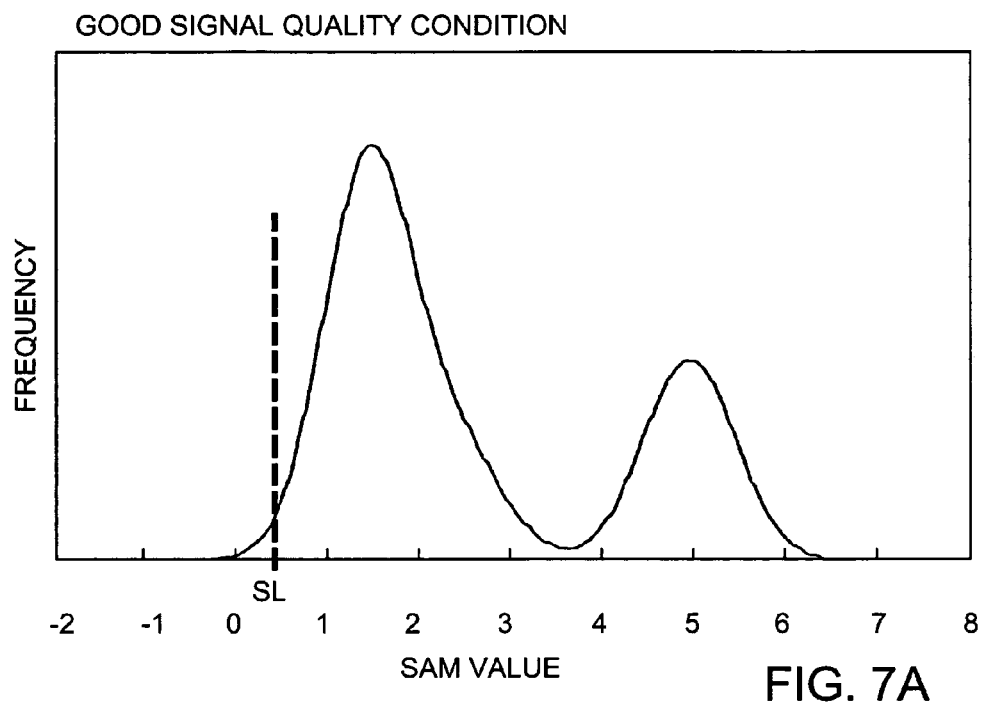
FIG. 7($a$) and FIG. 7($b$) are graphs explaining a relationship between relative frequency of SAM frequency distribution and signal quality.
Figure 7B:
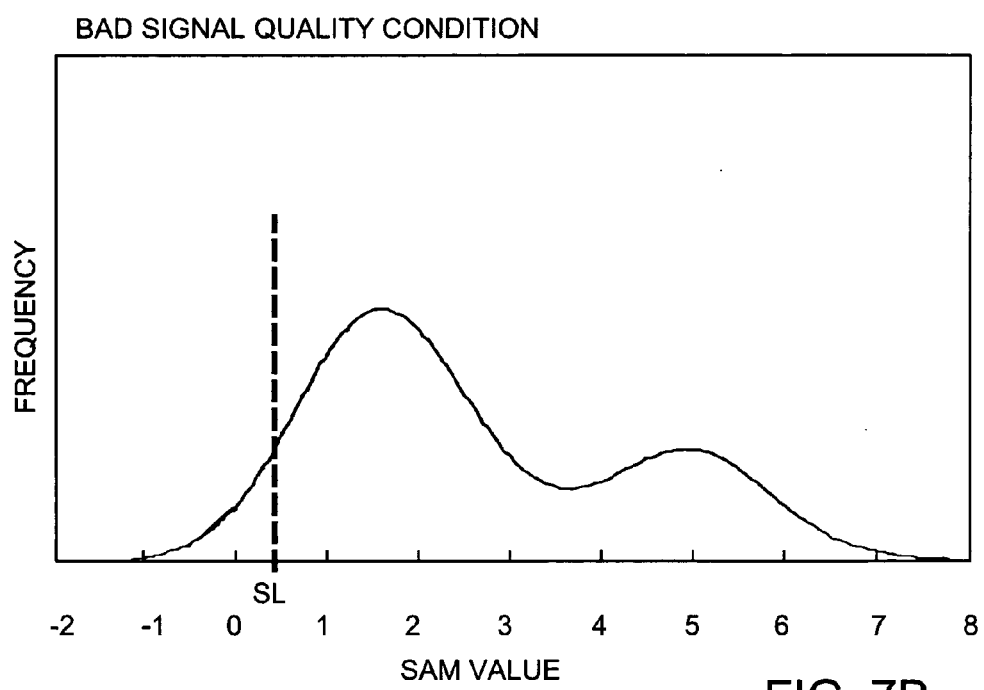

The following will describe another embodiment of the present invention with reference to FIG. 6, and FIG. 7($a$) and FIG. 7($b$).

FIG. 6 shows a structure of a magneto-optical disk reproducing device as one application of the, present invention. As shown in the drawing, the magneto-optical disk reproducing device of the present embodiment includes: a magneto-optical disk (recording medium) 21; a semiconductor laser (reproducing means) 22; a photo diode (reproducing means) 23; a reproducing clock extracting circuit (reproducing means) 24; an A/D convertor (reproducing means) 25; a path metric calculating circuit (path metric difference detecting means) 26; a Viterbi decoder (path metric difference detecting means) 27; a threshold register (path metric difference detecting means) 28; a comparator (relative frequency detecting means) 29; a counter (relative frequency detecting means) 30; a counter (relative frequency detecting means) 31; a divider (relative frequency detecting means) 32; and a controller (signal quality evaluating means, optimum reproducing power deciding means; optimum recording power deciding means) 33.

The semiconductor laser 22, the photo diode 23, the reproducing clock extracting circuit 24, and the A/D convertor 25 serve as reproducing means of the present invention. The path metric calculating circuit 26 and the Viterbi decoder 27 serve as path metric difference detecting means of the present invention. The threshold register 28, the comparator 29, the counter 30, the counter 31, and the divider 32 serve as relative frequency detecting means of the present invention, and the controller 33 serves as signal quality evaluating means of the present invention.

The following explains reproducing operations of the magneto-optical disk reproducing device having the foregoing structure.

First, a light beam from the semiconductor laser 22 is projected on the magneto-optical disk 21. The reflected light is converted to an electrical signal by the photo diode 23 and outputted therefrom as a reproduced signal. The reproduced signal, after converted into digital data by the A/D convertor 25, is fed to the path metric calculating circuit 26.

Note that, the A/D conversion is carried out at the timing of a clock which is extracted from the reproduced signal in the reproducing clock extracting circuit 24 of a PLL (Phase Locked Loop) structure. The path metric calculating circuit 26 performs calculations of path metrics as in the conventional example.

That is, according to the equations (13) through (20) below, the branch metric, which is the square of a difference between the digital data of the incoming reproduced signal and the ideal value of each branch of the trellis, is calculated and accumulated with respect to all branches making up the path.

The branch metrics are calculated from the following equations (13) through (16), and the path metrics are calculated from the following equations (17) through (20), $$Ba[t] = (X[t]+1)^2 \quad (13)$$

$$Bb[t] = Bc[t] = (X[t]+0.5)^2 \quad (14)$$

$$Bd[t] = Be[t] = (X[t]-0.5)^2 \quad (15)$$

$$Bf[t] = (X[t]-1)^2 \quad (16)$$

$$M(00)[t] = \text{Min}\{M(00)[t-1]+Ba[t], M(10)[t-1]+Bb[t]\}(\text{Min}\{m,n\}=m(\text{if } m \leq n); n(\text{if } m>n)) \quad (17)$$

$$M(01)[t] = M(00)[t-1]+Bc[t] \quad (18)$$

$$M(10)[t] = M(11)[t-1]+Bd[t] \quad (19)$$

$$M(11)[t] = \text{Min}\{M(01)[t-1]+Be[t], M(11)[t-1]+Bf[t]\}(\text{Min}\{m,n\}=m(\text{if } m \leq n); n(\text{if } m>n)) \quad (20)$$

where X[t] is the sample level of the reproduced signal waveform at time t, Ba[t], Bb[t], Bc[t], Bd[t], Be[t], Bf[t] are the branch metrics of the branches a, b, c, d, e, f, respectively, at time t, and M(00)[t], M(01)[t], M(10)[t], M(11)[t] are the path metrics of the surviving paths of the states S(00), S(01), S(10), and S(11), respectively, at time t. The process of selecting a smaller path metric of M(00)[t] and M(11)[t] is the selection of a surviving path.

By repeating the process of selecting a surviving path in response to input of a sample value of the reproduced signal waveform, the paths with larger path metrics are successively eliminated before the paths eventually converge into a single path. This path is regarded and used as the correct path to correctly reproduce the original data bit string.

The path metric, which is calculated in response to every input of the digital data of the reproduced signal, is fed to the Viterbi decoder 27. In the Viterbi decoder 27, the path which has produced the smallest path metric is finally chosen as a surviving path and a decoded bit sequence is obtained. The decoded bit sequence is fed to the path metric calculating circuit 26 and referred to therein to find a correct state. Thus, according to the expressions (21) through (24) below, the path metric calculating circuit 26 determines a SAM value, which is a path metric difference ΔM of two paths entering the correct state.

When the correct bit string is . . . 000, $$\Delta M = (M(01)[t-1]+Bb[t]) - (M(00)[t-1]+Ba[t]) > 0 \quad (21)$$

When the correct bit string is . . . 100, $$\Delta M = (M(00)[t-1]+Ba[t]) - (M(01)[t-1]+Bb[t]) > 0 \quad (22)$$

When the correct bit string is . . . 011, $$\Delta M = (M(11)[t-1]+Bf[t]) - (M(01)[t-1]+Be[t]) > 0 \quad (23)$$

When the correct bit string is . . . 111, $$\Delta M = (M(01)[t-1]+Be[t]) - (M(11)[t-1]+Bf[t]) > 0 \quad (24)$$

Also, when the correct bit string is . . . 001 or . . . 110, ΔM is always greater than 0 because the selection of a surviving path never fails in this case.

The processes described thus far are essentially the same as the conventional example. However, the present invention does not require the conventional requirement of calculating SAM values by choosing only the bit patterns with the SAM ideal value of 1.5.

The SAM value which is outputted as a path metric difference ΔM from the path metric calculating circuit 26 is sent to the comparator 29 and compared therein with a predetermined threshold SL stored in the threshold register 28. The comparator 29 outputs a single pulse when ΔM≦SL, i.e., when the SAM value is at or below the predetermined threshold value. The pulse is inputted to the counter 30, and therefore the output of the counter 30 indicates the number of SAM values at or below the predetermined threshold value.

The output clock from the reproducing clock extracting circuit 24 is also inputted to the counter 31. One clock corresponds to 1 bit of the reproduced signal, and accordingly the output of the counter 31 indicates the total number of bits of the reproduced signal. Therefore, the calculation result of the divider 32, i.e., the result of the division of the output of the counter 30 by the output of the counter 31, indicates a relative frequency (a fraction with respect to all frequencies) in a domain of the SAM frequency distribution at or below the predetermined threshold SL. The controller 33, which is realized by a CPU and the like, can evaluate a quality of the reproduced signal based on this relative frequency.

The reason the relative frequency corresponds to a signal quality is described below with reference to FIG. 7(*a*) and FIG. 7(*b*). FIG. 7(*a*) and FIG. 7(*b*) are graphs of SAM frequency distribution which were obtained in the reproducing device with respect to reproduced signals of the same bit number, where the horizontal axis indicates SAM value and the vertical axis indicates frequency. FIG. 7(*a*) indicates a good signal quality condition, and FIG. 7(*b*) indicates a bad signal quality condition.

As is clear from FIG. 7(*a*) and FIG. 7(*b*), when the signal quality is good, i.e., when the noise is small, the spread of the distribution is small and accordingly the relative frequency of the domain at or below the predetermined threshold SL, as indicated by the oblique lines in FIG. 7(*a*), is small. On the other hand, when the signal quality is bad, i.e., when the noise is large, the spread of the distribution is large and accordingly the relative frequency of the domain at or below the predetermined threshold SL, as indicated by the oblique lines in FIG. 7(*b*), is large. That is to say, the relative frequency in a domain at or below the threshold SL indicates the spread of the distribution, i.e., the size of a noise, and therefore the relative frequency corresponds to a signal quality.

Incidentally, in order to accurately determine SAM values, a correct bit string (recorded data pattern) must be known. In the descriptions of the foregoing embodiments, the correct bit string that is required to find SAM values is obtained from the result of Viterbi decoding. However, strictly speaking, the result of Viterbi decoding does not exactly match the correct bit string, because the result of Viterbi decoding contains a decoding error.

The influence of decoding error, however, is only minute because the bit error rate under evaluation is only around 1E–3 at most. Further, the influence on the SAM relative frequency can be eliminated almost completely by suitably setting the threshold for the reasons described below.

When there is a decoding error, the SAM values AM are obtained from the expressions (21) through (24) with the reversed sign. That is, when there is a decoding error, $\Delta M < 0$ and the SAM values are obtained as $-\Delta M$ because the incorrect paths are regarded as the correct paths. (In other words, SAM is always equal to or greater than 0 since the results of decoding are regarded as correct.)

However, under normal conditions, an error occurs when the skirt of the normal distribution with the SAM ideal value 1.5 becomes 0 or smaller. Thus, the absolute value |SAM| does not become too large even when SAM<0. That is, for the majority of the SAM values corresponding to the bit error rate, SAM<predetermined threshold SL, and accordingly the SAM relative frequency, which is the result of integration of the area at or below SL in the SAM frequency distribution, is hardly affected.

That is, the influence is minimal even when SAM relative frequency is calculated using the result of Viterbi decoding. However, when more accurate evaluations are needed or when evaluations involve a significantly poor bit error rate, the SAM values may be calculated by referring to pre-stored data patterns to evaluate a signal quality.

As described above, the foregoing magneto-optical disk reproducing device can calculate SAM values without the conventional complex structure of selecting only those bit patterns whose SAM values take predetermined ideal values. Thus, the magneto-optical disk reproducing device can detect a reproduced signal quality both easily and accurately only with a simple circuit including a comparator and a counter.

Note that, the present embodiment described the case where a reproduced signal quality is detected based on the relative frequency in a domain of a SAM frequency distribution at or below the predetermined threshold SL. However, the present invention is not just limited to this and can also detect a reproduced signal quality, for example, based on the relative frequency in a domain of a SAM frequency distribution between the second threshold SL2 and the threshold SL, inclusive, where the second threshold SL2 is smaller than the threshold SL.

[Third Embodiment]

Figure 8:
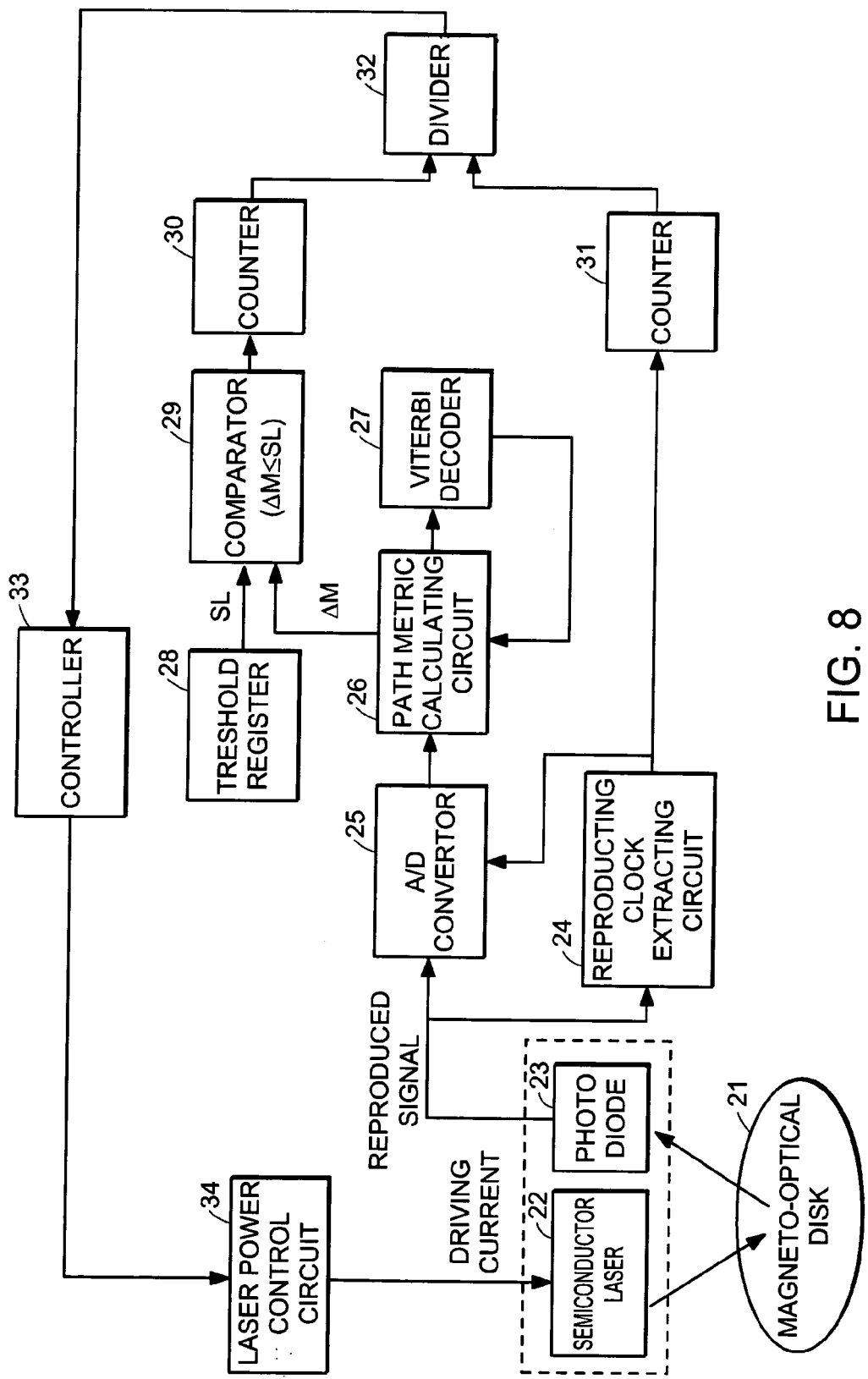
FIG. 8 is a drawing schematically showing a structure of a magneto-optical disk reproducing device according to yet another embodiment of the present invention.
Figure 9:
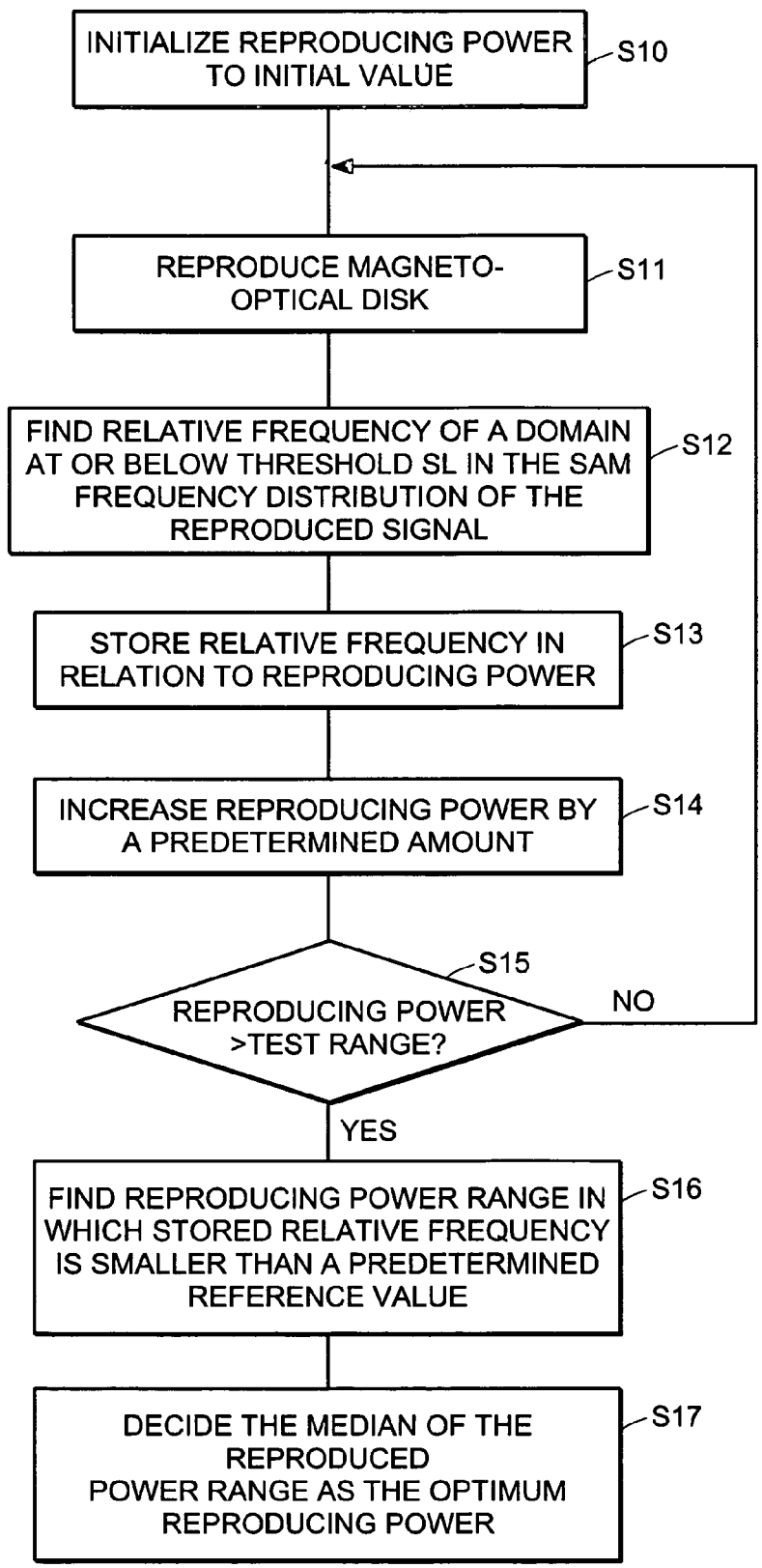
FIG. 9 is a flow chart explaining test read operations of the magneto-optical disk reproducing device of FIG. 8.
Figure 10:
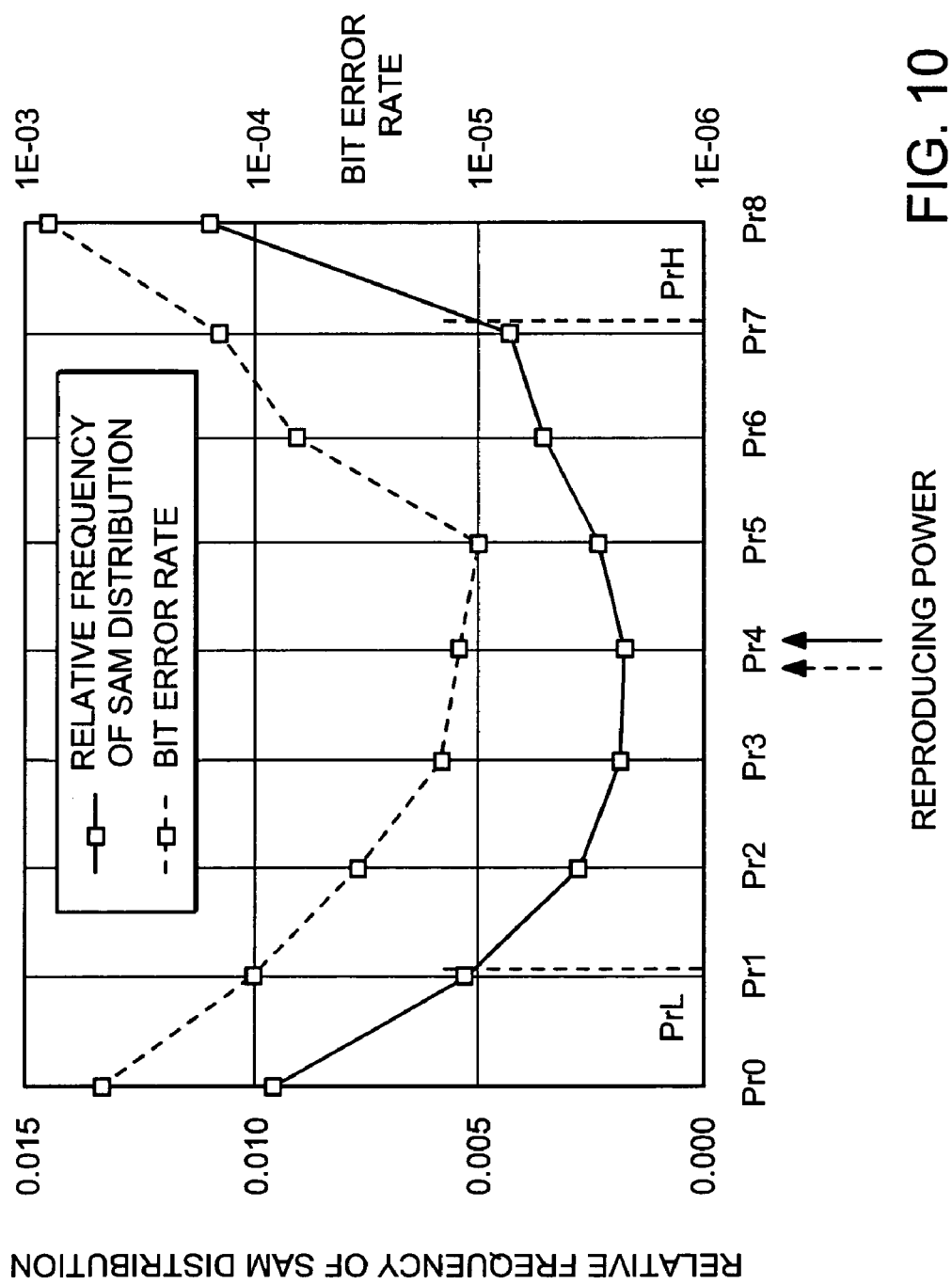
FIG. 10 is an explanatory drawing showing a graph of measurement results of the test read operations of the magneto-optical disk reproducing device of FIG. 8.

The following will describe yet another embodiment of the present invention with reference to FIG. 8 through FIG. 10. Note that, in the present embodiment, constituting elements having the same reference numerals as those already described in the foregoing Second Embodiment are given the same reference numerals and explanations thereof are omitted here.

FIG. 8 shows a structure of a magneto-optical disk reproducing device as one application of the present invention. FIG. 9 is a flow chart which explains test read operations of this reproducing device.

The magneto-optical disk reproducing device of the present embodiment, as with the Second Embodiment, includes: a magneto-optical disk 21; a semiconductor laser 22; a photo diode 23; a reproducing clock extracting circuit 24; an A/D convertor 25; a path metric calculating circuit 26; a Viterbi decoder 27; a threshold register 28; a comparator 29; a counter 30; a counter 31; a divider 32; and a controller 33. The present embodiment further includes a laser power control circuit (reproducing power varying means, recording power varying means) 34 for controlling a driving current of the semiconductor laser 22.

The laser power control circuit 34 serves as reproducing power varying means of the present invention, and the controller 33 serves as optimum reproducing power deciding means of the present invention.

The following explains test read operations of the magneto-optical disk reproducing device having the foregoing structure.

The controller 33 in S10 initializes the driving current of the semiconductor laser 22 to a predetermined initial value via the laser power control circuit 34. The semiconductor laser 22 projects light on the magneto-optical disk 21 at the initialized reproducing power, and the reflected light is read out into digital data through the photo diode 23 and the A/D convertor 25 (S11). The path metric calculating circuit 26 determines a frequency distribution of SAM values, and the divider 32 outputs a relative frequency of a domain at or below a predetermined threshold SL (S12). The foregoing reproducing operations are as already described in the Second Embodiment.

The controller 33 in S10 stores the SAM relative frequency in relation to the reproducing power. In S14, the reproducing power is increased by a predetermined increment, so as to judge whether the reproducing power has exceeded the upper power limit of the test (S15). If No in S15, the sequence of S11 through S14 is repeated.

As a result, a table of SAM relative frequencies with respect to a plurality of reproducing power levels of predetermined steps is prepared and stored. When the reproducing power exceeds the test range in S15, the controller 13 in S16 finds a reproducing power range in which the SAM relative frequency is smaller than a predetermined reference value. Finally, in S17, the median of the reproducing power range is decided as the optimum reproducing power.

FIG. 10 is a graph which shows a result of measurement on SAM relative frequency at each reproducing power according to the foregoing read operations. Here, the threshold SL used to find SAM relative frequency is 0.5, and the test range of reproducing power is stepwise from Pr0 to Pr8. The graph also shows a plot of bit error rate, as indicated by the dotted line, measured at the same reproducing power as the corresponding SAM relative frequency indicated by the solid line. It should be noted here that, in order to reduce measurement error, the measurement result of bit error rate is based on the number of bits which is greater by 10 fold than that used to find the SAM relative frequency.

It can be seen from the result shown in the graph of FIG. 10 that the SAM relative frequency gradually decreases as the reproducing power is increased stepwise from the initial value Pr0, and gradually increases from Pr4. It can also be seen that this change corresponds to the bit error rate. That is, it can be said that the SAM relative frequency represents a signal quality which accurately corresponds to the bit error rate.

Therefore, when the reference value of SAM relative frequency is, for example, 0.005, the reproducing power range under this reference value is from PrL to PrH. The median (PrL+PrH/2) of this range is chosen as the optimum reproducing power (reproducing power shown in solid arrow in FIG. 10). This is extremely close to the central power (reproducing power shown in dotted arrow in FIG. 10) which was obtained with the bit error rate reference value of 1E–4. This makes it possible to prevent the bit error rate from becoming detrimental in response to fluctuations of the optimum reproducing power due to a skew or temperature fluctuations of the disk.

As described, for the evaluation, the foregoing magneto-optical disk reproducing device uses SAM relative frequency, which accurately corresponds to the bit error rate, and therefore requires much less number of measurement bits than the measurement of bit error rate. As a result, optimum reproducing power can be accurately found with a simple circuit structure.

In particular, in test read operations in which the bit error rate is directly evaluated, the measurement would require a number of bits of about one track rotation at each reproducing power. This means that the time required for the test read operations is the product of the number different reproducing power levels of the test range multiplied by the time required for the disk to rotate. On the other hand, in the test read operations using SAM relative frequency, the reproducing power can be varied on a sector basis with respect to a plurality of sectors in a track. This means that the test read operations can be finished in one rotation of the disk, requiring much less time for the evaluation.

Note that, the foregoing described the case where the median of the reproducing power range in which the SAM relative frequency is smaller than the predetermined reference value is chosen as the optimum reproducing power. However, the optimum reproducing power may be simply a reproducing power that gives the smallest SAM relative frequency. For example, in. FIG. 10, Pr4 may be used as the optimum reproducing power.

[Fourth Embodiment]

The following will describe yet another embodiment of the present invention with reference to FIG. 11 through FIG. 16(*f*). Note that, in the present embodiment, constituting elements having the same reference numerals as those already described in the foregoing Second Embodiment are given the same reference numerals and explanations thereof are omitted here.

Figure 11:
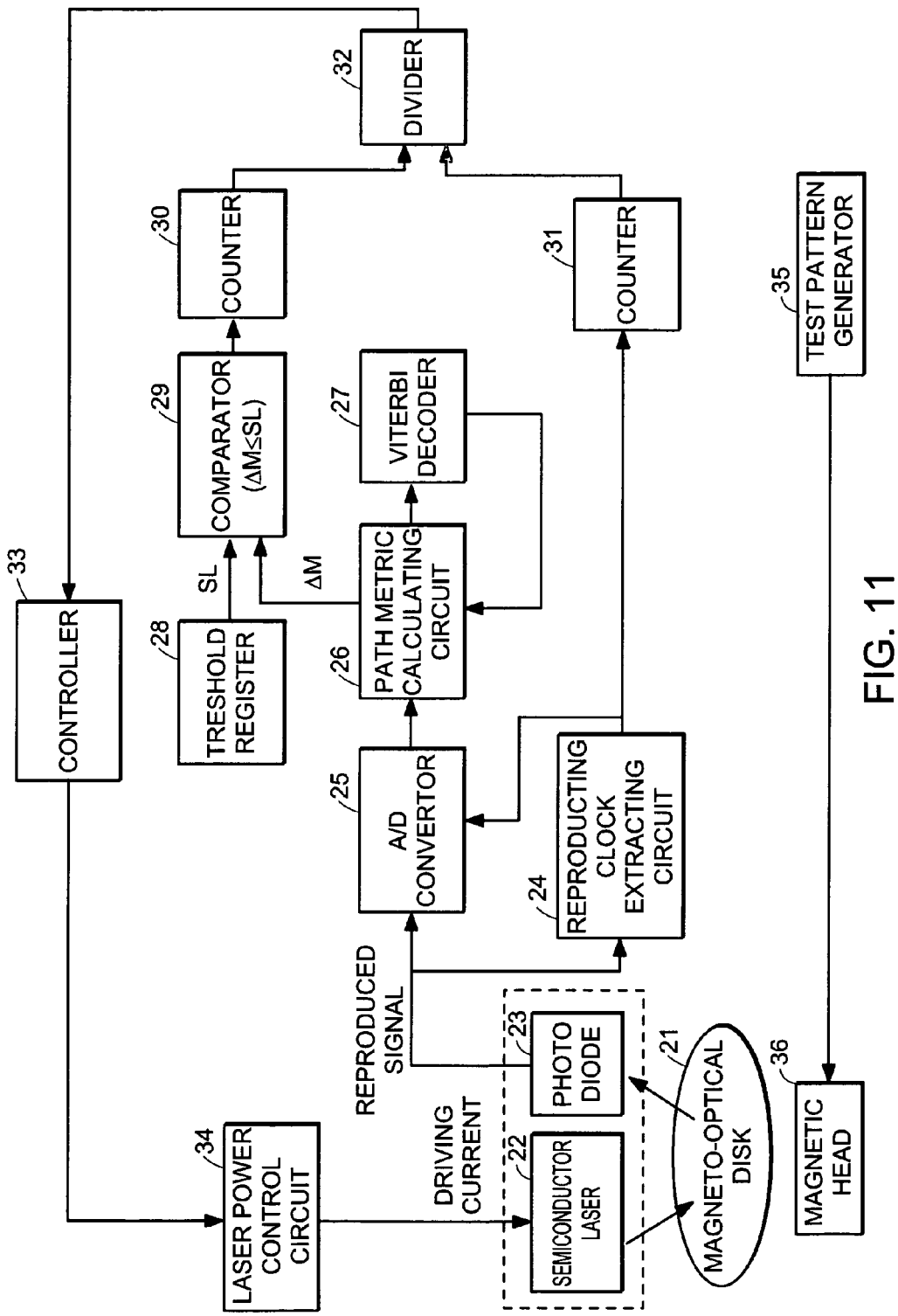
FIG. 11 is a drawing schematically showing a structure of a magneto-optical disk reproducing device according to the Fourth Embodiment of the present invention.
Figure 12:
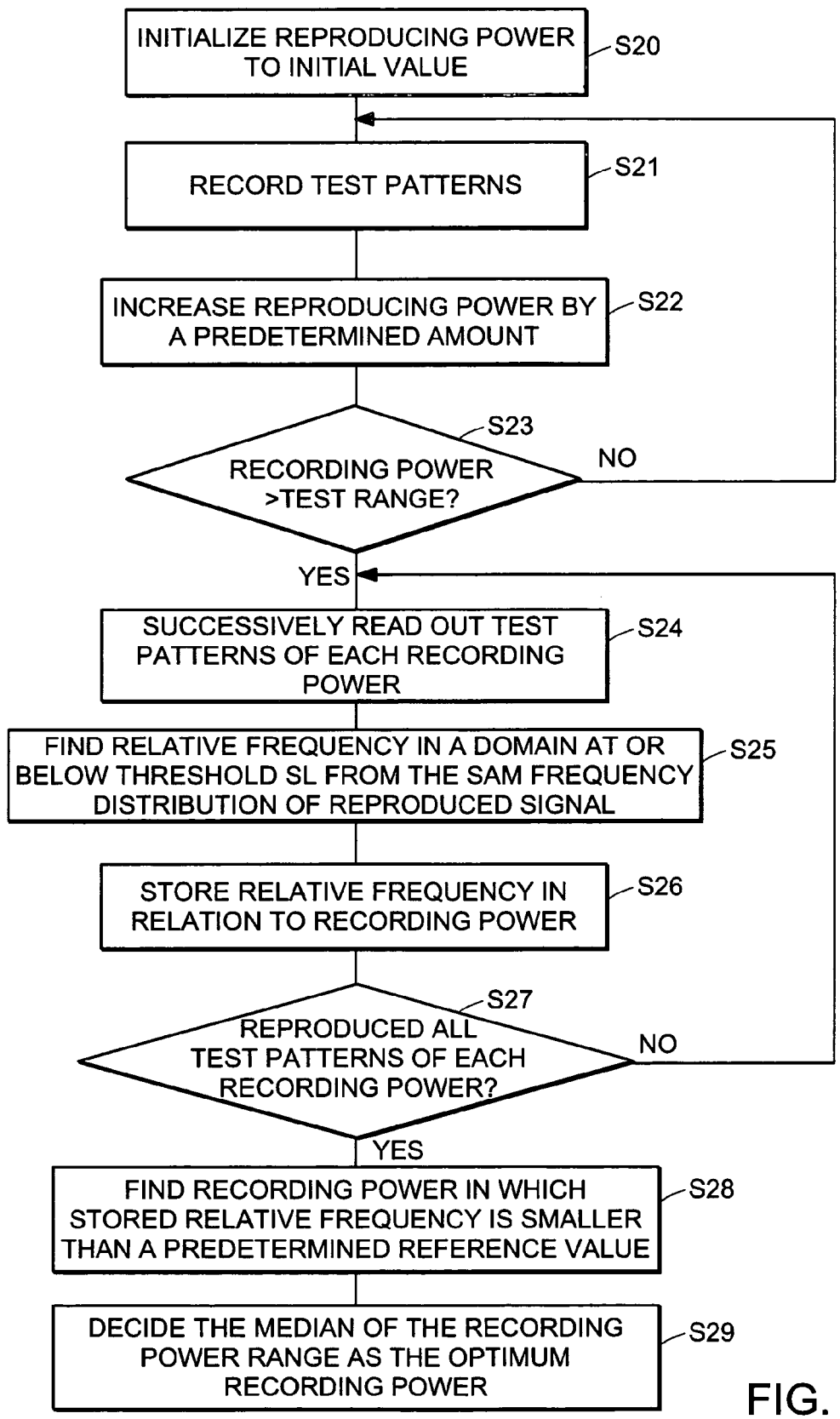
FIG. 12 is a flow chart explaining test write operations of the magneto-optical disk reproducing device of FIG. 11.

FIG. 11 shows a structure of a magneto-optical disk recording and reproducing device as one application of the present invention. FIG. 12 is a flow chart which explains test write operations of this recording and reproducing device.

The magneto-optical disk recording and reproducing device of the present embodiment, as with the Second Embodiment, includes: a magneto-optical disk 21; a semiconductor laser 22; a photo diode 23; a reproducing clock extracting circuit 24; an A/D convertor 25; a path metric calculating circuit 26; a Viterbi decoder 27; a threshold register 28; a comparator 29; a counter 30; a counter 31; a divider 32; and a controller 33. The present embodiment further includes a laser power control circuit 34 for controlling a driving current of the semiconductor laser 22, a test pattern generator (recording means) 35, and a magnetic head (recording means) 36.

The laser power control circuit 34 serves as recording power varying means of the present invention. The test pattern generator 34 and the magnetic head 36 serve as recording means of the present invention. The controller 33 serves as optimum reproducing power deciding means of the present invention.

The following explains test write operations of the magneto-optical disk recording and reproducing device having the foregoing structure.

The controller 33 in S20 initializes the driving current of the semiconductor laser 22 to a predetermined initial value via the laser power control circuit 34. The semiconductor laser 22 projects light on the magneto-optical disk 21 at the initialized recording power, and at the same time the magnetic head 36 is driven by a test pattern outputted from the test pattern generator 35. In response, the test pattern is magneto-optically recorded in the magneto-optical disk 21 (S21).

Here, because the optimum recording power can be found more accurately by taking into consideration the influence of crosswrite or crosstalk from adjacent tracks, it is preferable to record another test pattern on adjacent tracks of the test track in which the test pattern is recorded.

In S22, the recording power is increased by a predetermined increment, so as to judge whether the recording power has exceeded the upper power limit of the test (S23). If No in S23, the sequence of S21 through S22 is repeated. As a result, test patterns of different recording power levels are recorded When the recording power exceeds the test range in S23, the laser power control circuit 34 returns the driving current of the semiconductor laser 22 to a reproducing power of an appropriate level, and the test pattern of each recording power is read out from the magneto-optical disk 21 into digital data via the photo diode 23 and the A/D convertor 25 (S24). In the subsequent step S25, the path metric calculating circuit 26 finds a frequency distribution of SAM values, and the divider 32 outputs the relative frequency of a domain at or below a predetermined threshold SL. This reproducing operation is the same as that described in the Second Embodiment.

The controller 33 in S26 stores the SAM relative frequency in relation to the recording power, and in S27 judges whether the teat patterns of all recording power levels have been reproduced. If there are remaining test patterns, the sequence of S24 through S26 is repeated. As a result, a table of SAM relative frequencies with respect to a plurality of recording power levels of predetermined steps is prepared and stored.

When all the test patterns have been reproduced in S27, the controller 33 in S28 finds a recording power range in which the SAM relative frequency is smaller than a predetermined reference value. Finally, in S29, the median of this recording power range is chosen as the optimum recording power.

Figure 13:
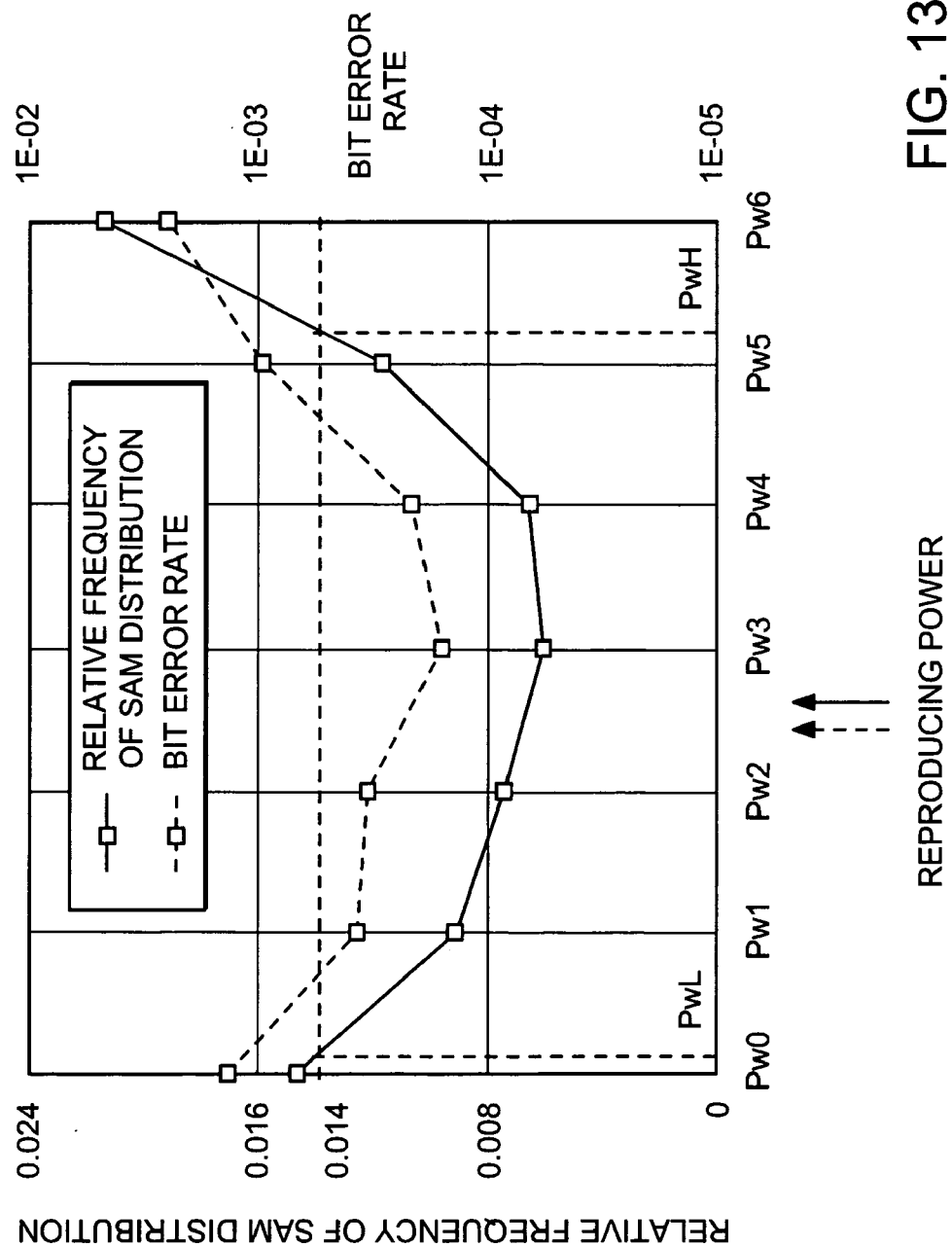
FIG. 13 is an explanatory drawing showing a graph of measurement results of test write operations of the magneto-optical disk reproducing device of FIG. 11.

FIG. 13 is a graph which shows a result of measurement on SAM relative frequency at each recording power according to the foregoing recording operations. Here, the threshold SL used to find SAM relative frequency is 0.5, and the test range of recording power is stepwise from Pw0 to Pw6.

The graph also shows a plot of bit error rate, as indicated by the dotted line, measured at the same recording power as the corresponding SAM relative frequency indicated by the solid line. It should be noted here that, in order to reduce measurement error, the measurement result of bit error rate is based on the number of bits which is greater by 10 fold than that used to find the SAM relative frequency, as in the Third Embodiment.

It can be seen from the result shown in the graph of FIG. 13 that the SAM relative frequency gradually decreases as the recording power is increased stepwise from the initial value, and gradually increases from Pw4. It can also be seen that this change corresponds to the bit error rate. That is, it can be said that the SAM relative frequency represents a signal quality which accurately corresponds to the bit error rate.

Therefore, when the reference value of SAM relative frequency is, for example, 0.014, the reproducing power range under this reference value is from PwL to PwH. The median (PwL+PwH/2) of this range is chosen as the optimum recording power (recording power shown in solid arrow in FIG. 13). This is extremely close to the central power (recording power shown in dotted arrow in FIG. 13) which was obtained with the bit error rate reference value of 1E−3. This makes it possible to prevent the bit error rate from becoming detrimental in response to fluctuations of the optimum recording power due to a skew or temperature fluctuations of the disk.

As described, for the evaluation, the foregoing magneto-optical disk recording and reproducing device uses SAM relative frequency, which accurately corresponds to the bit error rate, and therefore requires much less number of measurement bits than the measurement of the bit error rate. As a result, optimum recording power can be accurately found with a simple circuit structure.

In particular, in test write operations in which the bit error rate is directly evaluated, the measurement would require a number of bits of about one track rotation at each recording power. This means that recording and reproducing must be repeated every time the recording power is varied, which would require four rotations of the disk (three for recording, and one for reproducing), i.e., four times the number of recording power levels. As a result, the test write operations take a remarkably long time.

On the other hand, the test write operations using SAM relative frequency can accurately evaluate a signal quality with less number of measurement bits. For example, the test write operations can be finished in a much shorter period of time when the recording power is varied on a sector basis with respect to a plurality of sectors in one track, because in this case only one round of recording and one round of reproducing, i.e., four rotations will be required.

Note that, the foregoing described the case where the median of the recording power range in which the SAM relative frequency is smaller than the predetermined reference value is chosen as the optimum recording power. However, the optimum recording power may be simply a recording power that gives the smallest SAM relative frequency. For example, in FIG. 13, Pw3 may be used as the optimum recording power.

Further, in the foregoing Second and Third Embodiments, the reproducing power or recording power is optimized based on SAM relative frequency. However, the present invention is not just limited to this and the foregoing effect can also be obtained by additionally optimizing other parameters which might cause deterioration of reproduced signal quality, based on SAM relative frequency.

It is well-known that a reproduced signal quality varies according to a servo offset state, for example, such as tracking servo or focusing servo (Y. Tanaka, Evaluation of a 120 mm sized Magneto-Optical Disk System of over 6 GB Capacity; Japanese Journal of applied Physics, Vol. 37, No. 4B, 1998, pp. 2150–2154) (An Application of Viterbi Decoding to PR (1, 2, 1) Magneto-Optical Recoding Channel, Fujimoto et al.; Proceedings of the 5$^{th}$ Sony Research Forum, 1995, pp. 465–469).

Therefore, by optimizing the servo offset based on SAM relative frequency to improve the reproduced signal quality, the reproduced signal quality can be evaluated more accurately with less number of measurement bits and with a simpler circuit structure. As a result, optimization of the servo offset can be carried out more accurately and in a much shorter period of time.

It is also known that a reproduced signal quality varies according to the equalizing coefficient used for the equalization of waveforms of a reproduced signal. (An Application of Viterbi Decoding to PR (1, 2, 1) Magneto-Optical Recoding Channel, Fujimoto et al.; Proceedings of the 5$^{th}$ Sony Research Forum, 1995, pp. 465–469)

Therefore, by optimizing the equalizing coefficient of waveform equalization based on SAM relative frequency to improve the reproduced signal quality, the reproduced signal quality can be evaluated more accurately with less number of measurement bits and with a simpler circuit structure. As a result, optimization of the equalizing coefficient can be carried out more accurately and in a much shorter period of time.

It is also known that a reproduced signal quality deteriorates by a tilt of the recording medium. (An Application of Viterbi Decoding to PR (1, 2, 1) Magneto-Optical Recoding Channel, Fujimoto et al.; Proceedings of the 5$^{th}$ Sony Research Forum, 1995, pp. 465–469)

Therefore, by correcting a tilt of the recording medium based on SAM relative frequency to improve the reproduced signal quality, the reproduced signal quality can be evaluated more accurately with less number of measurement bits and with a simple circuit structure. As a result, a tilt of the recording medium can be corrected more accurately and in a much shorter period of time.

Note that, the foregoing optimization based on SAM relative frequency according to the present invention is equally effective for other parameters, such as the light pulse waveform control of a light beam, known as write strategy, used in optical disk devices with a phase-change medium, or aligning of various optical components, which might cause deterioration of a reproduced signal quality.

The following considers the predetermined reference values used in the Second and Third Embodiments.

Figure 20A:
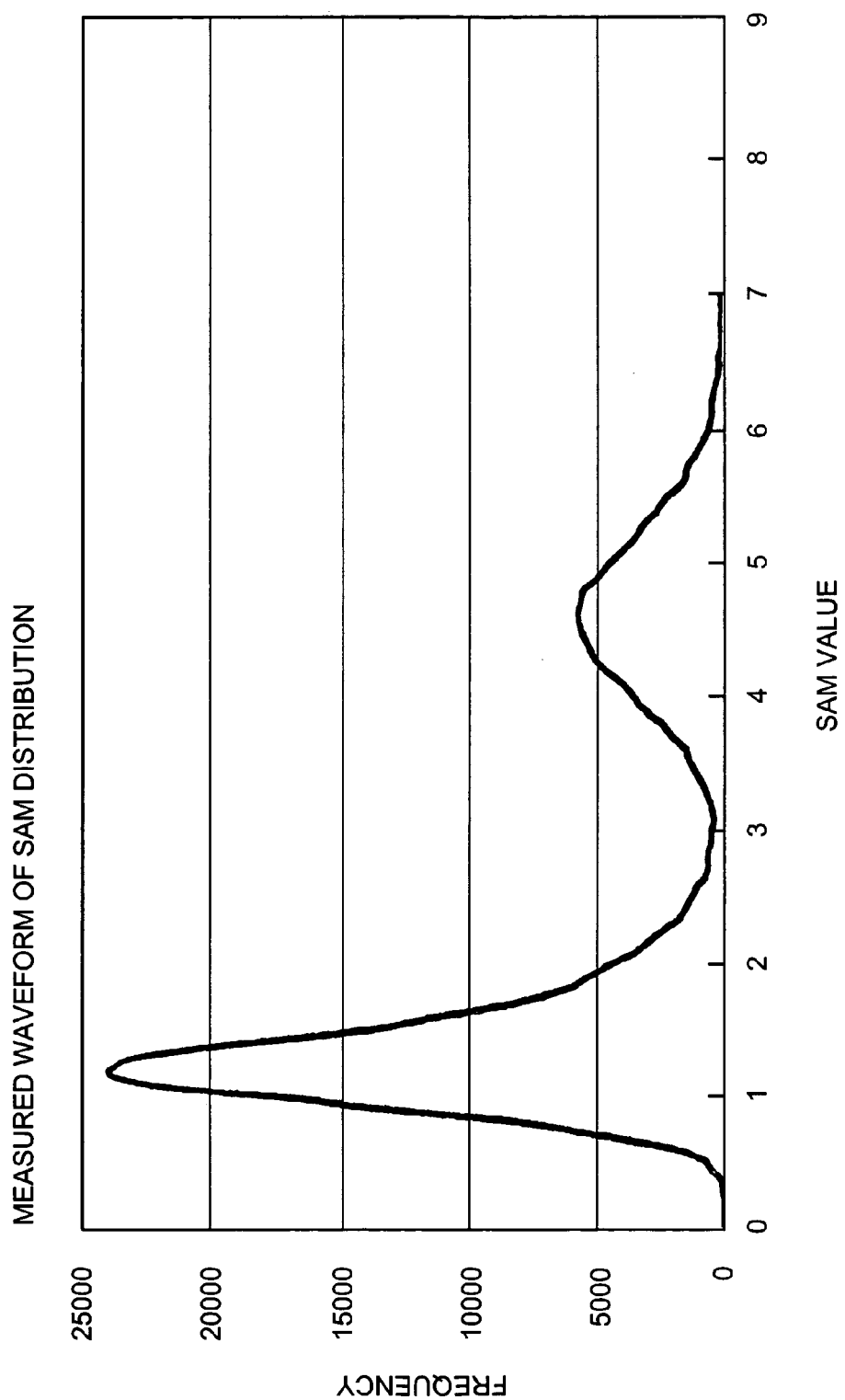
FIG. 20($a$) and FIG. 20($b$) are graphs of SAM frequency distribution of a measured waveform and an ideal waveform, respectively.

As explained in connection with the prior art with reference to FIG. 20(a) and FIG. 20(b), the frequency distribution of SAM values has a distribution pattern with a combination of different distributions because a plurality of SAM ideal values are found with variations by the influence of a noise. Each distribution can be approximated to a normal distribution if the noise is a white noise or close to a white noise. Therefore, a portion of the SAM distribution smaller than the minimum SAM ideal value of 1.5 can be nearly approximated to a normal distribution with the mode μ close to 1.5.

Here, the standard deviation σ, which indicates a variance of the approximated normal distribution, corresponds one to one to the bit error rate, which relationship is represented by the following equation (25)

$$BER = K \times \frac{1}{\sqrt{2\pi}\,\sigma} \int_{-\infty}^{0} \exp\{-(x-\mu)^2/2\sigma^2\}dx \qquad (25)$$

Figure 14:
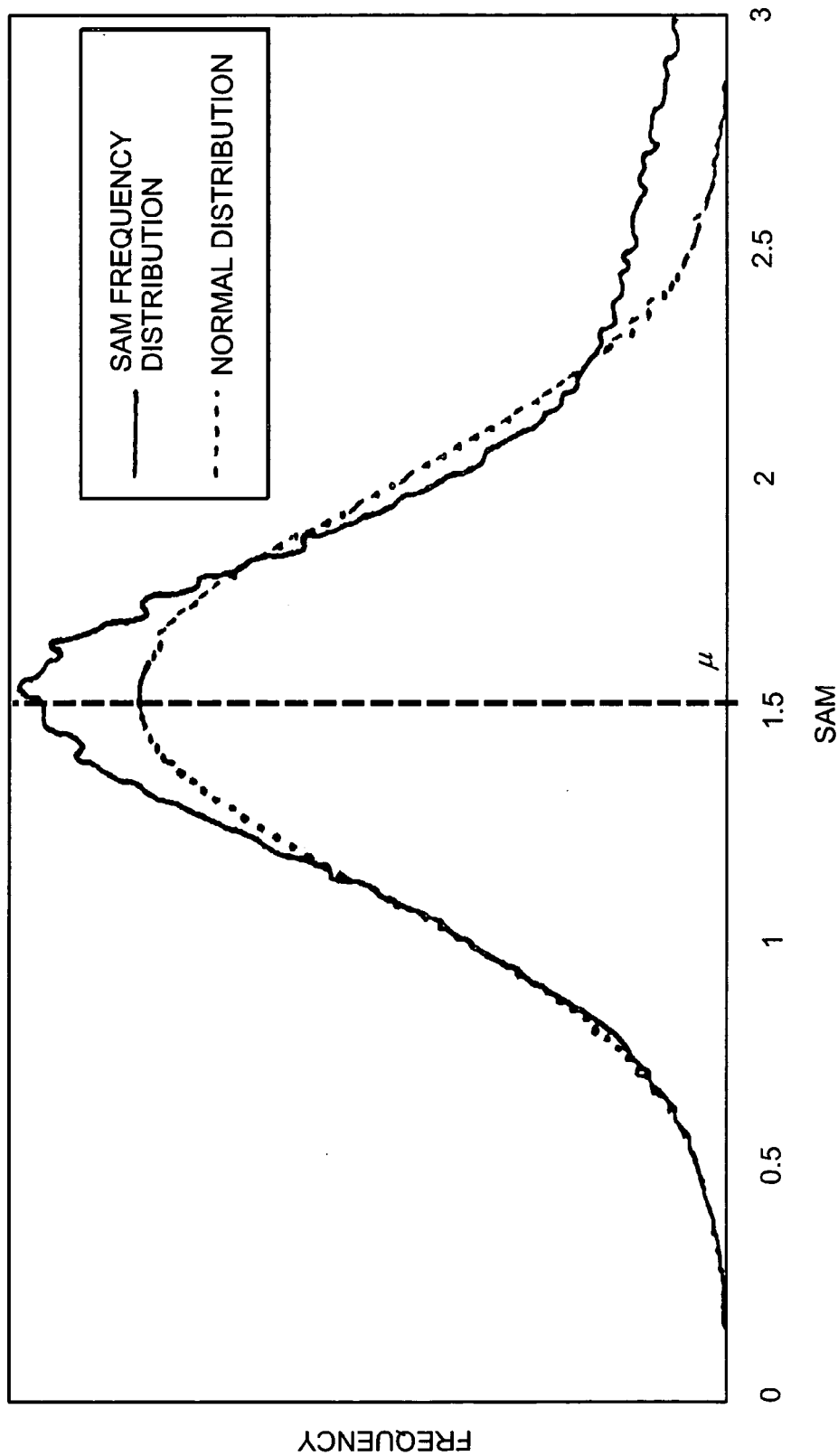
FIG. 14 is a graph showing measurement results of a SAM frequency distribution, superimposed on a normal distribution corresponding to the bit error rate.
Figure 15A:
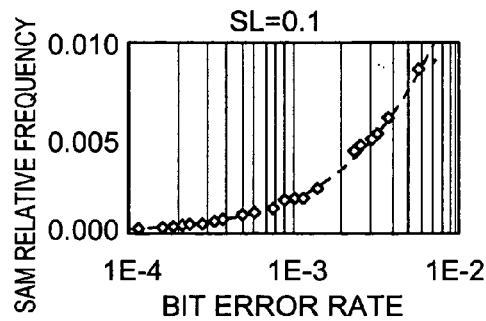
FIG. 15($a$) through FIG. 15($f$) are explanatory drawings showing a graph of measurement results vs. theoretical calculation results in a relationship of SAM relative frequency and bit error rate.
Figure 15B:
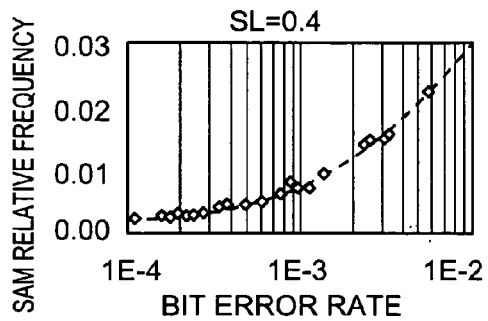
Figure 15C:
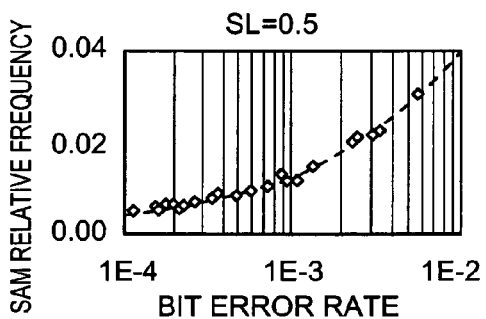
Figure 15D:
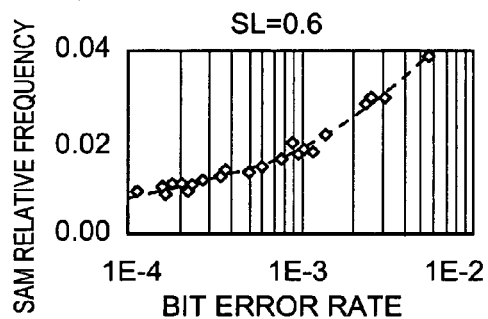
Figure 15E:
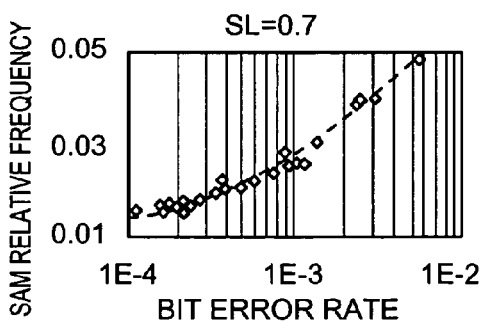
Figure 15F:
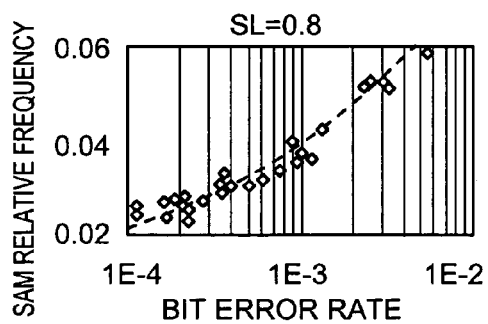
Figure 16A:
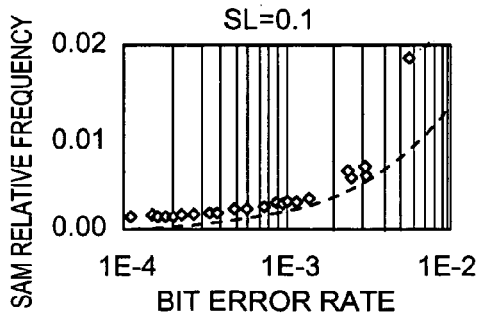
FIG. 16($a$) through FIG. 16($f$) are explanatory drawings showing a graph of measurement results vs. theoretical calculation results in a relationship of SAM relative frequency and bit error rate, when there is a defect.
Figure 16B:
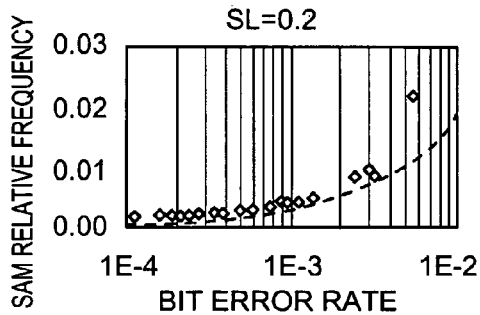
Figure 16C:
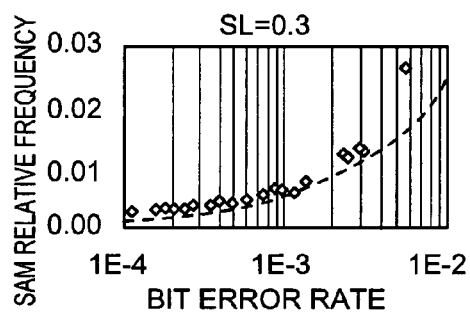
Figure 16D:
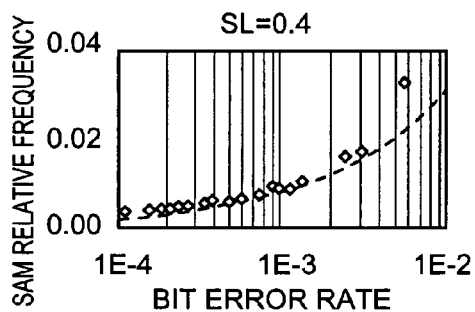
Figure 16E:
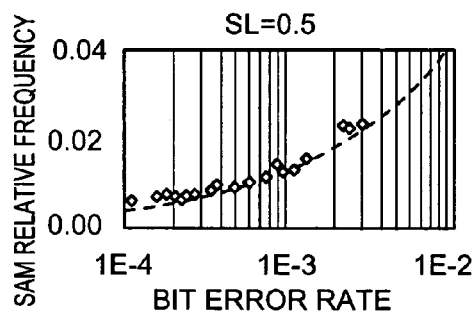
Figure 16F:
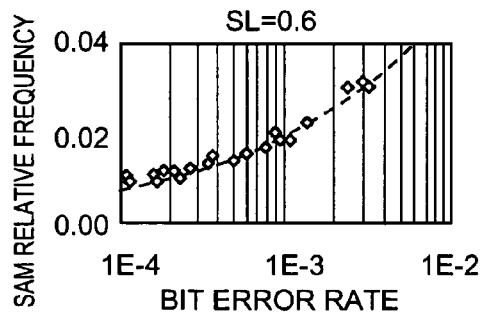

FIG. 14 is a graph of a frequency distribution of actual SAM values measured from an actual optical disk reproducing device (shown in solid line), superimposed on a normal distribution with the standard deviation σ corresponding to the bit error rate (shown in dotted line).

The last part on the right-hand-side of equation (25) is known in statistics as a distribution function which is determined by integrating a probability density function of a normal distribution, and it indicates the relative frequency in a domain not more than 0 in a normal distribution with the mode μ and standard deviation σ.

Further, since the error bit occurs when SAM<0 in principle, it can be said that the bit error rate is equal to a proportion of the domain not more than 0 with respect to all frequencies of the frequency distribution of SAM values. Therefore, the relative frequency in the domain not more than 0 in the normal distribution, multiplied by constant K of modulus transformation, coincides with the bit error rate. More specifically, constant K is obtained from $$K=n/N$$

where N is the total frequencies of the frequency distribution of SAM values, and n is the number of patterns which give the smallest SAM ideal value, i.e., the SAM ideal value of 1.5 (a distribution which is created only with the SAM values of such patterns is approximated to a normal distribution with the mode of about 1.5).

Note that, when the mode of modulation has a code with a limited run length d=1, for example, such as (1, 7) RLL, the patterns which would give the SAM ideal value of 1.5 can be specified by probing all paths and finding therefrom patterns which would give the numerical value of 1.5 for the square of Euclid distance between a correct path and an incorrect path.

Specifically, there are four such patterns: "00111"; "00011"; "11000"; and "11100". Thus, when the code has a limited run length d=1, a specific value of constant K can be accurately obtained by finding the probability of occurrence of the four patterns from the modulated patterns of random data, or by directly detecting the probability of occurrence of the four patterns from the bit string decoded by the reproducing device.

The foregoing effect can also be obtained by a method other than finding the number n of patterns with the SAM ideal value of 1.5. In this case, there is provided another means for detecting a frequency which falls in a domain of not more than mode μ in the SAM frequency distribution, and the numerical value two times this frequency is used as n to find constant K. This is possible because the domain of the SAM frequency distribution not more than mode μ can be approximated to a normal distribution with the mode of about 1.5, and therefore the frequency in this domain multiplied by two substantially coincides with the frequency n of the normal distribution.

In this way, constant K can be accurately obtained with a simple structure without involving the complex procedure of detecting the occurrence of the four patterns based on the decoded bit string, even when the data patterns used to find SAM are not random patterns but unique patterns, i.e., when the occurrence of the four patterns determined from the random patterns is widely different from the actual occurrence.

The standard deviation σ determined from equation (25) is equivalent to the bit error rate. Therefore, this standard deviation σ can be used in the equation (12) below to find the relative frequency in the domain at or below the arbitrary threshold SL in the SAM frequency distribution, with respect to a reproduced signal of a quality equivalent to the bit error rate of concern.

$$(n/N) \times \int_{-\infty}^{SL} \frac{\exp\{-(x-\mu)^2/2\sigma^2\}}{\sqrt{2\pi}\,\sigma} dx \qquad (12)$$

For example, when the bit error rate of the reproducing device cannot exceed 1E-4 due to its error correction capability, the optimum reproducing power or optimum recording power determined by the test read operations or test write operations is preferably obtained as the median of the power range with the bit error rate of not more than 1E-4. Thus, the test read operations and test write operations can be carried out with high reliability when the corresponding SAM relative frequency is determined from equations (25) and (12) with the bit error rate BER=1E-4, and using this SAM relative frequency as a reference value to obtain the power ranges of the Second Embodiment and the Third Embodiment.

The following considers the predetermined thresholds SL used in the Second and Third Embodiments.

The foregoing description is based on the assumption that the distribution of the domain at or below the minimum value 1.5 of the SAM ideal values can be nearly approximated to a normal distribution with the mode μ close to 1.5.

However, as FIG. 14 indicates, while this assumption is valid in a domain close to 0, the approximation starts to fail as the SAM value becomes larger from 0 and approaches the distribution of the SAM ideal value=2.5. This means that the error in the calculations of SAM relative frequency in equations (25) and (12) becomes larger when the predetermined threshold SL exceeds a certain value.

FIG. 15(a) through FIG. 15(f) are graphs based on the measurement result of FIG. 13, showing relationships between SAM relative frequency (vertical axis) and bit error rate (horizontal axis) when the threshold SL is varied. In the graphs, the bit error rate is plotted against each value of the SAM relative frequency which was measured at various recording power levels. Further, indicated by the dotted lines is a theoretical relationship between the SAM relative frequency which is determined from equations (25) and (12), and the bit error rate.

It can be seen from the graphs that the measurement results exactly coincide with the calculation results when the threshold SL is close to 0, but an error is incurred between these two results as the threshold SL is increased. The error, which is small when SL≦0.6, becomes larger when SL≧0.7. Thus, the error can be suppressed by setting the threshold SL to 0.6 or less.

While this is true, a threshold SL that is too small results in a deficient number of SAM values in the domain of not more than the threshold SL in the SAM frequency distribution. As a result, the influence of defect becomes more prominent, as it is for the bit error rate.

FIG. 16(a) through FIG. 16(f) are graphs which show relationships between SAM relative frequency and bit error rate in the presence of a defect which makes up about 0.1 percent of the total number of bits. FIG. 16(a) through FIG. 16(f) have the same meaning as FIG. 15(a) through FIG. 15(f) and use the same measurement results as those used in FIG. 15(a) through FIG. 15(f). It can be seen from the graphs of FIG. 16(a) through FIG. 16(f) that the error between the measurement results and the calculation results becomes larger as the threshold SL approaches 0.

Generally, the bit error rate of the reproducing device cannot exceed 1E-3 at most due to its error correction capability, and accordingly the reference value of a reproduced signal quality used in the test read operations or test write operations is also at or below 1E-3. It is therefore required at least in this range that the error in the relationship of SAM relative frequency and bit error rate is suppressed at low level.

As can be seen from FIG. 16(a) through FIG. 16(f), the error with the bit error rate of 1E-3 or less is small when SL≧0.4 but starts to increase as the threshold SL approaches and becomes smaller than 0.3. Thus, the influence of defect can be suppressed with a threshold SL of 0.4 or greater.

According to this assessment, a preferable range of threshold SL is $0.4 \leq SL \leq 0.6$. It should be noted here that the values in this range are applicable only under normalized conditions in which ideal sample levels of PR (1, 2, 1) characteristics are normalized to −1, −0.5, 0, +0.5, +1 in the calculations of SAM values.

When impulse response (a, 2a, a) is used to specify PR characteristics, the ideal sample levels generally becomes 0, a, 2a, 3a, 4a. In this case, the value which corresponds to the SAM ideal value of 1.5 is obtained by calculating the square of Euclid distance of ideal waveforms of pattern 00011" and pattern 00111".

The ideal waveform of pattern "00011" is (0, a, 3a), and the ideal waveform of pattern "00111" is (a, 3a, 4a). Hence, the Euclid distance becomes $$(a-0)^2+(3a-a)^2+(4a-3a)^2=6a^2.$$

This can be used for the conversion of threshold SL. For example, SL=0.4 is converted as follows: $6a^2 \times (0.4/1.5)= 1.6a^2$, and SL=0.6 is converted as follows: $6a^2 \times (0.6/1.5)= 2.4a^2$. That is, with the range $1.6a^2 \leq SL \leq 2.4a^2$, the error due to a deviation of the SAM frequency distribution from the normal distribution can be suppressed at the same time as the influence of defect, thereby realizing accurate test read operations and accurate test write operations.

[Fifth Embodiment]

Figure 17:
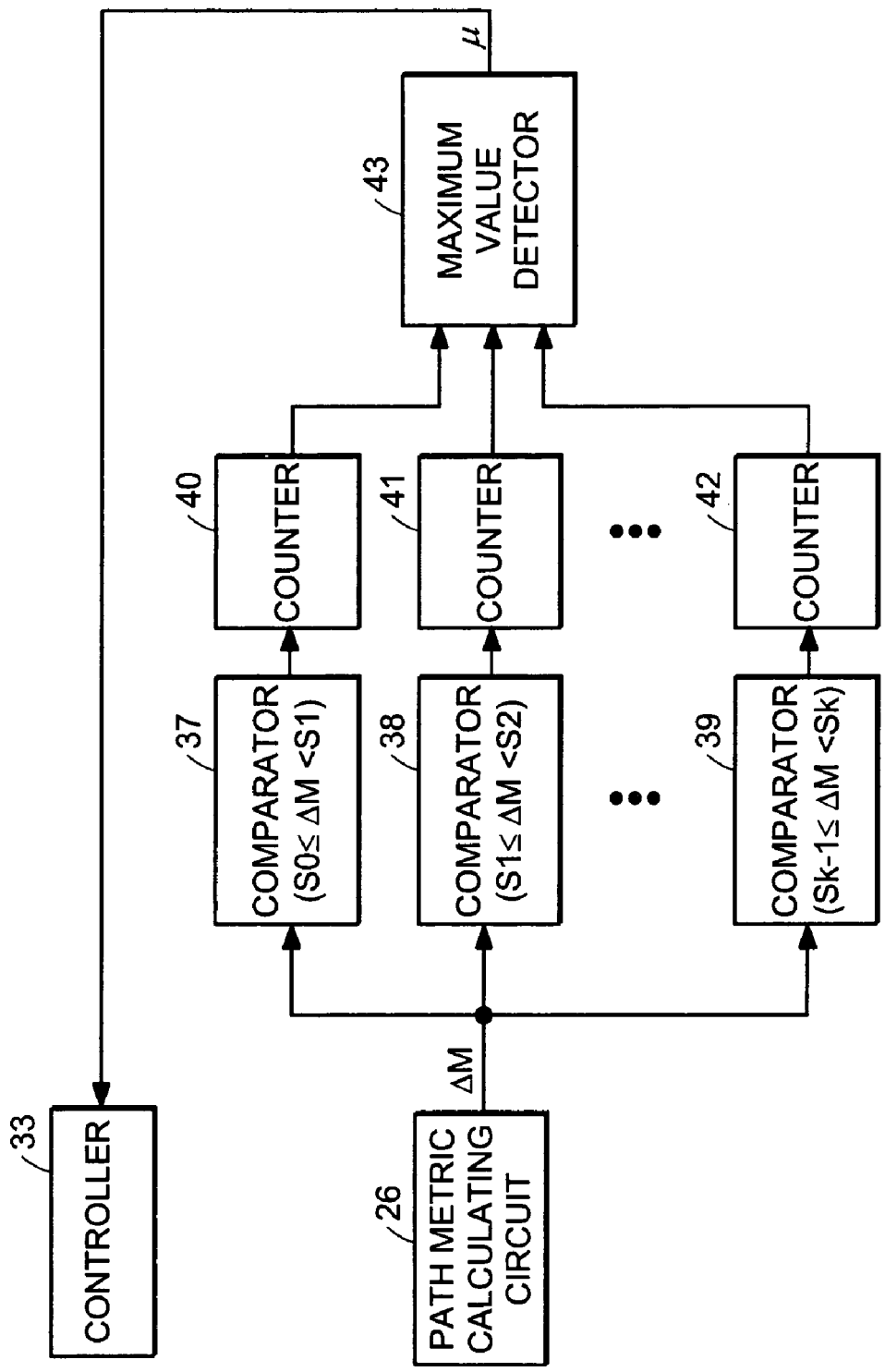
FIG. 17 is a drawing showing a structure of a magneto-optical disk reproducing device according to the Fifth Embodiment of the present invention.
Figure 18:
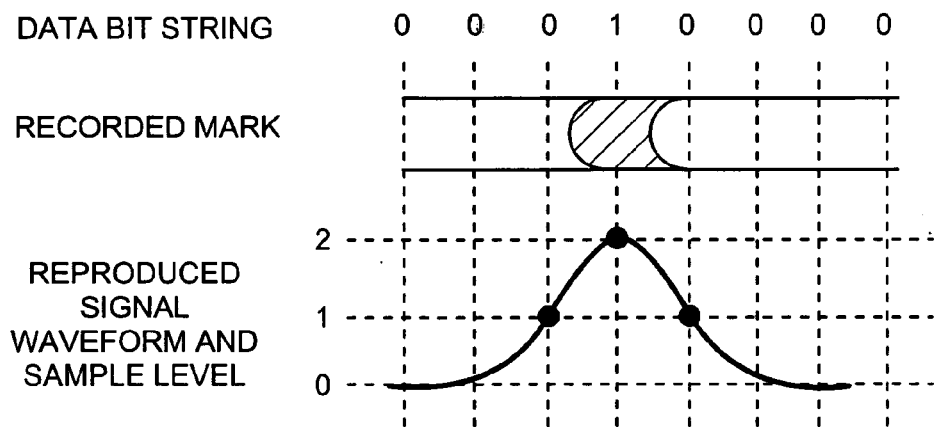
FIG. 18 is a diagram showing a reproduced signal waveform according to PR (1, 2, 1) characteristics.
Figure 19:
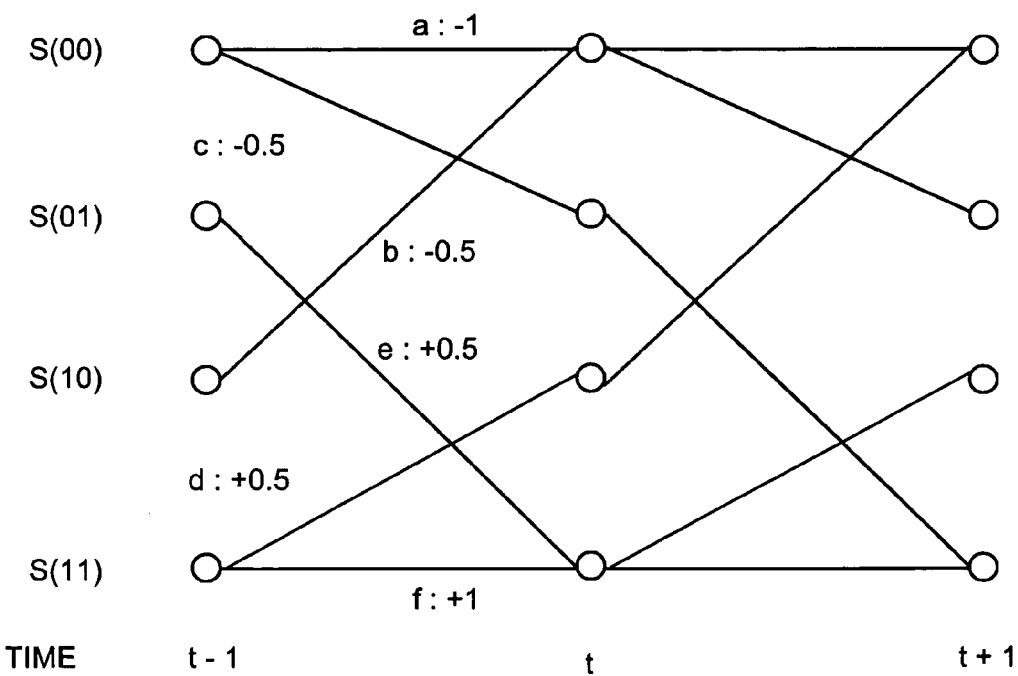
FIG. 19 is a diagram showing a trellis.

The following will describe yet another embodiment with reference to FIG. 17.

The calculations of the foregoing equations with the fixed value μ=1.5 do not posed any problem because the mode μ coincides with the SAM ideal value when the noise is a white noise. In actual practice, however, the mode fluctuates by the influence of a colored noise. The reproducing device of the Second Embodiment is therefore provided with an additional structure which directly detects the mode of the SAM frequency distribution within the device. The mode detected in this way can be used in equations (25) and (12) to more accurately find the reference value. FIG. 17 shows the structure.

In FIG. 17, the path metric calculating circuit 26 and the controller 33 are as already described in the Second Embodiment. The other structure as already described in the Second Embodiment is not shown. The present embodiment is further provided with: a plurality of comparators, including a comparator (mode detecting means) 37 for detecting a range of not less than S0 and less than S1; a comparator (mode detecting means) 38 for detecting a range of not less than S0 and less than S1; and up to a comparator (mode detecting means) 39 for detecting a range of not less than Sk-1 and less than Sk; a plurality of counters, including a counter (mode detecting means) 40, a counter (mode detecting means) 41, and up to a counter (mode detecting means) 42; and a maximum value detector (mode detecting means) 43. These members all serve as mode detecting means of the present invention. Note that, S0, S1, . . . , Sk are a numerical sequence of equal interval.

Reproducing a magneto-optical disk 1 (not shown, see FIG. 6) in the reproducing device initiates the path metric calculating circuit 26 to calculate and output a path metric difference ΔM according to the procedure as already described in the Second Embodiment. The path metric difference ΔM is simultaneously inputted to the comparator 37, the comparator 38, . . . , and the comparator 39 to decide whether ΔM falls in which range of the comparators.

The counter in receipt of the output of the comparator which has ΔM within its range is incremented. For example, when S1≦ΔM<S2, the counter 41, in receipt of the output of the comparator 38, is incremented. By repeating this procedure, the number of ΔM in each range of the SAM frequency distribution is successively counted.

When the calculation of path metric difference ΔM is finished with respect to all measurement bits under observation, the maximum value detector 43 selects the maximum value from the outputs of the counter 20, the counter 21, . . . , and the counter 22, and outputs the median of the corresponding range as the mode μ.

For example, when the output of the counter 21 has the maximum value, μ=(S1+S2)/2. The controller 33 performs calculations based on equations (14) and (15) using the input mode μ, so as to obtain the reference value of the SAM relative frequency.

The reference value of the SAM relative frequency is decided in this manner based on the mode which is detected in real time. This makes it possible to always find a more accurate reference value according to a noise-dependent-change of mode.

Note that, the foregoing description of the present embodiment is based on the (1, 7) RLL code with a limited run length d=1. However, the present invention is not limited in any ways by this example.

Further, the foregoing described the magneto-optical disk reproducing device as an example of the reproducing device. However, the present invention is not just limited to this and is equally effective in all kinds of devices which reproduce signals according to the PRML method. That is, the present invention is applicable to a wide variety of devices such as optical disk devices with a phase-change medium, magnetic recording devices, and communication data receiving devices.

[Sixth Embodiment]

Figure 21:
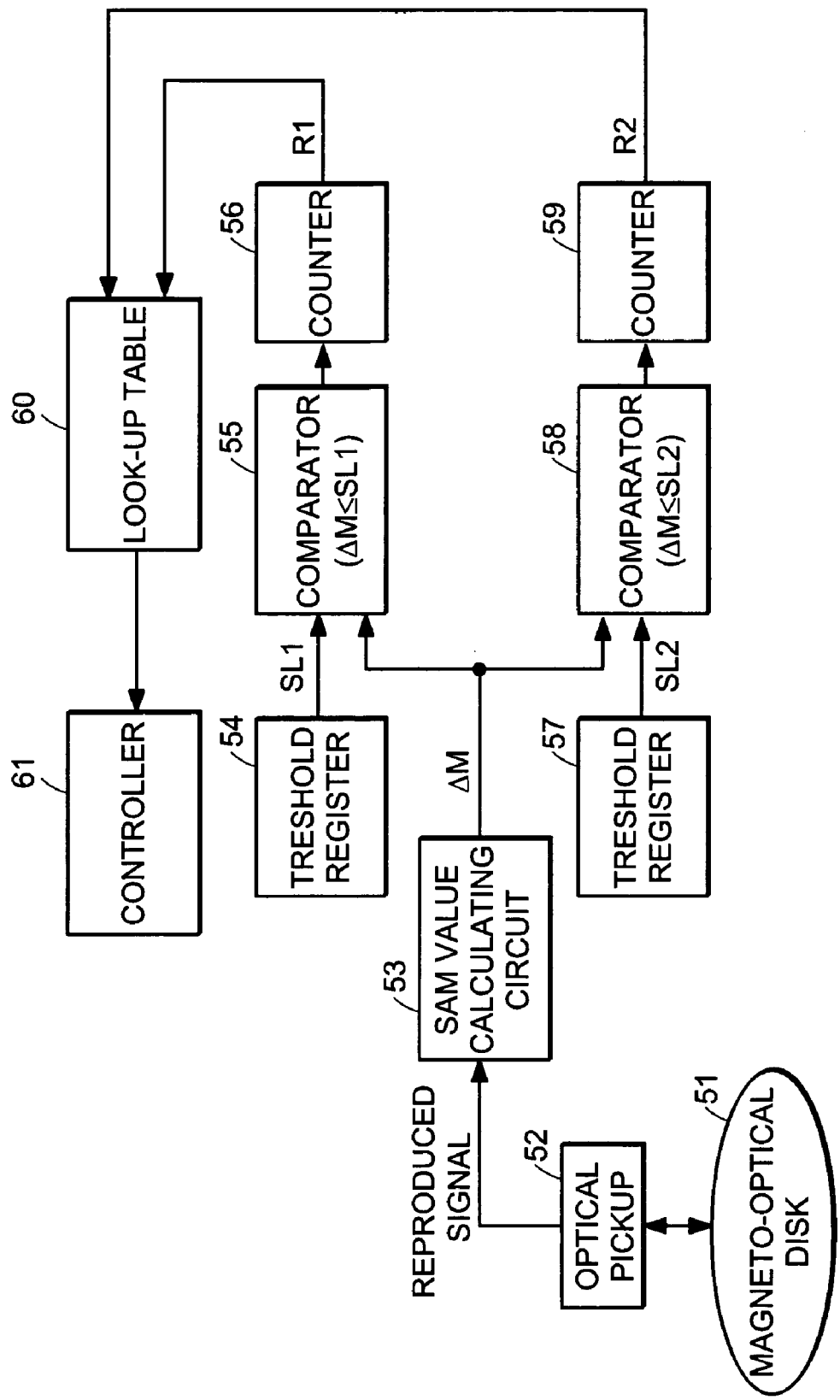
FIG. 21 is a drawing showing a structure of a magneto-optical disk reproducing device using a signal evaluation device and a signal evaluation method according to the First Embodiment of the present invention.

FIG. 21 shows a structure of a magneto-optical disk reproducing device using a signal evaluation device and a signal evaluation method according to yet another embodiment of the present invention.

As shown in FIG. 21, the magneto-optical disk reproducing device includes: a magneto-optical disk 51 as a recording medium; an optical pick up 52 as reproducing means; a SAM calculating circuit 53 as path metric difference detecting means; threshold registers 54 and 57; comparators 55 and 58; counters 56 and 59; a look-up table 60; and a controller 61. The threshold register 54, the comparator 55, and the counter 56 make up first relative frequency detecting means. The second threshold register 57, the comparator 58, and the counter 59 make up second relative frequency detecting means. The look-up table 60 and the controller 61 make up signal evaluation means.

The following described reproducing operations of the magneto-optical disk reproducing device having the foregoing structure.

First, the optical pick up 52 projects a light beam on the magneto-optical disk 51. The reflected light returns to the optical pick up 52 and is converted therein into an electrical signal which is outputted as a reproduced signal. The reproduced signal is fed to the SAM calculating circuit 53 and the SAM calculating circuit 53 calculates a path metric difference. That is, a path metric difference is determined from the expressions (13) through (16), and (17) through (20).

The path metric difference, i.e., SAM value ΔM, outputted from the SAM calculating circuit 53 is fed to the comparator 55 and compared therein with a predetermined threshold SL1 stored in the threshold register 54. The comparator 55 outputs one pulse when $\Delta M \leq SL1$, i.e., when the SAM value is at or below the threshold SL1. The output pulse is inputted to the counter 56, and therefore the output R1 of the counter 56 indicates the number of SAM values at or below the threshold SL1 (first relative frequency). Assuming that the total number of bits used to calculate SAM values is fixed, it can be said that the number R1 of SAM values is equivalent to relative frequency R1' (proportion with respect to all frequencies) of a frequency distribution of the SAM values.

The SAM value $\Delta M$ is also fed to the comparator 58 and compared therein with a predetermined threshold SL2 stored in the threshold register 57 (SL2<SL1). As with the counter 58, the counter 59 outputs the number R2 (second relative frequency) of SAM values, which is equivalent to relative frequency R2' of the frequency distribution of the SAM values in a domain at or below the threshold SL2. These values of R1 and R2 of the SAM values are used by the controller 61 which evaluates a quality of the reproduced signal referring to the look-up table 60.

FIG. 22 is a drawing which diagrammatically shows an example of the look-up table 60 realized by a semiconductor memory. Referring to FIG. 22, the following explains specifically how the controller 61 evaluates a quality of a reproduced signal referring to the look-up table 60.

As shown in FIG. 22, the look-up table 60 of FIG. 21 is a table with 14 rows and 14 columns, where the rows represent the number R1 of SAM values, and the columns represent the number R2 of SAM values. The total number of bits are 50000 bits, so that $$R1 = 50000 \times R1'$$

$$R2 = 50000 \times R2'$$

Further, the thresholds SL1 and SL2 are $$SL1 = 0.6$$

$$SL2 = 0.4.$$

The bit error rate BER which has been calculated beforehand from equations (34) through (36) based on R1 and R2 of SAM values is stored and registered for each combination of R1 and R2 in the table. Note that, it is to be understood that the bit error rate BER shown in "E–n" in FIG. 22 (where n=1, 2, 3, . . . ) means "$\times 10^{-n}$". (The same is true for FIG. 23, FIG. 24, FIG. 26(*a*) and FIG. 26(*b*))

The controller 11, upon input of R1 and R2 of SAM values, searches for a row and a column closest to the input values of R1 and R2, and reads out the corresponding bit error rate BER registered in the table. In this way, the controller 11 can find the bit error rate without numerous calculations. For example, when the input values of R1 and R2 of SAM values are 500 and 200, respectively, the bit error rate is easily found to be $1.7 \times 10^{-4}$ (1.7E–4 in FIG. 22), which is the registered value corresponding to (504, 206).

The following explains in detail how the look-up table 60 is prepared. First, an assumed range of signal evaluation values and an assumed range of mode $\mu$ of the frequency distribution of SAM values are decided. For example, in an application for test read operations in which an optimum value of reproducing laser power is found, signal evaluation values in a range of around $1 \times 10^{-4}$ to $1 \times 10^{-3}$ need to be accurately calculated with an assumed reference bit error rate BER of $5 \times 10^{-4}$. Further, given the mode 1.5 in the presence of a white noise in the reproduced signal, the range of mode $\mu$ is found to be 1.3 to 1.7 when fluctuations due to a colored noise is assumed to be ±0.2. In principle, the larger the bit error rate BER, the larger the values of R1 and R2 of SAM values. Also, the larger the mode $\mu$, the smaller the values of R1 and R2 of SAM values. Therefore, the respective minimum values of R1 and R2 of SAM values can be calculated from equations (35) and (36) by substituting $$BER = 1 \times 10^{-4}, \text{ and } \mu = 1.7.$$

The results of calculation show that R1 of SAM values is 233, and R2 of SAM values is 75. Similarly, the respective maximum values of R1 and R2 of SAM values can be calculated from equations (35) and (36) by substituting $$BER = 1 \times 10^{-3}, \text{ and } \mu = 1.3.$$

The results of calculation show that R1 of SAM values is 1241, and R2 of SAM values is 501. It follows from these results that the ranges of the look-up table 60 are R1: 233 to 1241

R2: 75 to 501.

When the table size is 14×14, the bit error rate BER is calculated in advance from equations (34) through (36) for each value of R1 and R2 respectively divided into 14 steps of equal width, and the results of calculation are registered in the memory.

In this manner, first by deciding an assumed range of signal evaluation values and an assumed range of mode, and then creating a look-up table with the corresponding limited ranges of relative frequencies, the look-up table can be installed with the minimum required memory capacity.

Note that, the table size is 14×14 only for convenience of explanation. The bit error rate BER can be determined more accurately with a larger table size, because a larger table size allows R1 and R2 of SAM values to be divided at smaller intervals. In actual applications, a larger table is used according to the acceptable memory capacity of the system.

Further, the blank cells of the look-up table with no registered value indicate impossible combinations where $R1 \leq R2$.

As described so far, the foregoing magneto-optical disk reproducing device does not require the conventionally required numerous calculations using equations (34) through (36), and therefore is capable of evaluating a reproduced signal quality easily and in a shorter period of time.

In the foregoing description of the present embodiment, the assumed ranges of R1 and R2 of SAM values, respectively labeled by the rows and columns of the look-up table 60, are divided at equal intervals. However, this is associated with the following problem. FIG. 23 only shows a required portion of the look-up table 60 of FIG. 22; the evaluation range of bit error rate BER from $1 \times 10^{-4}$ to $1 \times 10^{-3}$. As can be seen FIG. 23, while the rate of change of bit error rate BER between adjacent cells is small when R1 and R2 of SAM values are large, the rate becomes too large when R1 and R2 of SAM values are small. This large rate may cause an excessively large rounding error.

This problem can be solved by exponentially changing the intervals of R1 and R2 of SAM values, so that the intervals become smaller with smaller values of R1 and R2 of SAM values, and become larger with larger values of R1 and R2 of SAM values. For example, FIG. 24 diagrammatically shows contents of a look-up table which was created by dividing R1 and R2 of SAM values respectively into 14 steps according to equations (37) and (38) with respect to i (i=1–14).

$$R1[i]=203\times\exp(i/7.7) \tag{37}$$

$$R2[i]=64\times\exp(i/6.8) \tag{38}$$

It can be seen from FIG. 24 that the bit error rate BER changes at substantially equal intervals. As a result, the rounding error of bit error rate BER can be made smaller.

Note that, in the foregoing description of the present embodiment, the registered values of the look-up table 60 are the bit error rates BER themselves. However, considering that the look-up table 60 is realized by a semiconductor memory and in view of the table size and data operability, the registered values are preferably integers that can be expressed in one byte.

This can be achieved by multiplying an assumed range of bit error rate with a predetermined modulus, so that the range is confined within 0 to 255. For example, in the foregoing magneto-optical disk reproducing device with the assumed bit error rate range of $1\times10^{-4}$ to $1\times10^{-3}$, the range of registered values becomes 25 to 250 and it can be confined within one byte when the predetermined modulus is 250000. FIG. 25 diagrammatically shows contents of such a look-up table 60.

[Seventh Embodiment]

Referring to FIG. 24, FIG. 26(a) and FIG. 26(b), and FIG. 27, the following describes another magneto-optical disk reproducing device using a signal evaluation device and a signal evaluation method according to still another embodiment of the present invention. Note that, the magneto-optical disk reproducing device of the present invention has the same structure, except for the contents of the look-up table 60, as the magneto-optical disk reproducing device shown in FIG. 21 of the Sixth Embodiment. Accordingly, further explanations thereof are omitted here and FIG. 21 will be referred to where appropriate.

FIG. 24 shows contents of the look-up table 60 (FIG. 21) which was created by exponentially changing R1 and R2 of SAM values, as described above. In the table, the effective range of bit error rate BER takes the form of a parallelogram, and therefore the effective data volume is much less than the actual data volume which is expected for the table size of 14×14=196. This is because the look-up table 60 is realized by a table of a matrix form in which R1 and R2 of SAM values are labeled by the rows and columns of the table.

FIG. 26(a) and FIG. 26(b) show an alternate form of look-up table 60, in which two tables combine to make up the look-up table 60. FIG. 26(a) is a table in which R2 values of SAM values corresponding to the effective range of bit error rate BER are registered in array form with respect to each value of R1 of SAM values. For example, referring to FIG. 24, the R2 values of SAM values corresponding to the effective range of bit error rate BER $1\times10^{-4}$ to $1\times10^{-3}$ with respect to R1=300 are 99, 115, 134, 155. An array of these four numbers is created for R1=300. Table A of FIG. 26(a) is prepared in this manner by creating an array for each R1 value of assumed 14 different SAM values.

FIG. 26(b) is a table which registers values of bit error rate BER determined from the registered R2 values in Table A with respect to R1 of each SAM value. For example, with respect to R1=300, four bit error rates BER $$1.4\times10^{-4},\ 2.4\times10^{-4},\ 4.1\times10^{-4},\ 6.9\times10^{-4}$$

are determined from 99, 115, 134, 155, respectively, which are registered for the array of R1=300 in Table A. An array of these bit error rates BER is created for R1=300. Table B of FIG. 26(b) is prepared in this manner by creating an array for each R1 value of assumed 14 different SAM values.

Figure 27:
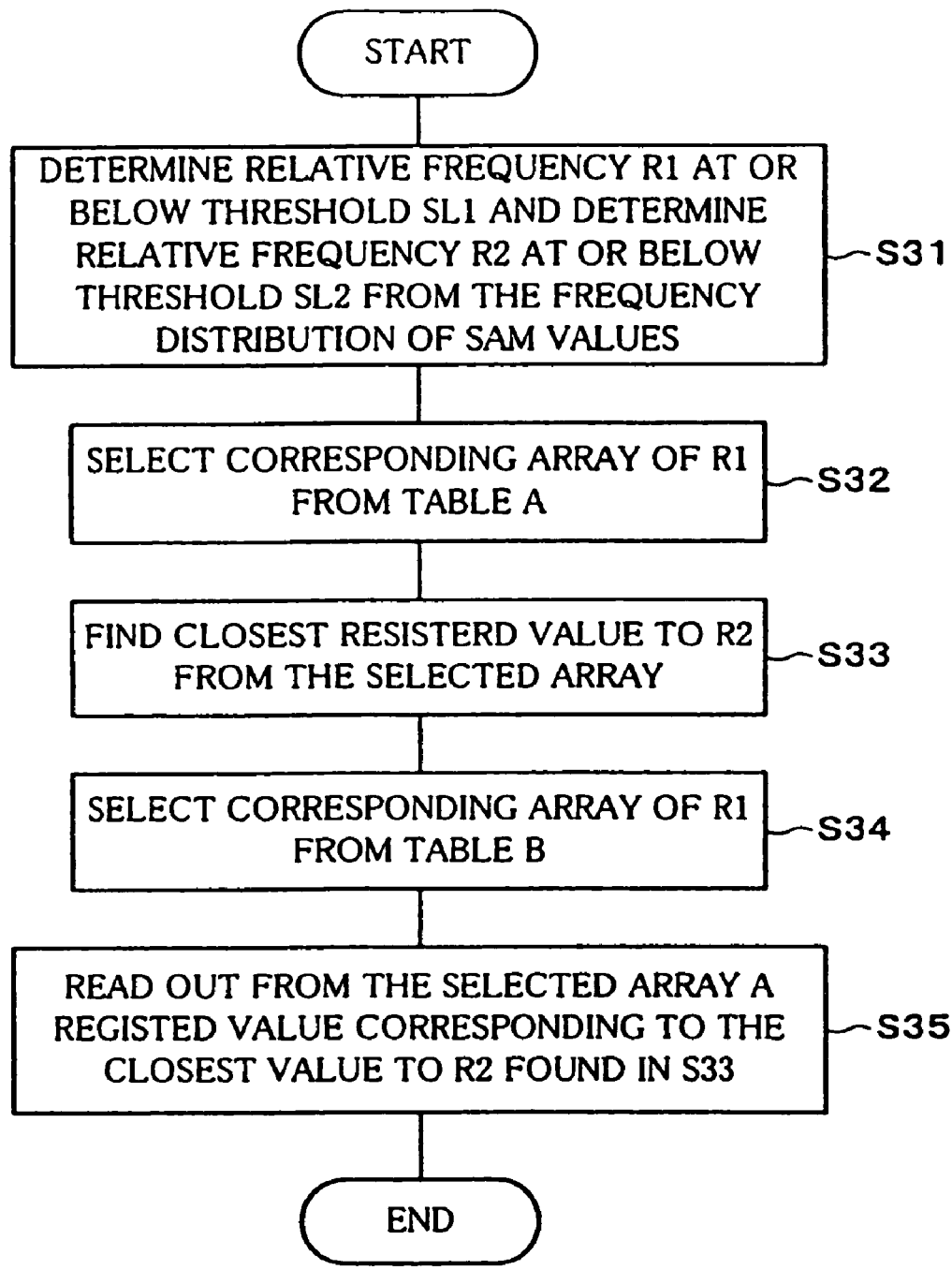
FIG. 27 is a flow chart showing operations of the magneto-optical disk reproducing device.
Figure 28:
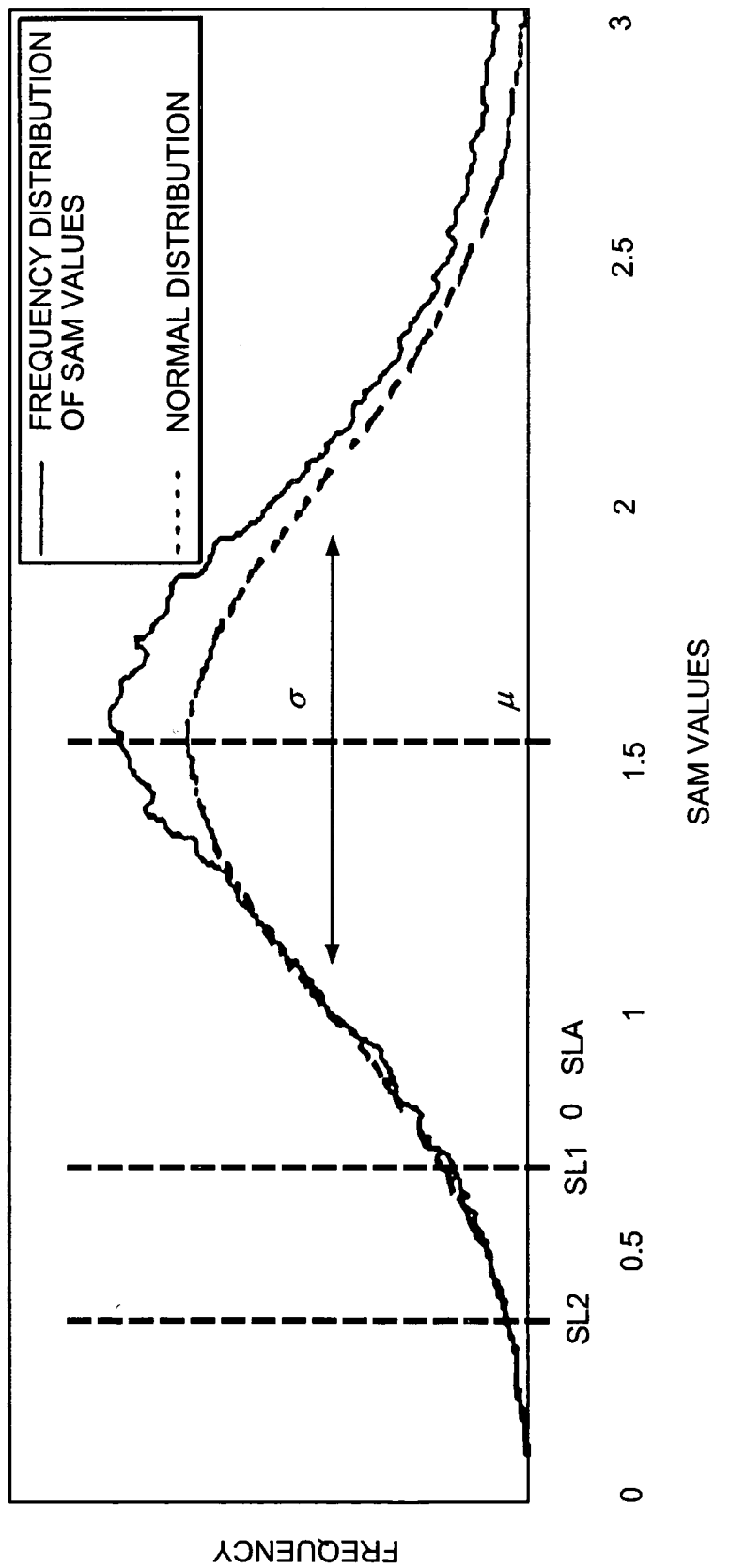
FIG. 28 is a graph showing measurement results of a SAM frequency distribution, superimposed on a normal distribution corresponding to the bit error rate.

Referring to FIG. 26(a) and FIG. 26(b) and the flow chart of FIG. 27, the following explains how bit error rates BER are determined from R1 and R2 of SAM values in the look-up table 60 which was created in the described manner.

First, in S31, the relative frequency R1 at or below the threshold SL1 (a value multiplied by the total number of bits), and the relative frequency R2 at or below the threshold SL2 (a value multiplied by the total number of bits) are found from the frequency distribution of SAM values. For example, it is assumed here that R1=500, and R2=200.

In the subsequent step S32, a search is made through Table A to find a row closest to the value of R1 of SAM values obtained in S31, and the corresponding array in row 7 (labeled "504") is selected.

In the subsequent step S33, the closest value to the value of R2 of SAM values is selected from the registered values of the selected array, i.e., the third cell 208 of the array.

In the next step S34, a search is made through Table B to find the closest value to the value of R1 of SAM values, and the corresponding array in row 7 (labeled "504") is selected.

Finally, in S35, the registered value in the third cell of the array, closest to the value of R2 of SAM values obtained in S33, is read out so as to obtain the corresponding bit error rate BER=$5.0\times10^{-4}$ (5.0E-4 in FIG. 26(b)).

The look-up table 60 has the size 14×5=70 for Table A and 14×5=70 for Table B, i.e., a memory capacity of 140. This is much smaller than the memory capacity 196 of the matrix table in which R1 and R2 of SAM values are labeled by the rows and columns of the table. Further, given the same memory capacity, the intervals of R1 and R2 of SAM values can be made shorter. This makes it possible to calculate bit error rate BER with a smaller rounding error.

Further, the foregoing Sixth and Seventh Embodiments described the magneto-optical disk reproducing device using a signal evaluation device and a signal evaluation method. However, the present invention is not just limited to this and is equally effective in all kinds of devices that reproduce signals according to the PRML method. That is, the present invention is applicable to a wide variety of devices such as optical disk devices with a phase-change medium, magnetic recording devices, and communication data receiving devices.

Further, in the foregoing Sixth and Seventh Embodiments, standard deviation σ and mode μ are calculated from the simultaneous equations (35) and (36), using the measured values of R1' and R2', which are relative frequencies in the domains at or below first threshold SL1 and second threshold SL2, respectively, in the frequency distribution of SAM values which indicate path metric differences. Alternatively, standard deviation σ and mode μ may be determined based on the relative frequencies at or above the first threshold and second threshold in the frequency distribution of path metric differences. It is also possible to determine standard deviation σ and mode μ based on the relative frequencies at or below and at or above the first threshold and the second threshold, respectively, or at or below and at or above the second threshold and the first threshold, respectively, in the frequency distribution of path metric differences.

The signal evaluation device may be adapted so that the counting means includes first counting means for counting a first number of samples which has given a difference of likelihoods at or below a first threshold as a result of subtraction by the subtracting means, and second counting means for counting a second number of samples which has given a difference of likelihoods at or below a second threshold as a result of subtraction by the subtracting means, and the arithmetic operation means finds a first probability, based on the number of measured samples and the first number of samples, that the difference of likelihoods is at or below the first threshold, and finds a second probability, based on the number of measured samples and the second number of samples, that the difference of likelihoods is at or below the second threshold, and then processes the first and second probabilities by arithmetic operations so as to obtain the index of signal evaluation.

According to this invention, the first number of samples which has given a difference of likelihoods at or below the first threshold and the second number of samples which has given a difference of likelihoods at or below the second threshold can be counted simultaneously, thereby requiring less time to obtain the number of samples which has given a difference of likelihoods at or below the predetermined threshold. As a result, it is possible to provide the signal evaluation device which requires less time to obtain an index of signal evaluation.

That is, the counting means of the signal evaluation device, by the provision of the first counting means and the second counting means, is able to simultaneously count the numbers of samples which are at or below the thresholds of the respective counting means. This allows samples to be counted in a shorter period of time, which in turn shortens the time required to obtain an index of signal evaluation by the arithmetic operations of a first probability and a second probability which have given differences of likelihoods at or below their respective first and second thresholds.

The signal evaluation device may further include correction arithmetic means for correcting the number of measured samples, wherein the arithmetic operation means finds a probability, using the number of measured samples corrected by the correction arithmetic means, that the difference of likelihoods is at or below the predetermined threshold, and processes the probability by arithmetic operations so as to obtain the index of signal evaluation.

According to this arrangement, the number of measured samples can be obtained in corrected values, which more accurately indicate the number of measured samples contained in a distribution with the peak closest to 0. The corrected number of measured samples can be used to more accurately find the probability that the difference of likelihoods is at or below the predetermined threshold. Arithmetic operations of such an accurate probability produce more accurate index of signal evaluation, thus improving accuracy of the signal evaluation device.

Further, in order to solve the foregoing problems, a signal evaluation method of the present invention for evaluating a decoded signal of maximum likelihood decoding includes the steps of: finding a difference of likelihoods of measured samples; counting a number of samples which has given a difference of likelihoods at or below a predetermined threshold; and finding a probability, based on a number of measured samples and the number of samples with the difference of likelihoods at or below the predetermined threshold, that the difference of likelihoods is at or below the predetermined threshold, and processing the probability by arithmetic operations so as to obtain an index of signal evaluation.

According to this invention, as in the foregoing signal evaluation device, the distribution with the peak closest to 0 can be approximated to a normal distribution and mean $\mu$ and standard deviation $\sigma$ of the normal distribution can be obtained without extracting only the sequence which trace the paths that form such a distribution.

That is, there is provided a signal evaluation method, capable of evaluating a plurality of PR methods, which can be implemented on the signal evaluation device of a simple structure.

The reproducing device may be adapted so that the recording medium is an optical recording medium, and may further include: reproducing power varying means for varying reproducing power of a light beam; and optimum reproducing power deciding means for deciding optimum reproducing power based on the signal quality evaluated by the signal quality evaluation means with respect to the reproduced signal reproduced by the reproducing means at each reproducing power.

According to this invention, an accurate optimum reproducing power can be found with a simple circuit structure, and much less time is required for test lead operations, compared with the case where test lead operations are performed by directly evaluating the bit error rate.

That is, the reproducing device is further provided with reproducing power varying means for varying reproducing power of a light beam, and optimum reproducing power deciding means for deciding optimum reproducing power. The reproduced signal evaluation means, at each reproducing power varied and set by the reproducing power varying means, finds a signal quality of a reproduced signal reproduced by the reproducing means, and the optimum reproducing power deciding means decides optimum reproducing power based on the signal quality.

The signal quality so obtained is an evaluation value which accurately corresponds to the bit error rate, and thus the optimum reproducing power that is decided based on such a signal quality is also accurate. Further, finding a signal quality by the reproduced signal evaluation means requires much less measurement bits as for bit error rates. Therefore, much less time is required for the test lead operations, compared with the case where bit error rates are directly evaluated.

That is, there is provided a reproducing device, capable of finding an accurate optimum reproducing power, which requires much less time for the test lead operations.

It is preferable that the optimum reproducing power decided by the optimum reproducing power deciding means is a median of a reproducing power range in which a quality of the reproduced signal is higher than a predetermined reference value.

In this way, the bit error rate does not become detrimental even when the optimum reproducing power is varied by such factors as a skew or temperature fluctuations of the disk, which is used as the optical recording medium.

The reproducing device may be adapted so that the recording medium is an optical recording medium, and the reproducing device may further include: recording power varying means for varying recording power of a light beam; recording means for recording test patterns at each recording power; and optimum recording power deciding means for deciding optimum recording power based on the signal quality evaluated by the signal quality evaluation means with respect to the reproduced signal of the recorded test patterns reproduced by the reproducing means.

According to this invention, an accurate optimum recording power can be found with a simple circuit structure, and much less time is required for test lead operations, compared with the case where test lead operations are performed by directly evaluating the bit error rate.

That is, the reproducing device is further provided with recording power varying means for varying recording power of a light beam, recording means for recording test patterns at each recording power, and optimum recording power deciding means for deciding optimum recording power. The reproduced signal evaluation means, at each recording power varied and set by the recording power varying means, finds a signal quality of a reproduced signal reproduced by the reproducing means from the test patterns recorded by the recording means, and the optimum recording power deciding means decides optimum recording power based on the signal quality.

The signal quality so obtained is an evaluation value which accurately corresponds to the bit error rate, and thus the optimum recording power that is decided based on such a signal quality is also accurate. Further, finding a signal quality by the reproduced signal evaluation means requires much less measurement bits as for bit error rates. Therefore, much less time is required for the test lead operations, compared with the case where bit error rates are directly evaluated.

That is, there is provided a reproducing device, capable of finding an accurate optimum recording power, which requires much less time for the test lead operations.

It is preferable that the optimum recording power decided by the optimum recording power deciding means is a median of a recording power range in which a quality of the reproduced signal is higher than a predetermined reference value.

In this way, the bit error rate does not become detrimental even when the optimum recording power is varied by such factors as a skew or temperature fluctuations of the disk, which is used as the optical recording medium.

The reproducing device may further includes servo means for optimizing a servo offset based on the signal quality evaluated by the signal quality evaluation means, so as to servo control the reproduced signal reproduced by the reproducing means.

According to this arrangement, an accurate optimum servo offset can be found by a simple circuit structure, and much less processing time is required, compared with the case where optimization of servo offset is carried out by directly evaluating the bit error rate.

That is, the reproducing device further includes servo means for optimizing a servo offset, and the reproduced signal evaluation means find a signal quality of a reproduced signal reproduced by the reproducing means, so as to decide an optimum servo offset based on the signal quality.

The signal quality so obtained is an evaluation value which accurately corresponds to the bit error rate, and therefore optimization of the servo offset based on the signal quality, instead of the bit error rate as conventionally done, is sufficient to perform highly stable servo control on the reproduced signal. Further, optimization of the servo offset based on the signal quality requires much less number of measurement bits than that required for the optimization based on the bit error rate. As a result, much less processing time is required that that for the optimization of servo offset based of bit error rates.

That is, there is provided a reproducing device, capable of finding an accurate optimum servo offset with a simple circuit structure, which requires much less processing time for the optimization of servo offset.

The reproducing device may further include waveform equalizing means for optimizing an equalizing coefficient based on the signal quality evaluated by the signal quality evaluation means, so as to equalize waveforms of the reproduced signal reproduced by the reproducing means.

According to this arrangement, an accurate optimum equalizing coefficient can be obtained with a simple circuit structure, and much less processing time is required than he case where optimization of equalizing coefficient is carried out by directly evaluating the bit error rate.

That is, the reproducing device additionally includes a waveform equalizing means for deciding an optimum equalizing coefficient based on a signal quality which was found by the reproduced signal evaluation means with respect to a reproduced signal reproduced by the reproducing means, so as to equalize the reproduced signal with the optimum equalizing coefficient.

The signal quality is an evaluation value which accurately corresponds to the bit error rate, and therefore optimization of equalizing coefficient based on the signal quality, instead of the bit error rate, is sufficient to obtain a highly reliable optimum equalizing coefficient. Further, optimization of equalizing coefficient based on the signal quality requires much less number of measurement bits than the optimization based on bit error rates. As a result, much less processing time is required than the optimization of equalizing coefficient based on the bit error rate.

That is, there is provided a reproducing device, capable of finding an accurate optimum equalizing coefficient with a simple circuit structure, which requires much less processing time for the optimization of equalizing coefficient.

The reproducing device may further include tilt servo means for correcting a tilt of the recording medium based on the signal quality evaluated by the signal quality evaluation means with respect to the reproduced signal reproduced by the reproducing means.

According to this arrangement, tilt correction can be accurately carried out with a simple circuit structure, and much less time is required for the tilt correction compared with the case where tile correction is carried out by directly evaluating the bit error rate.

That is, the reproducing device additionally includes tilt servo means for carrying out tilt correction based on a signal quality which was found by the reproduced signal evaluation means with respect to a reproduced signal quality reproduced by the reproducing means.

The signal quality is an evaluation value which accurately corresponds to the bit error rate, and therefore tilt correction based on the signal quality, instead of the bit error rate, is sufficient to accurately correct a tilt. Further, the process of tilt correction based on the signal quality requires much less number of measurement bits than the tilt correction process based on bit error rates. As a result, much less processing time is required than the tilt correction based on bit error rates.

That is, there is provided a reproducing device, capable of accurately correcting a tilt with a simple structure, which requires much less processing time for the tilt correction.

Further, the reproducing device may be adapted so that a modulation method of the recording medium has a code with a limited run length d=1, and an isolated mark assumed by the path metric difference detecting means for the PRML decoding has impulse response (a, $2a$, a), and the predetermined threshold for finding the relative frequency is in a range of from $1.6a^2$ to $2.4a^2$, inclusive, when the PRML decoding is under the limited run length.

According to this arrangement, an error and a defect caused by deviations of the SAM frequency distribution from the normal distribution can be suppressed at the same time, thereby realizing high accurate test read operations and/or test write operations.

That is, the reproducing device is adapted so that an isolated mark in decoding of a reproduced signal of a bit string which was recorded with the RLL (Run Length Limited) code has impulse response (a, 2a, a), and the predetermined threshold for finding the relative frequency is in a range of from $1.6a^2$ to $2.4a^2$, inclusive, in the PRML decoding under the limited run length. According to this arrangement, an error and a defect caused by deviations of the SAM frequency distribution from the normal distribution can be suppressed at the same time, thereby realizing high accurate test read operations and/or test write operations.

Further, the reproducing device may be adapted so that the predetermined reference value is determined by solving equation (11) below for σ

$$BER = (n/N) \times \int_{-\infty}^{0} \frac{\exp\{-(x-\mu)^2/2\sigma^2\}}{\sqrt{2\pi}\,\sigma} dx \qquad (11)$$

and then by substituting a resulting value of σ in equation (12) below $$(n/N) \times \int_{-\infty}^{SL} \frac{\exp\{-(x-\mu)^2/2\sigma^2\}}{\sqrt{2\pi}\,\sigma} dx \qquad (12)$$

where SL is the predetermined threshold, BER is a desired reference value of bit error rate, μ is a mode of the frequency distribution of path metric differences, N is a total number of bits used to find the path metric differences, and n is a number of patterns of path metric differences with a minimum ideal value among all bit strings.

With this arrangement, more reliable test read operations and/or test write operations can be carried out.

That is to say, when the noise which causes variations of a plurality of SAM values obtained as path metric differences is close to a white noise, each frequency distribution of SAM values can be approximated to a normal distribution. Therefore, a portion of the distribution smaller than the minimum SAM ideal value 1.5 can be nearly approximated to a normal distribution with a mode μ close to 1.5. Here, the standard deviation σ, which indicates a variance of the approximated normal distribution, corresponds one to one with the bit error rate, which relationship is represented by equation (11).

Further, the standard deviation σ, which corresponds to BER, obtained from equation (11) can be used in equation (12) to find the relative frequency of a portion of the SAM distribution at or smaller than the arbitrary threshold SL with respect to a reproduced signal of a quality corresponding to a predetermined BER.

Thus, the SAM relative frequency corresponding to the required BER of the reproducing device due to its error correction capability can be found by solving equation (12) for σ, which is obtained by substituting the BER in equation (11). The SAM relative frequency so obtained can be used as a predetermined reference for deciding optimum reproducing or recording power, so as to realize highly reliable test read operations and/or test write operations.

Further, the reproducing device may be adapted so that, when a modulation method of the optical recording medium has a limited run length d=1, n is a number of patterns "00111", "00011", "11000", or "11100" among all bit strings.

According to this arrangement, modulus conversion of SAM frequency distribution and approximated normal distribution can be accurately carried out based on the probability of finding the patterns "00111", "00011", "11000", or "11100" among all bit strings, when a modulation method of the optical recording medium has a limited run length d=1. It is therefore possible to accurately derive a SAM relative frequency with respect to a predetermined bit error rate, and to carry out highly reliable test read operations and/or test write operations.

Further, the reproducing device may be adapted to include frequency detecting means for detecting a frequency of path metric differences at or below the mode, wherein a value two times the detected frequency is used as n.

In this case, a portion of the SAM frequency distribution at or below mode μ is approximated to a normal distribution with the mode of about 1.5, and the frequency at or below the mode μ multiplied by two substantially coincides with the frequency n of the normal distribution. Thus, even when the probability of finding the foregoing four patterns from the random patterns greatly differs from the actual probability as in the case of unique patterns, the complicated process of detecting the probability of finding the four patterns based on a decoded bit string will not be required. Rather, only an accurate value of constant K needs to be found with the simple structure to realize highly reliable signal quality evaluation.

The reproducing device may further include mode detecting means for detecting the mode of the frequency distribution of path metric differences.

According to this arrangement, the mode detecting means detects a mode of a frequency distribution of path metric differences in real time. This makes it possible to find a reference value according to a mode which varies according a noise type, thus finding a more accurate reference value.

Further, a signal evaluation device according to one embodiment of the present invention may be adapted so that the look-up table is a table of a matrix form in which signal quality evaluation values are registered for the first relative frequency and the second relative frequency, which are labeled by rows and columns of the table, respectively, or by columns and rows of the table, respectively.

According to this signal evaluation device, for example, when the first relative frequency represents rows and the second relative frequency represents columns, a search is made through the rows and columns to find a value of first relative frequency closest to the first relative frequency obtained by the first relative frequency detecting means and a value of second relative frequency closest to the second relative frequency obtained by the second relative frequency detecting means. Subsequently, a signal quality evaluation value corresponding to these values of first relative frequency and second relative frequency is read out from the look-up table. In this way, a signal quality evaluation value can be found without numerous calculations.

Further, a signal evaluation device according to one embodiment of the present invention is adapted so that the look-up table is a set of two tables of an array form, in which values of an effective range of the second relative frequency are registered for each value of the first relative frequency in one table, and signal quality evaluation values corresponding to the values of the effective range of the second relative frequency are registered for each value of the first relative frequency in the other table.

With this signal evaluation device, the memory capacity can be saved significantly. Further, given the same memory capacity, the first and second relative frequencies can be divided at smaller intervals. As a result, signal quality evaluation values can be obtained with smaller rounding errors.

Further, a signal evaluation device according to one embodiment of the present invention is adapted so that at least one of the first relative frequency and the second relative frequency in the look-up table is varied exponentially.

According to this signal evaluation device, because the rate of change of the first relative frequency and the second relative frequency is exponential, the rate of change of signal quality evaluation values registered in the look-up table can be made substantially constant. As a result, signal quality evaluation values can be obtained with smaller rounding errors.

Further, a signal evaluation device according to one embodiment of the present invention is adapted so that the signal quality evaluation values registered in the look-up table are numbers of errors with respect to a predetermined modulus which is decided in such a manner that the number of errors falls in a range within an integer range of 1 byte.

According to this signal evaluation device, the look-up table is created to include signal quality evaluation values which are number of errors with respect to a predetermined modulus which is decided in such a manner that the number of errors falls in a range within an integer range of 1 byte. In this way, the required memory capacity for the look-up table can be suppressed.

Further, a signal evaluation device according to one embodiment of the present invention is adapted so that the look-up table is created according to changing ranges of the first and second relative frequencies, which ranges are found from an assumed range of the signal quality evaluation values and from an assumed range of a mode of the frequency distribution of the path metric differences.

According to this signal evaluation device, the look-up table is created to include only limited ranges of the first and second relative frequencies, which ranges are found from an assumed range of the signal quality evaluation values and from an assumed range of a mode of the frequency distribution of the path metric differences. In this way, a required memory capacity for installation can be minimized.

Further, a signal evaluation device according to one embodiment of the present invention is adapted so that at least one of the labels of the first relative frequency and the second relative frequency of the look-up table is set such that a rate of change of the signal quality evaluation values becomes substantially constant.

According to this signal evaluation device, at least one of the labels of the first relative frequency and the second relative frequency is set such that a rate of change of the signal quality evaluation values becomes substantially constant. In this way, signal quality evaluation values can be obtained with smaller rounding errors.

A signal evaluation method of the present invention includes the steps of: finding a path metric difference of two paths which enter a correct state of a trellis diagram during PRML decoding of a reproduced signal which is reproduced from an information carrier; counting first accumulative values when the path metric difference is smaller or greater than a first threshold; counting second accumulative values when the path metric difference is smaller or greater than a second threshold; and reading out a signal quality evaluation value of the reproduced signal based on the first and second accumulative values, referring to a pre-set look-up table in which signal quality evaluation values are registered in relation to the first and second accumulative values.

According to this signal evaluation method, the following sequence is followed: finding a path metric difference of two paths which enter a correct state of a trellis diagram during PRML decoding of a reproduced signal which is reproduced from an information carrier; counting first accumulative values (corresponding to a portion of the frequency distribution of path metric differences defined by the first threshold) when the path metric difference is smaller than a first threshold; counting second accumulative values (corresponding to a portion of the frequency distribution of path metric differences defined by the second threshold) when the path metric difference is smaller than a second threshold; and reading out a signal quality evaluation value of the reproduced signal based on the first and second accumulative values, referring to a pre-set look-up table which was prepared in relation to the first and second accumulative values. In this way, complicated statistical operations will not be required, and a signal quality can be evaluated both easily and in a short period of time.

It is preferable that information in a predetermined area of the recording medium is read out before measurement, so as to clear a counter value of the counting means to zero prior to the decoding.

By thus clearing the counter value of the counting means to zero prior to the measurement, the number of samples outputted from the comparators can match the counter value counted by the counting means, making it possible to find the number of samples which has given a difference of likelihoods at or below the predetermined threshold as a result of operations by the arithmetic means.

It is preferable that a counter value at the start of measurement is stored in memory means, and is compared with a counter value after the measurement.

In this way, it is possible to easily find the number of measured samples which has given a difference of likelihoods at or below the predetermined threshold as a result of operations by the arithmetic means, without clearing the counter value to zero before the measurement.

It is preferable that the counting means is provided in pair with a comparator of a variable threshold, and a number of samples at or below a predetermined threshold is counted twice with respect to a single measurement area, each time with a different threshold.

In this way, only a single comparator and a single counter are required to find the number of sample which has given a difference of likelihoods at or below the predetermined threshold as a result of operations by the arithmetic means. As a result, the device structure can be further simplified.

It is preferable that the reproducing device is an optical disk device of a phase-change system, a magneto-optical disk device, a magnetic recording device, or a communication data receiving device.

In this manner, the present invention can be applied to various types of reproducing devices.

It is preferable that the look-up table has a maximum allowable size of a system memory capacity.

In this way, the intervals of R1 and R2 of SAM values can be made shorter with an increasing size of the table. As a result, a more accurate bit error rate BER can be found.

It is preferable that, in addition to the test patterns on a test track, another test pattern is recorded on adjacent tracks of the test track.

In this way, influence of crosswrite or crosstalk from adjacent tracks can be taken into consideration to more accurately find optimum recording power.

A recording device of the present invention includes: reproducing means for reproducing a recording medium; path metric difference detecting means for finding a path metric difference of two paths which enter a correct state of a trellis diagram during PRML decoding of a reproduced signal reproduced by the reproducing means; relative frequency detecting means for finding a relative frequency of a domain defined by a predetermined threshold in a frequency distribution of path metric differences; and signal quality evaluation means for evaluating a quality of the reproduced signal based on the relative frequency.

According to this invention, it is possible to realize a recording device which is capable of accurately detecting a quality of a reproduced signal with a simple circuit structure.

That is, the path metric difference detecting means finds a path metric difference of two paths which enter a correct state of a trellis during PRML decoding of the reproduced signal reproduced by the reproducing means, rather than selecting only those bit patterns which produce a predetermined ideal value as conventionally done. In other words, the path metric difference detecting means finds a path metric difference of two paths, instead of monitoring patterns of plural data bits to judge whether the patterns fit specific patterns. Thus, the path metric difference detecting means can be realized by simple circuitry.

Further, the relative frequency detecting means finds a relative frequency of a portion of the frequency distribution of path metric differences defined by a predetermined threshold. The signal quality evaluation means evaluates a quality of the reproduced signal based on the relative frequency obtained by the relative frequency detecting means.

As described, the frequency distribution of path metric differences varies according to a signal quality. Therefore, the relative frequency of a portion of the frequency distribution of path metric differences defined by the predetermined threshold reflects the size of a noise and corresponds to a signal quality. Thus, a quality of the reproduced signal can be accurately detected when the quality of the reproduced signal is evaluated based on the relative frequency.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A signal evaluation device for evaluating a decoded signal of maximum likelihood decoding, comprising:
    subtracting means for finding a difference of likelihoods of measured samples;
    counting means for counting a number of samples which has given a difference of likelihoods at or below a predetermined threshold as a result of subtraction by the subtracting means; and
    arithmetic operation means for finding a probability, based on a number of measured samples and the number of samples counted by the counting means, that the difference of likelihoods is at or below the predetermined threshold, and processing the probability by arithmetic operations so as to obtain an index of signal evaluation.

2. The signal evaluation device as set forth in claim 1, wherein:
    said counting means comprises first counting means for counting a first number of samples which has given a difference of likelihoods at or below a first threshold as a result of subtraction by the subtracting means, and second counting means for counting a second number of samples which has given a difference of likelihoods at or below a second threshold as a result of subtraction by the subtracting means, and
    said arithmetic operation means finds a first probability, based on the number of measured samples and the first number of samples, that the difference of likelihoods is at or below the first threshold, and finds a second probability, based on the number of measured samples and the second number of samples, that the difference of likelihoods is at or below the second threshold, and then processes the first and second probabilities by arithmetic operations so as to obtain the index of signal evaluation.

3. The signal evaluation device as set forth in claim 1, further comprising:
    correction arithmetic means for correcting the number of measured samples,
    wherein:
    said arithmetic operation means finds a probability, using the number of measured samples corrected by the correction arithmetic means, that the difference of likelihoods is at or below the predetermined threshold, and processes the probability by arithmetic operations so as to obtain the index of signal evaluation.

4. The signal evaluation device as set forth in claim 1, wherein information in a predetermined area of the recording medium is read out before measurement, so as to clear a counter value of the counting means to zero prior to the decoding.

5. The signal evaluation device as set forth in claim 1, wherein a counter value at the start of measurement is stored in memory means, and is compared with a counter value after the measurement.

6. The signal evaluation device as set forth in claim 1, wherein said counting means is provided in pair with a comparator of a variable threshold, and a number of samples at or below a predetermined threshold is counted twice with respect to a single measurement area, each time with a different threshold.

7. A signal evaluation method for evaluating a decoded signal of maximum likelihood decoding, comprising the steps of:
    finding a difference of likelihoods of measured samples;
    counting a number of samples which has given a difference of likelihoods at or below a predetermined threshold; and
    finding a probability, based on a number of measured samples and the number of samples with the difference of likelihoods at or below the predetermined threshold, that the difference of likelihoods is at or below the predetermined threshold, and processing the probability by arithmetic operations so as to obtain an index of signal evaluation.

8. A signal quality evaluation method, comprising the steps of:
    reproducing a recording medium;
    finding a path metric difference of two paths which enter a correct state of a trellis during PRML decoding of a reproduced signal from the recording medium;
    finding a relative frequency of a domain defined by a predetermined threshold in a frequency distribution of the path metric differences; and
    evaluating a quality of the reproduced signal based on the relative frequency.

9. A reproducing device, comprising:
    reproducing means for reproducing a recording medium;
    path metric difference detecting means for finding a path metric difference of two paths which enter a correct state of a trellis during PRML decoding of a reproduced signal reproduced by the reproducing means;

relative frequency detecting means for finding a relative frequency of a domain defined by a predetermined threshold in a frequency distribution of path metric differences; and signal quality evaluation means for evaluating a quality of the reproduced signal based on the relative frequency.

10. The reproducing device as set forth in claim 9, wherein:

the recording medium is an optical recording medium, and said reproducing device further comprises:

reproducing power varying means for varying reproducing power of a light beam; and optimum reproducing power deciding means for deciding optimum reproducing power based on the signal quality evaluated by the signal quality evaluation means with respect to the reproduced signal reproduced by the reproducing means at each reproducing power.

11. The reproducing device as set forth in claim 10, wherein the optimum reproducing power decided by the optimum reproducing power deciding means is a median of a reproducing power range in which a quality of the reproduced signal is higher than a predetermined reference value.

12. The reproducing device as set forth in claim 11, wherein the predetermined reference value is determined by solving equation (11) below for $\sigma$ $$BER = (n/N) \times \int_{-\infty}^{0} \frac{\exp\{-(x-\mu)^2/2\sigma^2\}}{\sqrt{2\pi}\,\sigma} dx \quad (11)$$

and then by substituting a resulting value of $\sigma$ in equation (12) below $$(n/N) \times \int_{-\infty}^{SL} \frac{\exp\{-(x-\mu)^2/2\sigma^2\}}{\sqrt{2\pi}\,\sigma} dx \quad (12)$$

where SL is the predetermined threshold, BER is a desired reference value of bit error rate, $\mu$ is a mode of the frequency distribution of path metric differences, N is a total number of bits used to find the path metric differences, and n is a number of patterns of path metric differences with a minimum ideal value among all bit strings.

13. The reproducing device as set forth in claim 12, wherein, when a modulation method of the optical recording medium has a limited run length d=1, n is a number of patterns "00111", "00011", "11000", and "11100" among all bit strings.

14. The reproducing device as set forth in claim 12, further comprising:

frequency detecting means for detecting a frequency of path metric differences at or below the mode wherein a value two times the detected frequency is used as n.

15. The reproducing device as set forth in claim 12, further comprising:

mode detecting means for detecting the mode of the frequency distribution of the path metric differences.

16. The reproducing device as set forth in claim 9, further comprising:

servo means for optimizing a servo offset based on the signal quality evaluated by the signal quality evaluation means, so as to servo control the reproduced signal reproduced by the reproducing means.

17. The reproducing device as set forth in claim 9, further comprising:

waveform equalizing means for optimizing an equalizing coefficient based on the signal quality evaluated by the signal quality evaluation means, so as to equalize waveforms of the reproduced signal reproduced by the reproducing means.

18. The reproducing device as set forth in claim 9, further comprising:

tilt servo means for correcting a tilt of the recording medium based on the signal quality evaluated by the signal quality evaluation means with respect to the reproduced signal reproduced by the reproducing means.

19. The reproducing device as set forth in claim 9, wherein:

a modulation method of the recording medium has a code with a limited run length d=1, and an isolated mark assumed by the path metric difference detecting means for the PRML decoding has impulse response (a, 2a, a), and the predetermined threshold for finding the relative frequency is in a range of from $1.6a^2$ to $2.4a^2$, inclusive, when the PRML decoding is under the limited run length.

20. The reproducing device as set forth in claim 9, wherein said reproducing device is an optical disk device of a phase-change system, a magneto-optical disk device, a magnetic recording device, or a communication data receiving device.

21. A recording device, comprising:

reproducing means for reproducing a recording medium;

path metric difference detecting means for finding a path metric difference of two paths which enter a correct state of a trellis during PRML decoding of a reproduced signal reproduced by the reproducing means;

relative frequency detecting means for finding a relative frequency of a domain defined by a predetermined threshold in a frequency distribution of path metric differences; and signal quality evaluation means for evaluating a quality of the reproduced signal based on the relative frequency.

22. The recording device as set forth in claim 21, wherein:

the recording medium is an optical recording medium, and said recording device further comprises:

recording power varying means for varying recording power of a light beam;

recording means for recording test patterns at each recording power; and optimum recording power deciding means for deciding optimum recording power based on the signal quality evaluated by the signal quality evaluation means with respect to the reproduced signal of the recorded test patterns reproduced by the reproducing means.

23. The recording device as set forth in claim 22, wherein the optimum recording power decided by the optimum recording power deciding means is a median of a recording power range in which a quality of the reproduced signal is higher than a predetermined reference value.

24. The recording device as set forth in claim 23, wherein the predetermined reference value is determined by solving equation (11) below for $\sigma$ $$BER = (n/N) \times \int_{-\infty}^{0} \frac{\exp\{-(x-\mu)^2/2\sigma^2\}}{\sqrt{2\pi}\,\sigma} dx \qquad (11)$$

and then by substituting a resulting value of σ in equation (12) below $$(n/N) \times \int_{-\infty}^{SL} \frac{\exp\{-(x-\mu)^2/2\sigma^2\}}{\sqrt{2\pi}\,\sigma} dx \qquad (12)$$

where SL is the predetermined threshold, BER is a desired reference value of bit error rate, μ is a mode of the frequency distribution of path metric differences, N is a total number of bits used to find the path metric differences, and n is a number of patterns of path metric differences with a minimum ideal value among all bit strings.

25. The recording device as set forth in claim 22, wherein, in addition to the test patterns on a test track, another test pattern is recorded on adjacent tracks of the test track.

26. A signal evaluation device, comprising:
reproducing means for reproducing a recording medium;
path metric difference detecting means for finding a path metric difference of two paths which enter a correct state of a trellis during PRML decoding of a reproduced signal reproduced from the recording medium by the reproducing means;
first relative frequency detecting means for finding a first relative frequency, which is a relative frequency of a domain defined by a first threshold in a frequency distribution of path metric differences;
second relative frequency detecting means for detecting a second relative frequency, which is a relative frequency of a domain defined by a second threshold in the frequency distribution of path metric differences; and
signal evaluation means for evaluating, referring to a pre-set look-up table, a quality of the reproduced signal based on the first and second relative frequencies found by the first and second relative frequency detecting means, respectively.

27. The signal evaluation device as set forth in claim 26, wherein the look-up table is a table of a matrix form in which signal quality evaluation values are registered for the first relative frequency and the second relative frequency, which are labeled by rows and columns of the table, respectively, or by columns and rows of the table, respectively.

28. The signal evaluation device as set forth in claim 27, wherein at least one of the first relative frequency and the second relative frequency in the look-up table is varied exponentially.

29. The signal evaluation device as set forth in claim 27, wherein the signal quality evaluation values registered in the look-up table are numbers of errors with respect to a predetermined modulus which is decided in such a manner that the number of errors falls in a range within an integer range of 1 byte.

30. The signal evaluation device as set forth in claim 27, wherein the look-up table is created according to changing ranges of the first and second relative frequencies, which ranges are found from an assumed range of the signal quality evaluation values and from an assumed range of a mode of the frequency distribution of the path metric differences.

31. The signal evaluation device as set forth in claim 27, wherein at least one of the labels of the first relative frequency and the second relative frequency of the look-up table is set such that a rate of change of the signal quality evaluation values becomes substantially constant.

32. The signal evaluation device as set forth in claim 26, wherein the look-up table is a set of two tables of an array form, in which values of an effective range of the second relative frequency are registered for each value of the first relative frequency in one table, and signal quality evaluation values corresponding to the values of the effective range of the second relative frequency are registered for each value of the first relative frequency in the other table.

33. The signal evaluation device as set forth in claim 32, wherein at least one of the first relative frequency and the second relative frequency in the look-up table is varied exponentially.

34. The signal evaluation device as set forth in claim 32, wherein the signal quality evaluation values registered in the look-up table are numbers of errors with respect to a predetermined modulus which is decided in such a manner that the number of errors falls in a range within an integer range of 1 byte.

35. The signal evaluation device as set forth in claim 32, wherein the look-up table is created according to changing ranges of the first and second relative frequencies, which ranges are found from an assumed range of the signal quality evaluation values and from an assumed range of a mode of the frequency distribution of the path metric differences.

36. The signal evaluation device as set forth in claim 32, wherein at least one of the labels of the first relative frequency and the second relative frequency of the look-up table is set such that a rate of change of the signal quality evaluation values becomes substantially constant.

37. The signal evaluation device as set forth in claim 26, wherein the look-up table has a maximum allowable size of a system memory capacity.

38. A signal evaluation method, comprising the steps of:
finding a path metric difference of two paths which enter a correct state of a trellis during PRML decoding of a reproduced signal which is reproduced from an information carrier;
counting first accumulative values when the path metric difference is smaller or greater than a first threshold;
counting second accumulative values when the path metric difference is smaller or greater than a second threshold; and
reading out a signal quality evaluation value of the reproduced signal based on the first and second accumulative values, referring to a pre-set look-up table in which signal quality evaluation values are registered in relation to the first and second accumulative values.

* * * * *